(12) United States Patent
Konkola et al.

(10) Patent No.: US 11,387,136 B2
(45) Date of Patent: *Jul. 12, 2022

(54) PAD RAISING MECHANISM IN WAFER POSITIONING PEDESTAL FOR SEMICONDUCTOR PROCESSING

(71) Applicant: Lam Research Corporation, Fremont, CA (US)

(72) Inventors: Paul Konkola, West Linn, OR (US); Karl F. Leeser, West Linn, OR (US); Easwar Srinivasan, Portland, OR (US)

(73) Assignee: Lam Research Corporation, Fremont, CA (US)

(*) Notice: Subject to any disclaimer, the term of this patent is extended or adjusted under 35 U.S.C. 154(b) by 250 days.

This patent is subject to a terminal disclaimer.

(21) Appl. No.: 16/781,996

(22) Filed: Feb. 4, 2020

(65) Prior Publication Data

US 2020/0176301 A1 Jun. 4, 2020

Related U.S. Application Data

(63) Continuation of application No. 15/366,927, filed on Dec. 1, 2016, now Pat. No. 10,573,549.

(51) Int. Cl.
| | |
|---|---|
| *H01L 21/687* | (2006.01) |
| *C23C 16/458* | (2006.01) |
| *C23C 16/455* | (2006.01) |
| *C23C 16/50* | (2006.01) |

(52) U.S. Cl.
CPC .... *H01L 21/68742* (2013.01); *C23C 16/4584* (2013.01); *C23C 16/4586* (2013.01); *C23C 16/45544* (2013.01); *C23C 16/50* (2013.01); *H01L 21/68785* (2013.01)

(58) Field of Classification Search
CPC ........ H01L 21/68742; H01L 21/68785; C23C 16/4586; C23C 16/4584; C23C 16/50; C23C 16/45544
See application file for complete search history.

(56) References Cited

U.S. PATENT DOCUMENTS

| | | | | |
|---|---|---|---|---|
| 9,892,956 | B1* | 2/2018 | Konkola | ........... H01L 21/68742 |
| 9,960,068 | B1* | 5/2018 | Konkola | ........... H01L 21/68785 |
| 10,020,220 | B2* | 7/2018 | Konkola | ........... C23C 16/45525 |
| 10,121,689 | B2* | 11/2018 | Konkola | ........... H01L 21/67109 |
| 10,354,909 | B2* | 7/2019 | Konkola | ............ H01L 21/0228 |
| 10,570,515 | B2* | 2/2020 | Konkola | ........... H01L 21/68742 |

(Continued)

*Primary Examiner* — Jeffrie R Lund
(74) *Attorney, Agent, or Firm* — Penilla IP, APC

(57) ABSTRACT

An assembly used in a process chamber for depositing a film on a wafer. A pedestal assembly includes a pedestal movably mounted to a main frame. A lift pad rests upon the pedestal and moves with the pedestal assembly. A raising mechanism separates the lift pad from the pedestal, and includes a hard stop fixed to the main frame, a roller attached to the pedestal assembly, a slide moveably attached to the pedestal assembly, a lift pad bracket interconnected to the slide and a pad shaft extending from the lift pad, and a lever rotatably attached to the lift pad bracket. The lever rests on the roller when not engaged with the upper hard stop. When the pedestal assembly moves upwards, the lever rotates about a pin when engaging the upper hard stop and roller, and separates the lift pad from the pedestal by a process rotation displacement.

16 Claims, 36 Drawing Sheets

(56) References Cited

U.S. PATENT DOCUMENTS

| | | | | |
|---|---|---|---|---|
| 10,573,549 B2* | 2/2020 | Konkola | .......... | H01L 21/68785 |
| 10,699,937 B2* | 6/2020 | Konkola | .......... | H01L 21/68742 |
| 10,870,922 B2* | 12/2020 | Konkola | .......... | H01L 21/68785 |
| 11,056,380 B2* | 7/2021 | Konkola | ............... | C23C 16/458 |
| 2018/0130696 A1* | 5/2018 | Konkola | .......... | H01L 21/68735 |
| 2018/0158716 A1* | 6/2018 | Konkola | .......... | H01L 21/68785 |
| 2018/0211862 A1* | 7/2018 | Konkola | .......... | H01L 21/67109 |
| 2018/0323098 A1* | 11/2018 | Konkola | .......... | H01J 37/32009 |
| 2019/0067071 A1* | 2/2019 | Konkola | .......... | H01L 21/68785 |
| 2019/0341292 A1* | 11/2019 | Konkola | ................ | H01L 21/68 |
| 2020/0173016 A1* | 6/2020 | Konkola | .......... | C23C 16/45544 |
| 2020/0176301 A1* | 6/2020 | Konkola | ............ | C23C 16/4586 |
| 2020/0312703 A1* | 10/2020 | Konkola | ............... | C23C 16/458 |

* cited by examiner

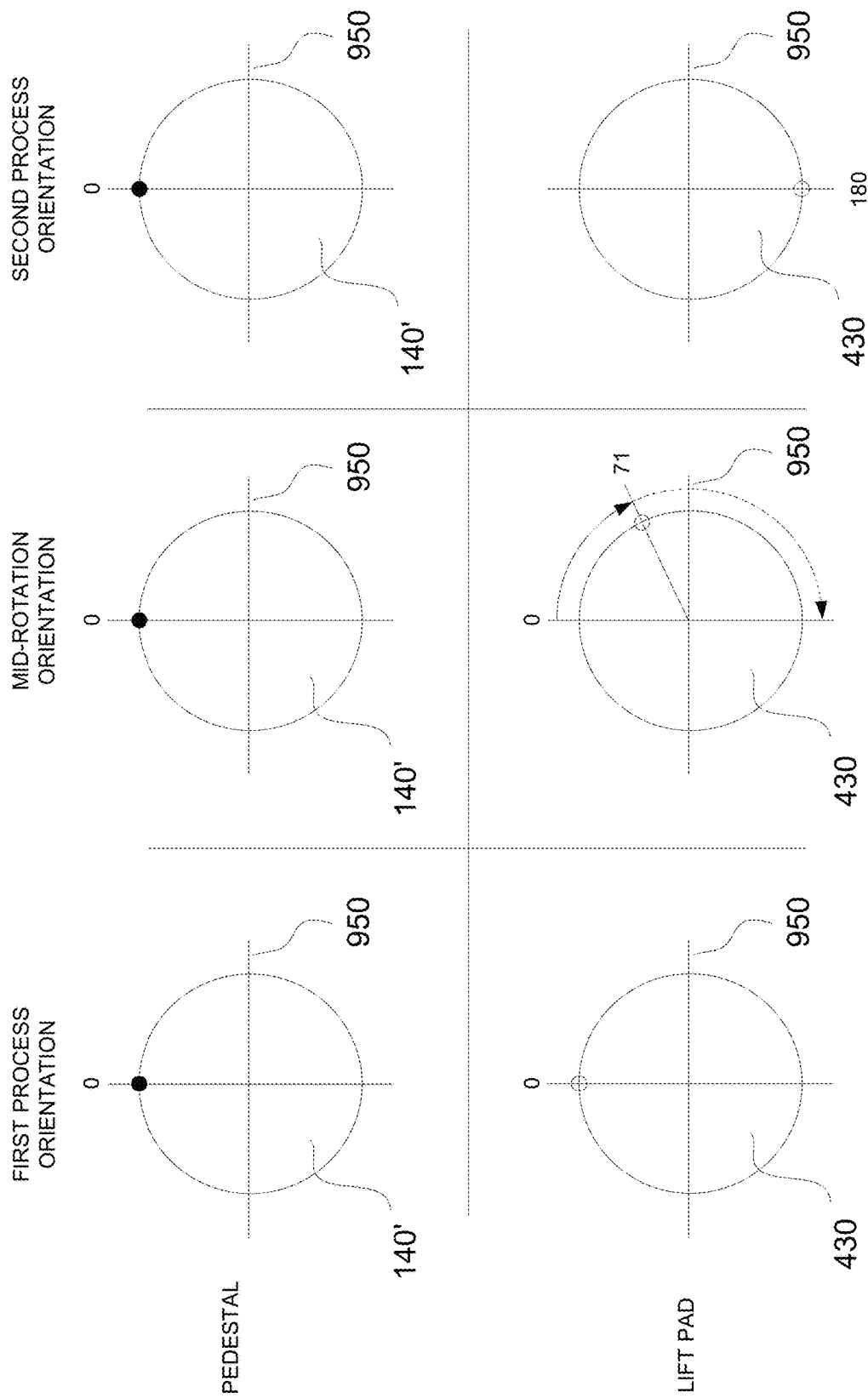

PAD RAISING MECHANISM IN WAFER POSITIONING PEDESTAL FOR SEMICONDUCTOR PROCESSING

CLAIM OF PRIORITY

This application is a continuation of and claims priority to and the benefit of U.S. application Ser. No. 15/366,927 filed on Dec. 1, 2016, entitled "Pad Raising Mechanism In Wafer Positioning Pedestal For Semiconductor Processing," the disclosure of which is incorporated herein by reference in its entirety for all purposes.

TECHNICAL FIELD

The present embodiments relate to semiconductor substrate processing methods and equipment tools, and more particularly, a wafer positioning pedestal for processing a wafer at different wafer to pedestal orientations.

BACKGROUND

Improved film uniformity is important in plasma-enhanced chemical vapor deposition (PECVD) and plasma atomic enhanced layer deposition (ALD) technologies. The chamber systems implementing PECVD and ALD are associated with a hardware signature that contributes to nonuniform film deposition. For example, the hardware signature can be associated with chamber asymmetry and with pedestal asymmetry. Furthermore, many processes experience azimuthal nonuniformity of various origins. As customers push to locate die ever closer to the wafer edge, the numerical contribution of this azimuthal nonuniformity to overall nonuniformity grows. Despite best efforts to minimize damage and/or non-uniform deposition profiles, traditional PECVD and plasma ALD schemes still need improvement.

In particular, multi-station modules performing PECVD and ALD feature a large, open reactor that may contribute to azimuthal nonuniformities (e.g., NU in the theta direction). For example, some nonuniformities may result in a characteristic film thickness tilt towards the spindle transfer mechanism in the center of the reactor. Nonuniformities also exist in single station modules, due to nonuniform physical chamber geometries including those caused by assembly and component manufacturing tolerances.

Traditionally, deposition nonuniformities have been compensated by physically tilting the showerheads, such that the showerheads are intentionally oriented not parallel to the pedestals. Although not an elegant solution, it has been historically effective. However, the effectiveness of this scheme is growing ever more limited, especially as die size decreases and edges of the wafer are increasingly being sourced for dies.

Processing the wafer in multiple orientations without rotating the hardware signature has been shown to be effective in filtering out azimuthal non-uniformity. The most basic current method in the prior art includes partially processing the wafer, removing the wafer from the process chamber, rotating the wafer in a separate wafer handler, and then reinserting the wafer for further processing in the new orientation. The main advantage of this method is no hardware inside the chamber is rotated. However, this prior art solution has disadvantages of throughput, contamination, and significant extra hardware.

Another solution in the prior art rotates the whole pedestal during processing. However, this solution has the adverse property of rotating the non-uniformity associated with the pedestal along with the wafer. In that case, the pedestal can have a non-uniformity signature that may not be negated and may appear on the wafer during processing. Moreover, edge effects of the wafer in a pocket are another class of the non-uniformity that is directly rotated with the wafer when the whole pedestal is rotated during processing. That is, non-uniformity is not appreciably improved with pedestal rotation (e.g., in ALD oxide deposition). Furthermore, in addition to limited performance, rotating the whole pedestal requires the expense of passing RF power through the rotating pedestal. This requires a costly circuit for impedance matching through a slip ring to pass sufficient RF power to the plasma. Rotating the whole pedestal also complicates the delivery of fluids and gases, used for cooling for instance. Additionally, heating systems present in the pedestal also requires rotation, adding to cost and complexity.

It is in this context that disclosures arise.

SUMMARY

The present embodiments relate to providing improved film uniformity during PECVD and ALD processes in single-station and multi-station systems. Embodiments of the present disclosure provide for rotating the wafer without rotation of the pedestal, which advantageously filters out both chamber and pedestal asymmetries.

Embodiments of the disclosure include an assembly for use in a process chamber for depositing a film on a wafer. The assembly includes a pedestal assembly having a pedestal movably mounted to a main frame. The assembly includes a lift pad configured to rest upon a pedestal top surface of the pedestal and move with the pedestal assembly. The assembly includes a lift pad raising mechanism configured to separate the lift pad from the pedestal, the lift pad mechanism including an upper hard stop, a first roller, a slide, a lift pad bracket, and a lever. The upper hard stop is fixed in relation to the main frame. The first roller is attached to the pedestal assembly. The slide is moveably attached to the pedestal assembly. The lift pad bracket is interconnected to the slide and interconnected to a pad shaft, wherein the pad shaft extends from the lift pad along a central axis. The lever is rotatably attached to the lift pad bracket through a pin, wherein the lever rests on the first roller in a neutral position when not engaged with the upper hard stop. Regarding the lift pad mechanism, when the pedestal assembly is moving upwards, the lever is configured to rotate about the pin when engaged with the upper hard stop and first roller, and separate the lift pad from the pedestal top surface by a process rotation displacement.

Other embodiments of the disclosure include an assembly for use in a process chamber for depositing a film on a wafer. The assembly includes a pedestal assembly having a pedestal movably mounted to a main frame. The assembly includes a lift pad configured to rest upon a pedestal top surface of the pedestal and move with the pedestal assembly. The assembly includes a lift pad raising mechanism configured to separate the lift pad from the pedestal, the lift pad mechanism including an upper hard stop, a lower hard stop, a first roller, a second roller, a slide, a lift pad bracket, and a lever. The upper hard stop is fixed in relation to the main frame. The lower hard stop is fixed in relation to the main frame, and is located below the upper hard stop with reference to the main frame. The first roller is attached to the pedestal assembly. The second roller is attached to the pedestal assembly. The slide is moveably attached to the pedestal assembly. The lift pad bracket is interconnected to the slide and interconnected to a pad shaft, wherein the pad shaft extends from the lift pad along a central axis. The lever is rotatably attached to the lift pad bracket through a pin, wherein the lever rests on the first roller in a neutral position when not engaged with the upper hard stop. Regarding the lift pad raising mechanism, when the pedestal assembly is moving upwards, the lever is configured to rotate about the pin when engaged with the upper hard stop and first roller, and configured to separate the lift pad from the pedestal top surface by a process rotation displacement. Regarding the lift pad raising mechanism, when the pedestal assembly is moving downwards, the lever is configured to rotate about the pin when engaged with the lower hard stop and second roller, and configured to separate the lift pad from the pedestal by an end effector access displacement.

Still other embodiments of the disclosure include an assembly for use in a process chamber for depositing a film on a wafer. The assembly includes a pedestal assembly including a pedestal movably mounted to a main frame. The assembly includes a lift pad configured to rest upon a pedestal top surface of the pedestal and move with the pedestal assembly. The assembly includes a lift pin assembly including a plurality of lift pins extending through a plurality of pedestal shafts configured within the pedestal. The assembly includes a lift pad raising mechanism configured to separate the lift pad from the pedestal, wherein the lift pad raising mechanism includes an upper hard stop, a first roller, a slide, a lift pad bracket, and a lever. The upper hard stop is fixed in relation to the main frame. The first roller is configured to be attached to the pedestal assembly. The slide is configured to be moveably attached to the pedestal assembly. The lift pad bracket is configured to be interconnected to the slide and interconnected to a pad shaft, wherein the pad shaft extends from the lift pad along a central axis. The lever is configured to be rotatably attached to the lift pad bracket through a pin, wherein the lever is rests on the first roller in a neutral position when not engaged with the upper hard stop. Regarding the lift pad raising mechanism, when the pedestal assembly is moving upwards, the lever is configured to rotate about the pin when engaged with the upper hard stop and first roller, and separate the lift pad from the pedestal top surface by a process rotation displacement.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 9C is a diagram illustrating the orientation of a lift pad with respect to a pedestal in a lift pad and pedestal configuration, wherein the lift pad is approximately sized to a wafer, during a first process sequence, a rotation sequence, and a second process sequence, in accordance with one embodiment of the present disclosure.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide for improved film uniformity during wafer processing (e.g., PECVD and ALD processes) in single-station and multi-station systems. In particular, embodiments of the present disclosure provide for rotating the wafer without rotating the pedestal in order to filter out both chamber and pedestal asymmetries. In that manner, azimuthal nonuniformities due to chamber and pedestal asymmetries are minimized to achieve film uniformity across the entire wafer during processing (e.g., PECVD, ALD, etc.).

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Figure 1:
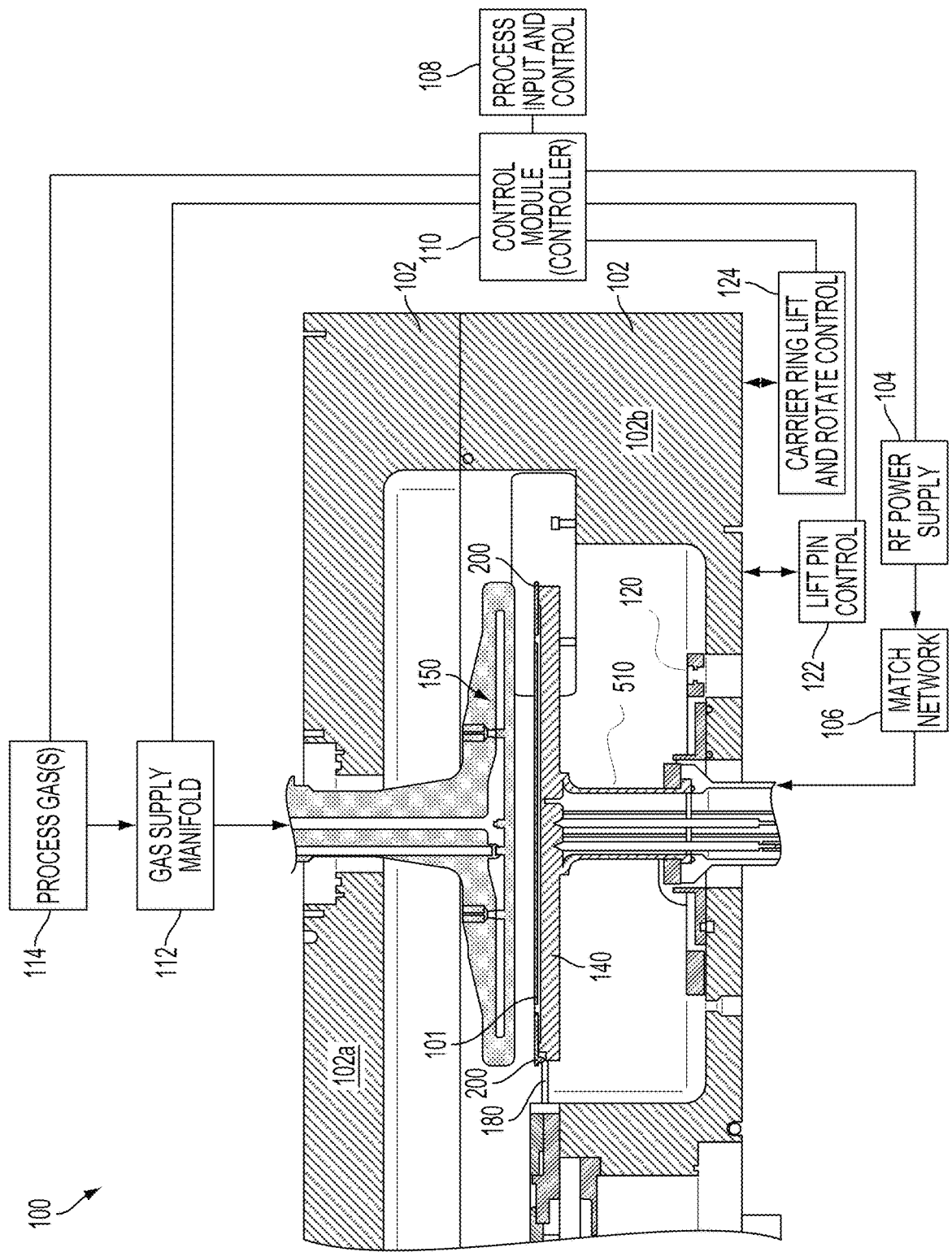
FIG. 1 illustrates a substrate processing system, which is used to process a wafer, e.g., to form films thereon.

FIG. 1 illustrates a reactor system 100, which may be used to deposit films over substrates, such as those formed in atomic layer deposition (ALD) processes. These reactors may utilize two or more heaters, and the common terminal configurations may be used in this example reactor to control the temperatures for uniformity or custom settings. More particularly, FIG. 1 illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101.

The center column also includes lift pins (not shown), each of which is actuated by a corresponding lift pin actuation ring 120 as controlled by lift pin control 122. The lift pins are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face that faces that wafer 101 and the wafer 101 resting over the pedestal 140. In ALD processes, the gases can be reactants chosen for absorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system. In other embodiments, the chamber is a single station chamber.

Figure 2:
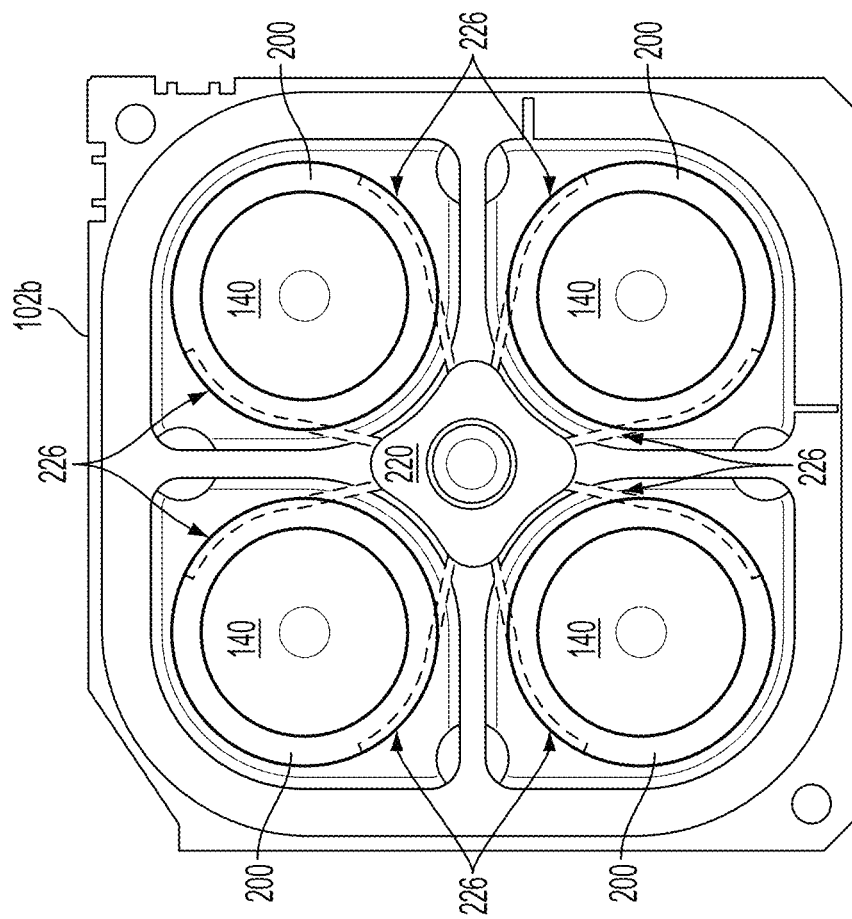
FIG. 2 illustrates a top view of a multi-station processing tool, wherein four processing stations are provided, in accordance with one embodiment.

FIG. 2 illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
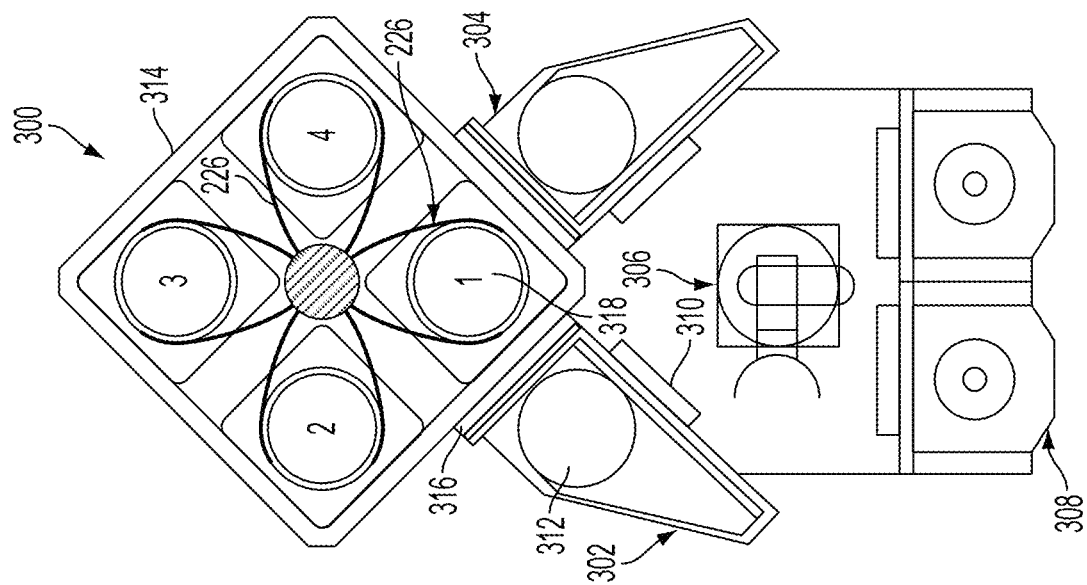
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102b. The spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

Wafer Positioning Lift Pad and Pedestal Configuration

Figure 4:
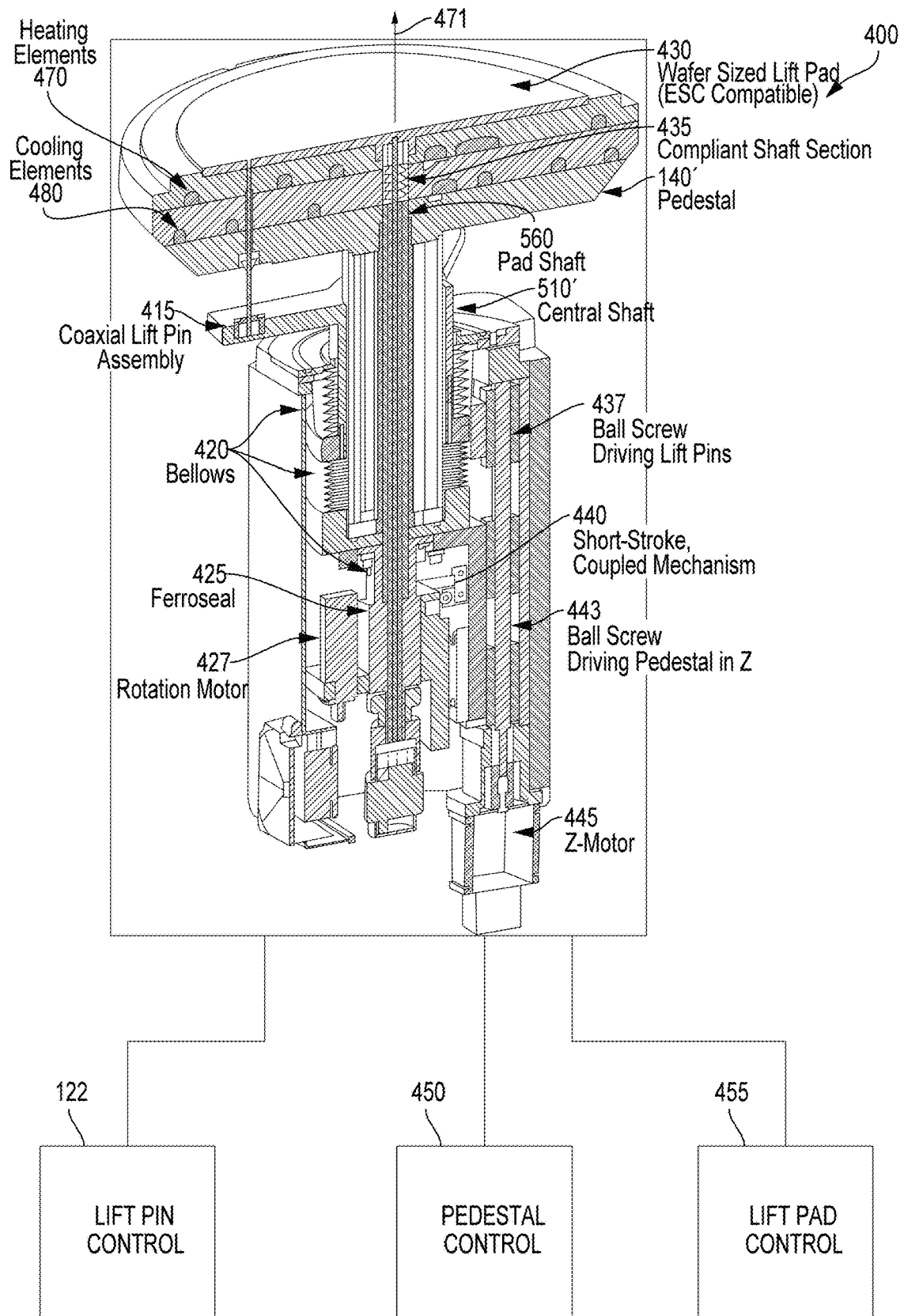
FIG. 4 illustrates a substrate processing system including a lift pad and pedestal configuration, wherein the lift pad is approximately sized to match a wafer, in accordance with one embodiment of the present disclosure.

FIG. 4 illustrates a substrate processing system including a lift pad and pedestal configuration 400, wherein the lift pad 430 is approximately sized to match a wafer (not shown) disposed thereon, in accordance with one embodiment of the present disclosure. In some embodiments, the lift pad 430 is approximately sized to allow for integration with a carrier ring assembly. The lift pad and pedestal configuration 400 may be implemented within the systems of FIGS. 1-3, including multi-station and single-station processing tools.

The lift pad and pedestal configuration 400 includes a lift pad 430 which is controlled by the lift pad control 455, and a pedestal 140' which is controlled by pedestal control 450. The central shaft 510' is coupled to the pedestal 140', and the pad shaft 560 is coupled to the lift pad 430. The pedestal control 450 controls movement of the central shaft 510' in order to induce movement in the pedestal 140'. For example, the pedestal control 450 controls movement of the pedestal 140' (e.g., up and down along a central axis) during pre-processing, processing, and post-processing sequences. Lift pad control 455 controls movement of the lift pad shaft 560 in order to induce movement in the lift pad 430. For example, the lift pad control 455 controls movement of the lift pad 430 (e.g., up and down along the central axis 471, and rotationally about the central axis 471) during pre-processing, processing, and post-processing sequences. In particular, the lift pad and pedestal configuration 400 provides for rotation of the wafer with a greatly reduced hardware rotation signature compared to when rotating the whole pedestal 140'. That is, because the pedestal 140' and/or chamber (not shown) remain fixed in relation to the lift pad 430 while the wafer is rotated, both pedestal and chamber based asymmetries are filtered out, thereby significantly reducing hardware pedestal and chamber signatures exhibited on the wafer during processing. That is, the non-uniformities introduced by the pedestal signature can be symmetrically distributed throughout the wafer during wafer processing through wafer rotation using a lift pad, and without rotating the pedestal.

The lift pad and pedestal configuration 400 includes a plurality of heating elements 470 that is used to directly heat the pedestal 140' (e.g., through conduction), and indirectly heat the lift pad 430 when disposed on the pedestal 140'. In addition, the lift pad and pedestal configuration 400 optionally includes a plurality of cooling elements 480 for cooling the pedestal 140', in some process modules.

The lift pad and pedestal configuration 400 includes a center column that is shown to include a coaxial lift pin assembly 415 having a plurality of lift pins, controlled by the lift pin control 122, as previously described. For example, the lift pins are used to raise the wafer from the lift pad 430 and pedestal 140' to allow an end-effector to pick-up the wafer and to lower the wafer after being placed by the end-effector during wafer delivery sequences.

The lift pad and pedestal configuration 400 includes bellows 420. The bellows 420 are individually coupled to the lift pin assembly 415, pedestal, or lift pad and are configured for movement of the lift pins, pedestal, or lift pad. In addition, the lift pad and pedestal configuration 400 includes a rotation motor in a belt-pulley arrangement 427. Further, the ferroseal 425 facilitates rotation of the lift pad 430 in a vacuum environment.

In one embodiment, the wafer sized lift pad 430 is electrostatic chuck (ESC) compatible. The ESC 570 is configured to include electrodes biased to a high voltage in order to induce an electrostatic holding force to hold the wafer in position while the ESC 570 is active. Further, in one embodiment, the lift pad and pedestal configuration 400 includes a compliant shaft section 435 that promotes a uniform gap between the lift pad 430 and the pedestal 140', especially as the lift pad 430 is moved to rest on the pedestal 140'.

As shown in FIG. 4, in one embodiment, ball screw 437 (e.g., left handed) is configured to drive the lift pins counter to pedestal 140' during one sequence of processing. For example, ball screw 437 may be engaged during the wafer delivery sequence in order to extend the lift pins while the pedestal 140' is moved near to or at a bottom-most position for wafer delivery. The ball screw 443 (e.g., right-handed) is used to move the pedestal along the central axis in Z. For example, the ball screw 443 is configured to drive the pedestal 140' in the Z-direction along the central axis using the Z-motor 445. In addition, a short-stroke coupling mechanism 440 is shown.

Figure 5A:
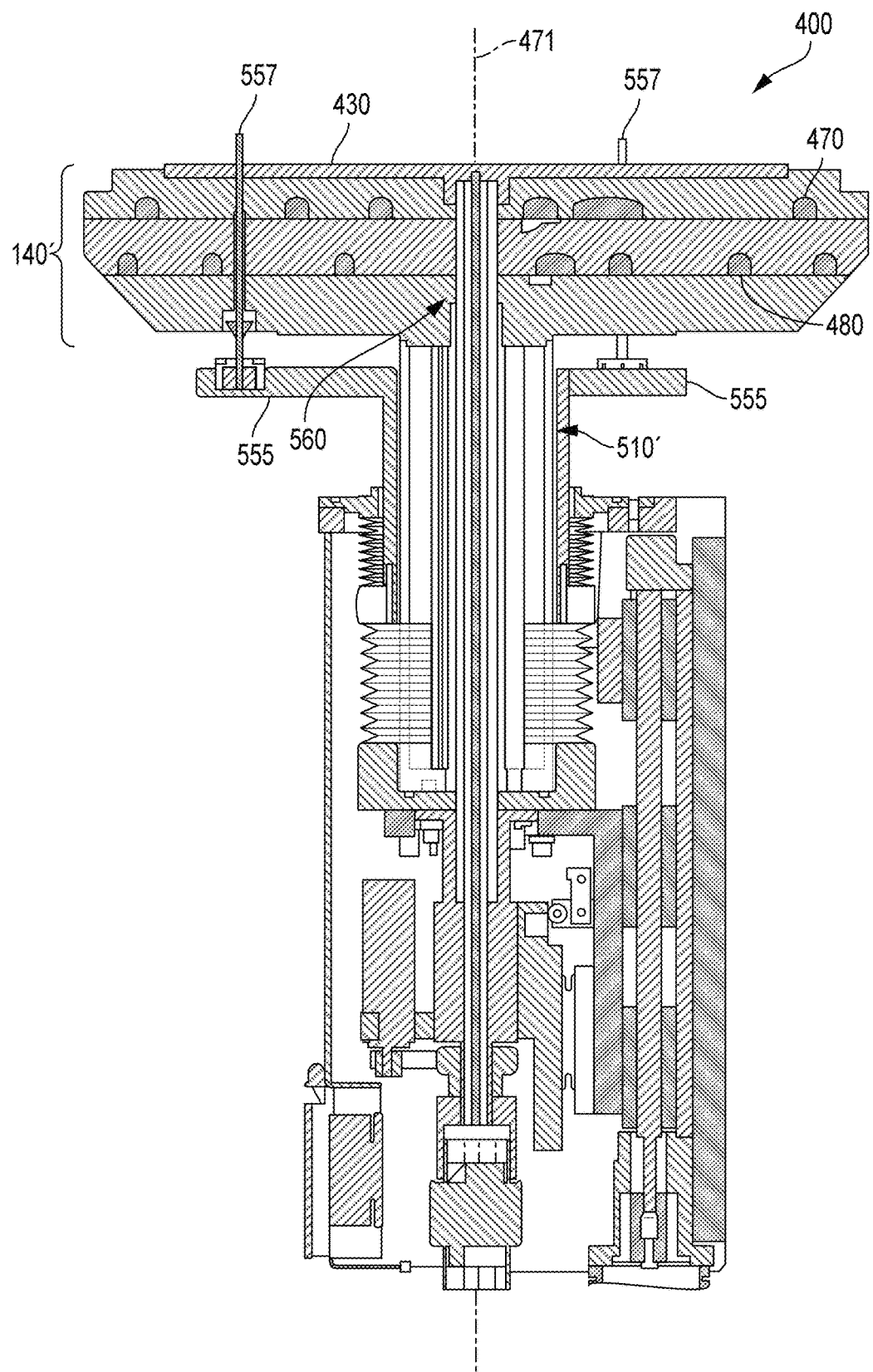
FIG. 5A is a cross-sectional view of the substrate processing system of FIG. 4, in accordance with one embodiment of the present disclosure.

FIG. 5A is a cross-sectional view of the substrate processing system of FIG. 4, in accordance with one embodiment of the present disclosure. In particular, FIG. 5A illustrates the lift pad and pedestal configuration 400, wherein the lift pad 430 is approximately sized to match a wafer (not shown).

For purposes of illustration only, the pedestal 140' is formed in three segments to accommodate during manufacturing the plurality of heating elements 470 and the plurality of cooling elements 480. It is appreciated that the pedestal 140' is considered to be one element, and may be formed using any suitable manufacturing process.

As shown in FIG. 5A, the pedestal 140' and lift pad 430 are at a level allowing for extension of the lift pins 557 for purposes of wafer delivery. Each of the lift pins 557 is coupled to a corresponding lift pin support 555 to effect movement, wherein movement of the lift pin supports 555 are controlled by lift pin control 122. In one embodiment, the pedestal 140' is at a bottommost position along its Z travel along the central axis 471.

As previously described, the pedestal control 450 controls movement of the central shaft 510'. Because pedestal 140' is coupled to the central shaft 510', movement in the central shaft 510' is translated to the pedestal 140'. In addition, as previously described, the lift pad control 455 controls movement of the pad shaft 560. Because lift pad 430 is coupled to the pad shaft 560, movement in the pad shaft 560 is translated to the lift pad 430.

Figure 5B:
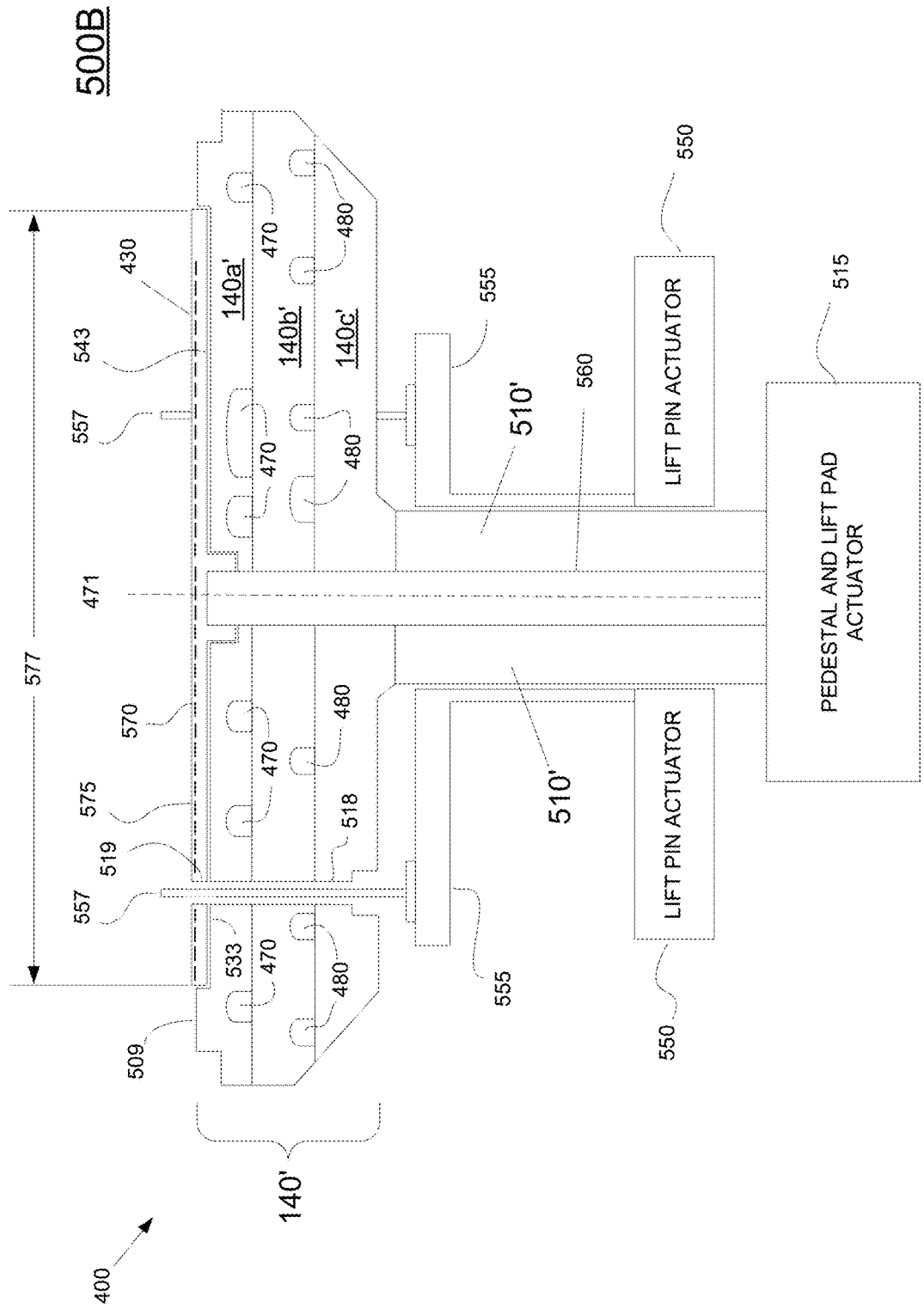
FIG. 5B is a cross-sectional diagram of the substrate processing system of FIG. 4 showing a lift pad and pedestal configuration, wherein the lift pad is approximately sized to match a wafer, and wherein the pedestal and lift pad are at a level allowing for lift pin extension for purposes of wafer delivery, in accordance with one embodiment of the present disclosure.

FIG. 5B is a cross-sectional diagram of the substrate processing system of FIG. 4 showing an assembly 500B including the lift pad and pedestal configuration 400, previously introduced in FIGS. 4 and 5A-5B, in accordance with one embodiment of the present disclosure. The lift pad 430 is approximately sized to match a wafer (not shown). In still another embodiment, the diameter of the lift pad 430 is sized to accommodate a carrier ring (not shown). The lift pad and pedestal configuration 500A provides for improved film uniformity during deposition processes (e.g., PECVD, ALD, etc.) in single-station and multi-station systems by rotating the wafer using a lift pad without rotating a pedestal in order to filter out azimuthal nonuniformities due to chamber and pedestal asymmetries. In particular, the lift pad 430 that rotates is much thinner than the whole pedestal 140', and thus the rotation signature of the lift pad 430 is much less than the rotation signature (asymmetric hardware contributions to nonuniformities) of the pedestal 140', which contains the heater elements 470 and cooling elements 480. That is, the non-uniformities introduced by the pedestal signature can be symmetrically distributed throughout the wafer during wafer processing through wafer rotation using a lift pad, and without rotating the pedestal.

In the assembly 500B, the pedestal 140' includes a pedestal top surface 533, which extends from a central axis 471 of the pedestal 140'. The top surface 533 may include one or more recesses to provide an interface between the pedestal 140' and the lift pad 430, such as a recess in the center about axis 471 configured to facilitate coupling between the pad shaft 510' and the lift pad 430, and a recess forming the outer rim 509. While the pedestal 140' may be described as generally having a circular shape when viewed from above and extending to a pedestal diameter, the footprint of the pedestal 140' may vary from a true circle to accommodate for different features, such as a carrier ring support and end-effector access, etc.

As shown, pedestal 140' is connected to the actuator 515, which is configured for controlling movement of the pedestal 140'. In particular, the pedestal control 450 is coupled to the actuator 515 in order to control movement of the pedestal 140'. That is, a central shaft 510' is coupled to the actuator 515 and the pedestal 140', such that the central shaft 510' extends between the actuator 515 and the pedestal 140'. The central shaft 510' is configured to move the pedestal 140' along the central axis 471. As such, movement of the actuator 515 translates into movement of the central shaft 510', which in turn translates into movement of the pedestal 140'.

In addition, the pedestal 140' is shown having three segments 140a', 140b', and 140c' for purposes of illustration only. For example, pedestal 140' may be formed in three segments to accommodate for formation during manufacturing the plurality of heating elements 470 and/or the plurality of cooling elements 480. As previously disclosed, it is appreciated that pedestal 140' is considered to be one element, and may be formed using any suitable manufacturing processes.

In the assembly 500B, the lift pad 430 includes a pad top surface 575 that extends from the central axis 471. In one embodiment, the pad top surface 575 extends to the pad diameter 577. The lift pad 430 includes a pad bottom surface 543 that is configured to rest upon the pedestal top surface 533. In addition, the pad top surface 575 is configured to support a wafer when placed thereon.

In addition, the lift pad 430 is electrostatic chuck (ESC) compatible, as previously described. For example, an ESC assembly 570 is disposed below the pad top surface 575. The electrostatic chuck assembly 570 prevents wafer movement due to chamber flow disturbances and maximizes contact of the wafer to the chuck (i.e., to the lift pad top surface 575). A benefit to the lift pad 430 sized approximately to a wafer combined with a full-wafer ESC results in minimal wafer backside deposition. In addition, the full-wafer ESC does not require declamping in order to twist and/or rotate.

As shown, lift pad 430 is connected to the actuator 515, which is configured for controlling movement of the lift pad 430. The lift pad control 455 is coupled to the actuator 515 in order to control movement of the lift pad 430. That is, a pad shaft 560 is coupled to the actuator 515 and the pedestal 140', such that the pad shaft 560 extends between the actuator 515 and the pedestal 140'. The pad shaft 560 is configured within the central shaft 510' that is connected to the pedestal 140'. In particular, the pad shaft 560 is configured to move the pedestal 140' along the central axis 471. As such, movement of the actuator 515 translates into movement of the pad shaft 560, which in turn translates into movement of the lift pad 430. In one embodiment, the actuator 515 controls movement of both the lift pad 430 and the pedestal 140'.

Specifically, the pad shaft 560 is configured to separate the lift pad 430 from the pedestal 140', as will be described more fully below in relation to FIGS. 9A-9C. For example, the lift pad 430 is configured to move up relative to the pedestal top surface 533 along the central axis 471 when the pedestal 140' is in an upwards position, such that the lift pad 430 is separated from the pedestal top surface 533 by a process rotation displacement for purposes of rotation of the lift pad 430. In one embodiment, the lift pad 430 moves up relative to the pedestal top surface 533 when the pedestal 140' has reached a topmost upwards position. Further, when the lift pad 430 is separated from the pedestal top surface 533, the lift pad 430 is configured to rotate relative to the pedestal top surface 533 of the pedestal 140' between at least a first angular orientation and a second angular orientation (e.g., between 0 degrees and 180 degrees). The pad shaft 560 is also configured to lower the lift pad 430 to rest upon the pedestal 140'. In particular, a flexible coupler 435 (shown in FIG. 5C) is positioned within the pad shaft 560, and is configured to position the lift pad 430 uniformly above the pedestal 140'.

To prepare for lift pad 430 rotation, the lift pad 430 moves upwards in relation to the pedestal 140', in one embodiment. That is, the lift pad 430 is configured to move up relative to the pedestal top surface 533 along the central axis 471 when the pedestal 140' is in an upwards position (e.g., topmost upwards position) during wafer processing, such that the lift pad 430 is separated from the pedestal top surface 533 by a process rotation displacement 940 (see FIG. 9B), and such that the wafer disposed upon the lift pad 430 is also separated from the pedestal 140'. In particular, when the lift pad 430 is separated from the pedestal 140', the lift pad 430 is configured to rotate relative to the pedestal top surface 533 between at least a first angular orientation and a second angular orientation relative to the pedestal top surface 533. This rotation reduces the effects of the hardware signature of the pedestal during processing, and also reduces the effects of the chamber hardware signature during processing. Additionally, the focus ring (not shown) does not rotate with the wafer, thereby reducing its hardware signature on the wafer during processing.

The assembly 500 includes a lift pin assembly that includes a plurality of lift pins 557. For purposes of illustration, the pedestal 140' and lift pad 430 are at a level allowing for lift pin 557 extension for purposes of wafer delivery, in accordance with one embodiment of the present disclosure. In particular, the lift pins 557 extend from the lift pad 430 through a plurality of pedestal shafts 518 disposed in the pedestal 140' and through a plurality of lift pad shafts 519 in the lift pad 430 in such a manner such that an end-effector arm (not shown) carrying a wafer (with or without a carrier ring) is able to maneuver into a position for delivering the wafer to the lift pins 557 or for receiving the wafer from the lift pins 557. Corresponding pedestal shafts 518 and pad shafts 519 are aligned and configured to receive a corresponding lift pin 557. As shown, one or more lift pin shafts and corresponding lift pins may be configured within the lift pin assembly to lift up and place or remove the wafer during wafer delivery. As shown, each of the lift pins 557 is coupled to a corresponding lift pin support 555 to effect movement. The lift pin supports 555 are coupled to a lift pin actuator 550. In addition, the lift pin control 122 controls movement of the lift pin actuator 550 to effect movement in the lift pins 557.

The lift pin support 555 may be of any shape (e.g., annular ring washer, arm extending from an annular base, etc.). In particular, during operation of the lift pin assembly, the lift pin 557 is attached to the lift pin support 555, and positioned to move within the lift pin shaft to raise the wafer above the lift pad top surface 575 and/or to lower the wafer to rest upon the pad top surface 575 during wafer delivery and processing.

Figure 5C:
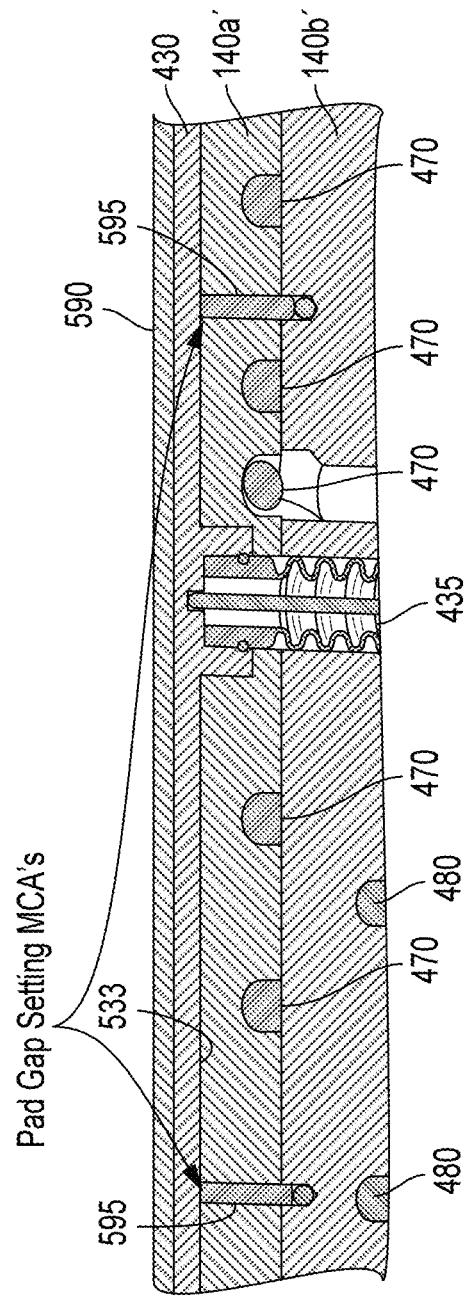
FIG. 5C is a diagram of the interface between the lift pad and pedestal to include pad gap setting minimum contact areas (MCAs), in accordance with one embodiment of the present disclosure.

FIG. 5C is a diagram of the interface between the lift pad 140 and pedestal 430 that includes pad gap setting minimum contact areas (MCAs) to control and/or mechanically set the gap, especially during process sequences, in accordance with one embodiment of the present disclosure. This results in a uniform temperature and impedance control of the pad. The interface shown in FIG. 5C is exemplary of the interfaces between the lift pads and pedestals shown in FIGS. 5A and 5B.

It is advantageous for the gap between the lift pad 430 and the pedestal 140' to be uniform and small for deposition processes. For example, PECVD and ALD processing can exhibit non-uniformity signatures due temperature and plasma impedance for instance. Both factors are sensitive to the gap between the wafer and the pedestal. Minimizing the size of the gap, and controlling the uniformity of the gap across the lift pad and pedestal configuration reduces the signatures caused by temperature and plasma impedance.

In particular, a small gap allows low impedance coupling of radio frequency (RF) energy between the lift pad 430 and the pedestal 140'. In addition, a small gap provides for lower thermal resistance, thereby allowing heating and/or cooling to easily conduct from the pedestal 140' to the lift pad 430. Further, a uniform gap between the lift pad 430 and the pedestal 140' ensures uniform heat transfer and uniform RF coupling.

As shown, the pedestal top surface 533 includes a plurality of pad supports 595 (e.g., pad gap setting MCAs) defined thereon, wherein the pad supports are configured to support the lift pad 430 at a pad support level above the pedestal top surface 533. Segments 140a' and 140b' of the pedestal 140' are shown in FIG. 5C. As previously described, the pad supports 595 provide for a uniform and small gap between the lift pad 430 and the pedestal 140', thereby ensuring uniform heat transfer and uniform RF coupling between the lift pad 430 and the pedestal 140'. More particularly, the bottom surface 543 of the lift pad 430 is configured to rest upon the plurality of pad supports 595 of the pedestal 430. For example, the pedestal 140' and lift pad 430 can be configured in a process position (e.g., when performing plasma processing, treatment and/or film deposition), or in a pre-coat position, such that the lift pad 430 is resting upon the plurality of pad supports 595. In addition, the lift pad 430 is configured to move with the pedestal 140' when resting upon the pad supports 595. Pad supports may be electrically conductive for DC, low frequency, and radio frequency transmission.

Figure 6:
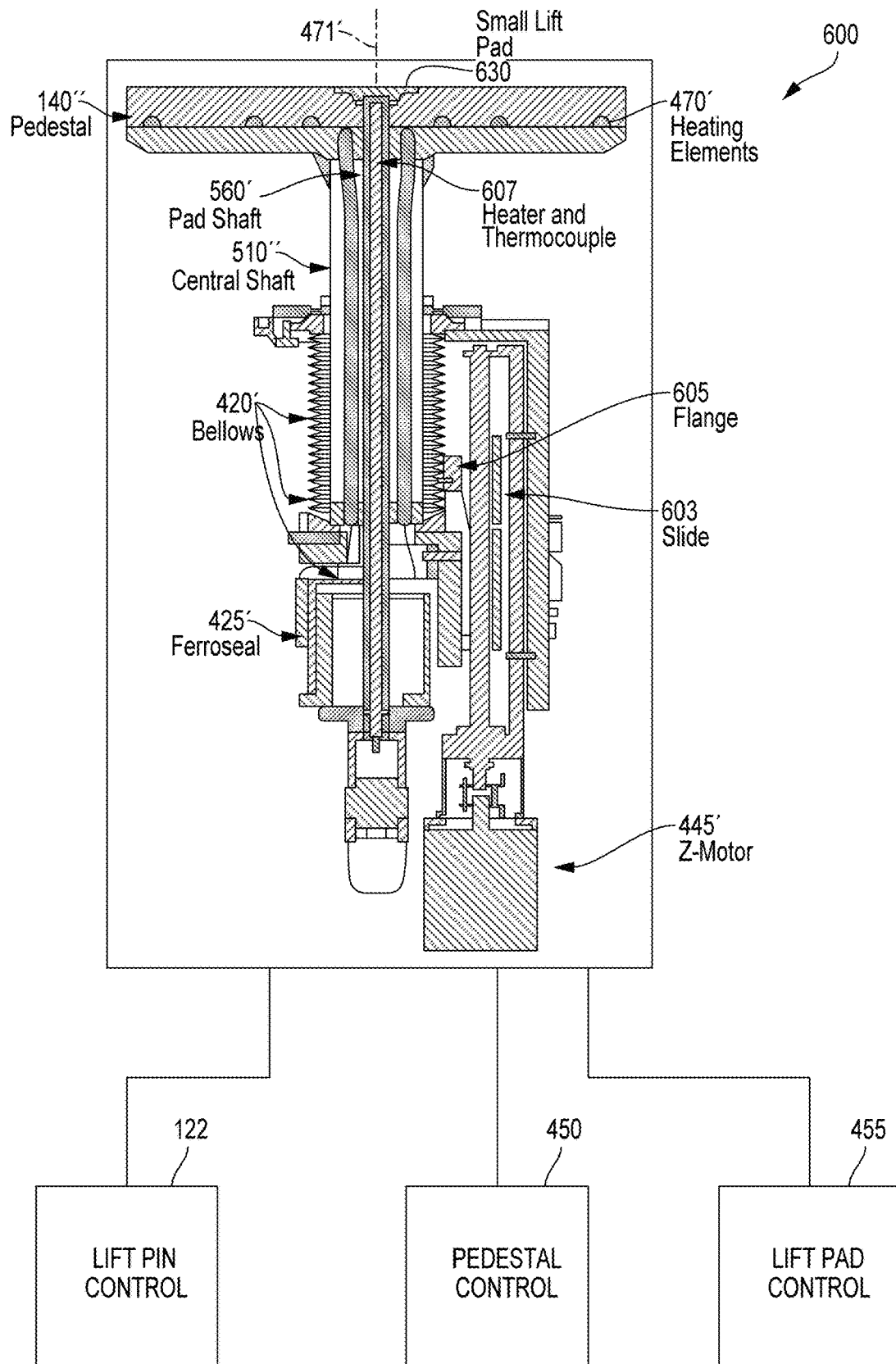
FIG. 6 illustrates a substrate processing system including a lift pad and pedestal configuration, wherein the lift pad is smaller than a wafer, in accordance with one embodiment of the present disclosure.

FIG. 6 illustrates a substrate processing system including a lift pad and pedestal configuration 600, wherein the lift pad 630 is smaller than a wafer (not shown), in accordance with one embodiment of the present disclosure. The lift pad and pedestal configuration 600 may be implemented within the systems of FIGS. 1-3, including multi-station and single-station processing tools The lift pad and pedestal configuration 600 includes a lift pad 630 which is controlled by the lift pad control 455, and a pedestal 140" which is controlled by pedestal control 450. As previously described, pedestal control 450 controls movement of pedestal 140" along a central axis 471', and lift pad control 455 controls movement of the lift pad 630 about the central axis 471' (e.g., up, down, and rotationally). The lift pad and pedestal configuration 600 provides for rotation of the wafer (not shown) via the lift pad 630 with a greatly reduced hardware rotation signature when compared to a processing tool having pedestal rotation or no pedestal rotation.

The lift pad and pedestal configuration 600 includes a small lift pad 630 that is smaller than a wafer footprint. The lift pad and pedestal configuration 600 may be suitable for some deposition processes when an ESC is not selected. In that case, the small lift pad 630 is preferable, since it allows pedestal minimum contact areas (MCAs) that support the wafer during the process to not rotate with the wafer. In that case, the gapping of the wafer nominally does not rotate with the wafer, which reduces exposure to hardware asymmetry. In addition, the smaller lift pad 630 also offers further benefits in that a reduced mass needs to be rotated, which provides less mechanical stresses on the system.

The lift pad and pedestal configuration 600 includes a plurality of heating elements 470' and thermocouple 607, which is included in the pad shaft 560' of the lift pad 630 in order to match the temperature at the surface of the lift pad 630 to the surface of the pedestal 140". Cooling elements in the pedestal 140" may be included in some process modules.

In one embodiment, though not shown, the lift pad and pedestal configuration 600 optionally includes a lift pin assembly having a plurality of lift pins that is controlled by lift pin control 122 to provide for wafer delivery, as previously described. Flange 605 is included in the co-axial lift pin assembly (not shown). In another embodiment, the small lift pad 630 may be used to provide lift pin functionality, eliminating the need for the lift pin assembly, and therefore providing cost and packaging advantages.

The lift pad and pedestal configuration 630 includes bellows 420' each of which is individually coupled to the optional lift pin assembly, pedestal 140", or lift pad 630 and are configured for movement thereof. In addition, lift pad and pedestal configuration 600 also includes a rotation motor in a belt-pulley arrangement (not shown) that is similar to the one shown in FIG. 4. The ferroseal 425' facilitates rotation of the lift pad 630 in a vacuum environment.

In addition, Z-motor 445' is configured to drive the pedestal 630 in the Z-direction along a central axis 471'. In addition, a coupled mechanism driven slide 603 is attached to the pedestal and central shaft 510", and is attached to the ball screw attached to the Z-motor 445', all of which are used to facilitate movement of the pedestal 140" along the central axis 471'.

Figure 7A:
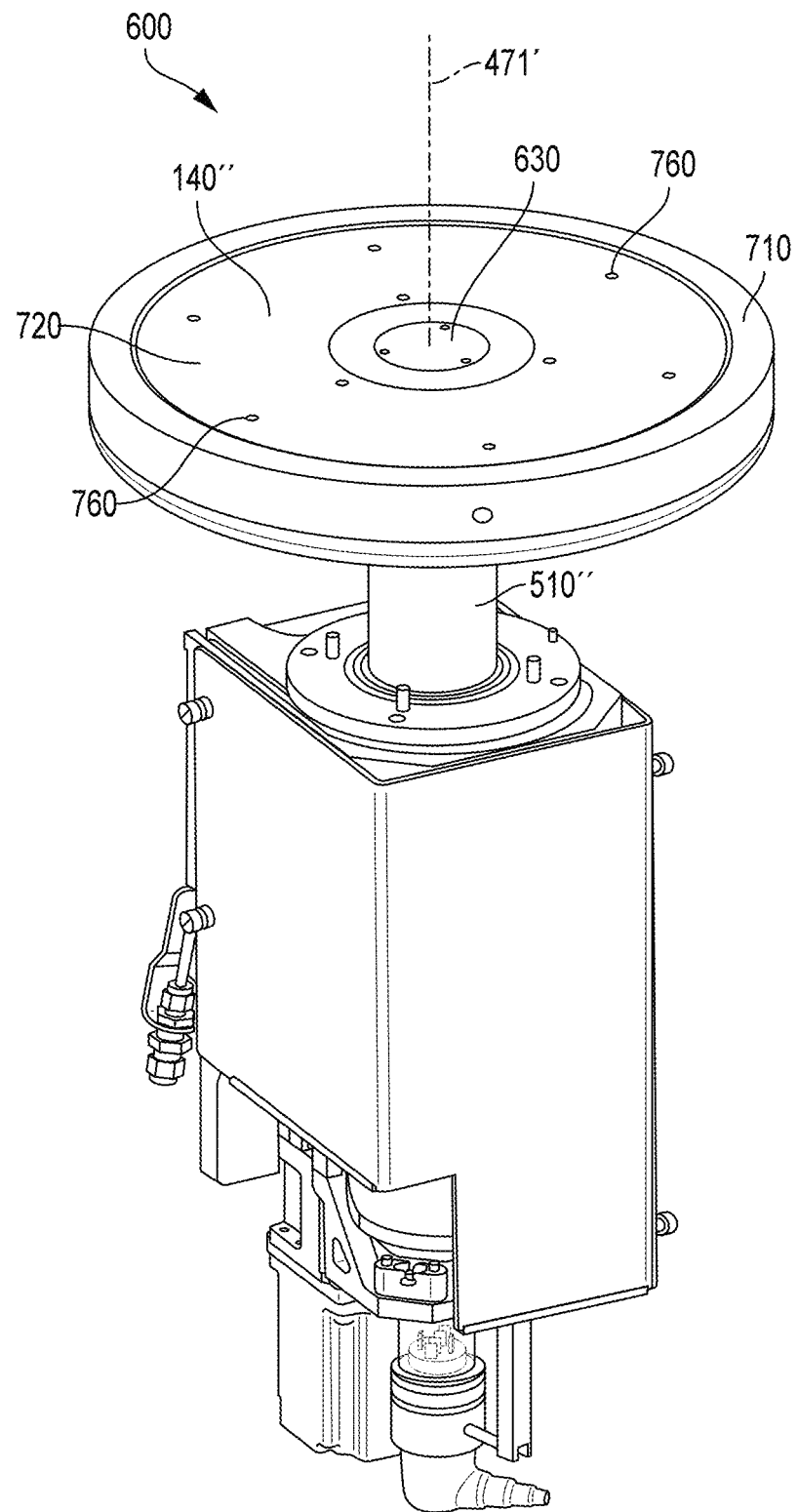
FIG. 7A is a perspective view of the substrate processing system of FIG. 6 including a lift pad and pedestal configuration, wherein the lift pad is smaller than a wafer, in accordance with one embodiment of the present disclosure.

FIG. 7A is a perspective view of the substrate processing system of FIG. 6, in accordance with one embodiment of the present disclosure. In particular, FIG. 7A includes the lift pad and pedestal configuration 600, wherein the lift pad 630 is smaller than a wafer (not shown). As shown in FIG. 7A, the pedestal 140" and the lift pad 630 are shown at positions and/or levels allowing for wafer processing.

As previously described, pedestal control 450 controls movement of the central shaft 510". Because pedestal 140" is coupled to the central shaft 510", movement in the central shaft 510" is translated to the pedestal 140". In addition, as previously described, the lift pad control 455 controls movement of the pad shaft 560'. Because the lift pad 630 is coupled to the pad shaft 560', movement in the pad shaft 560' is translated to the lift pad 630.

The pedestal 140" of the lift pad and pedestal configuration 600 includes a pedestal top surface 720 extending from the central axis 471" of the pedestal 140". A plurality of wafer supports 760 is disposed on the top surface 720. In addition, a raised rim 710 is disposed on the outer edge of the pedestal top surface 720, wherein the raised rim 710 is configured for blocking lateral movement of a wafer that is placed on the pedestal 140".

Figure 7B:
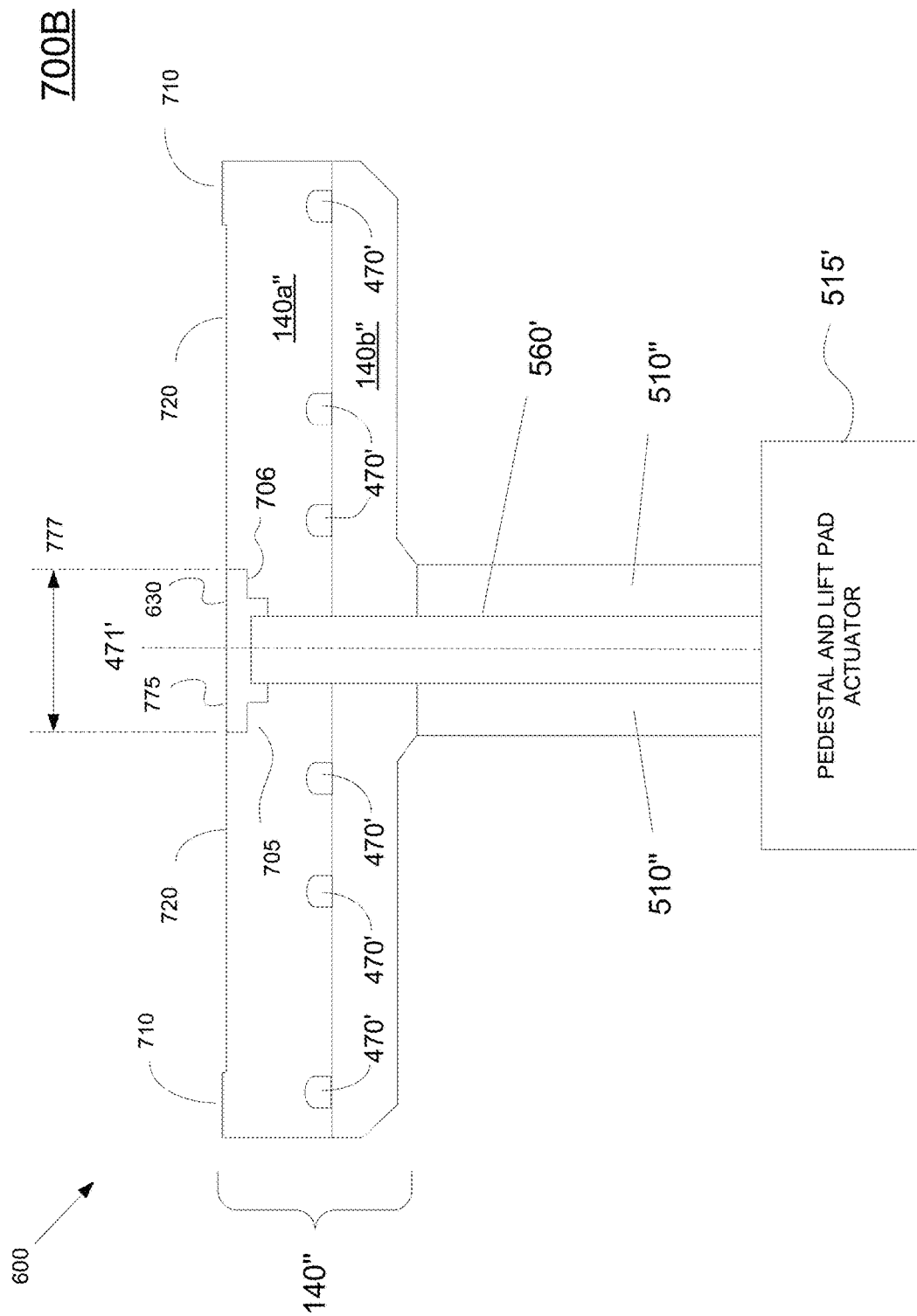
FIG. 7B is a cross-sectional diagram of the substrate processing system of FIG. 6 including a lift pad and pedestal configuration, wherein the lift pad is smaller than a wafer, in accordance with one embodiment of the present disclosure.

FIG. 7B is a cross-sectional diagram of the substrate processing system of FIG. 6 showing an assembly 700B including a lift pad and pedestal configuration 600, previously introduced in FIGS. 6 and 7A, in accordance with one embodiment of the present disclosure. The lift pad 630 is sized smaller than a wafer, in accordance with one embodiment of the present disclosure. For purposes of illustration only, the pedestal 140" and the lift pad 630 are shown at positions and/or levels allowing for wafer processing. The lift pad and pedestal configuration assembly 700B provides for improved film uniformity during deposition processes (e.g., PECVD, ALD, etc.) in single-station and multi-station systems by rotating the wafer using a lift pad without rotating a pedestal in order to filter out azimuthal nonuniformities due to chamber and pedestal asymmetries. In particular, the lift pad 630 that rotates is much smaller and thinner than the whole pedestal 140", and thus the rotation signature of the lift pad 630 is much less than the rotation signature (asymmetric hardware contributions to nonuniformities) of the pedestal 620, which contains the heater elements 480'. That is, the non-uniformities introduced by the pedestal signature can be symmetrically distributed throughout the wafer during wafer processing through wafer rotation using a lift pad, and without rotating the pedestal.

In the assembly 700B, the pedestal 140" includes a pedestal top surface 720 extending from the central axis 471' of the pedestal 140". The pedestal top surface 720 is configured to support a wafer when placed thereon. The top surface 720 may include one or more recesses to provide an interface between the pedestal 140" and the lift pad 630, such as a recess 705 configured to facilitate coupling between the pad shaft 510' and the lift pad 430, and a recess forming the outer rim 710. While the pedestal 140" may be described as generally having a circular shape when viewed from above and extending to a pedestal diameter, the footprint of the pedestal 140" may vary from a circle to accommodate for different features, such as a carrier ring support, and end-effector access, etc.

As shown, pedestal 140" is connected to the actuator 515', which is configured for controlling movement of the pedestal 140". In particular, the pedestal control 450 is coupled to actuator 515' to control movement of the pedestal 140". In particular, a central shaft 510" is coupled to the actuator 515' and the pedestal 140", such that the central shaft 510" extends between the actuator 515' and the pedestal 140". The central shaft 510" is configured to move the pedestal 140" along the central axis 471'. As such, movement of the actuator 515' translates into movement of the central shaft 510", which in turn translates into movement of the pedestal 140".

In one embodiment, the pedestal top surface 720 includes a plurality of wafer supports (not shown) defined thereon, wherein the wafer supports are configured to support a wafer 590 at a wafer support level above the pedestal top surface 720. The wafer supports provide for a uniform and small gap between the pedestal 140" and any wafer 590 disposed thereon.

The pedestal 140" includes a recess 705 centered in the pedestal top surface 720 and extending from the central axis 471', the recess 705 having a recess height, and wherein the recess 705 having a recess bottom surface 706. That is, recess 705 sits over a center portion of the pedestal top surface 720. In one embodiment, the recess bottom recess surface 706 includes a plurality of pad supports defined thereon, wherein the pad supports (e.g., MCAs) are configured to support the lift pad 630 at a pad support level above the bottom recess surface 706. In another embodiment, MCAs are disposed on the bottom surface of the lift pad 630, as is further described in relation to FIG. 7F.

In addition, the pedestal 140" is shown having two segments 140a" and 140b", for purposes of illustration only. For example, pedestal 140" may be formed in two segments to accommodate for formation during manufacturing the plurality of heating elements 470' and/or a plurality of cooling elements (not shown). As previously disclosed, it is appreciated that pedestal 140" is considered to be one element, and may be formed using any suitable manufacturing processes In the assembly 700B, the lift pad 630 includes a pad top surface 775 that extends from the central axis 471' to the pad diameter 777. The lift pad 630 is configured rest upon the recess bottom surface 706 when situated within the recess 705, wherein the recess 705 is configured to receive the lift pad 630. In particular, the lift pad top surface 775 is below the wafer 590 when the wafer 590 sits on the wafer supports of the pedestal 140", such as in a process position (e.g., when performing plasma processing, treatment and/or film deposition). That is, the lift pad top surface 775 sits under the wafer support level when the pad bottom surface 632 of the lift pad 630 rests upon the plurality of pad supports (e.g., MCAs 745). Further, the lift pad 630 is configured to move with the pedestal 620 when resting upon the pad supports.

As shown, the lift pad 630 is connected to the actuator 515', which is configured for controlling movement of the lift pad 630. For example, the lift pad control 455 is coupled to actuator 515' in order to control movement of the lift pad 630. In particular, a pad shaft 560' is coupled to the actuator 515' and the pedestal 140", such that the pad shaft 560' extends between the actuator 515' and the pedestal 140". The pad shaft 560' is configured within the central shaft 510" that is connected to the pedestal 140". In particular, the pad shaft 560' is configured to move the lift pad 630 along the central axis 471'. As such, movement of the actuator 515' translates into movement of the pad shaft 560", which in turn translates into movement of the lift pad 630. In one embodiment, the actuator 515' controls movement of both the lift pad 630 and the pedestal 140".

Specifically, the pad shaft 560' is configured to separate the lift pad 630 from the pedestal 140" for lift pad rotation, as will be described more fully below in relation to FIGS. 10A-10D. For example, the lift pad 630 is configured to move up relative to the pedestal top surface 720 along the central axis 471' when the pedestal 140" is in an upwards position, such that the lift pad 630 is separated from the pedestal top surface 720 by a process rotation displacement for purposes of rotating the lift pad 630. The pad shaft 560' is also configured to lower the lift pad 430 to rest upon the pedestal 140'. In one embodiment, to prepare for lift pad rotation, the lift pad 630 moves upwards in relation to the pedestal 140". That is, the lift pad 630 is configured to move up relative to the pedestal top surface 720 along the central axis 471" when the pedestal 140" is in the upwards position, such that the lift pad 630 is separated from the pedestal top surface 720 by a process rotation displacement 1040 (see FIGS. 10B and 10C), and such that the wafer disposed upon the lift pad 630 is separated from the pedestal 140". In one embodiment, the pedestal 140" is in the topmost upward position during lift pad 630 rotation. In particular, when the lift pad 630 is separated from the pedestal 140", the lift pad 630 is configured to rotate relative to the pedestal top surface 720 between at least a first angular orientation and a second angular orientation (e.g., between 0 degrees and 180 degrees). This rotation reduces the effects of the hardware signature of the pedestal during processing, and also reduces the effects of the chamber hardware signature during processing.

In other embodiments, the lift pad 630 provides for lift pin functionality to raise and lower the wafer during wafer delivery and processing. Specifically, the lift pad 630 is configured to move up relative to the central pedestal top surface 720 when the pedestal is in a bottommost downwards position, such that the lift pad 630 is separated from the central pedestal top surface 621 by a displacement large enough for entry of an end-effector arm.

As shown in FIG. 7B, the pedestal 140" of the lift pad and pedestal configuration 600 includes a raised rim 710 disposed on the outer edge of the pedestal top surface 720, wherein the raised rim 710 is configured for blocking lateral movement of a wafer that is placed on the pedestal 140". That is, the rim 710 is a step above the pedestal top surface 720 at a height sufficient to block movement of the wafer. For example, the raised rim 710 forms a groove blocking lateral movement of the wafer when the wafer rests on the pedestal top surface 720.

Figure 7C:
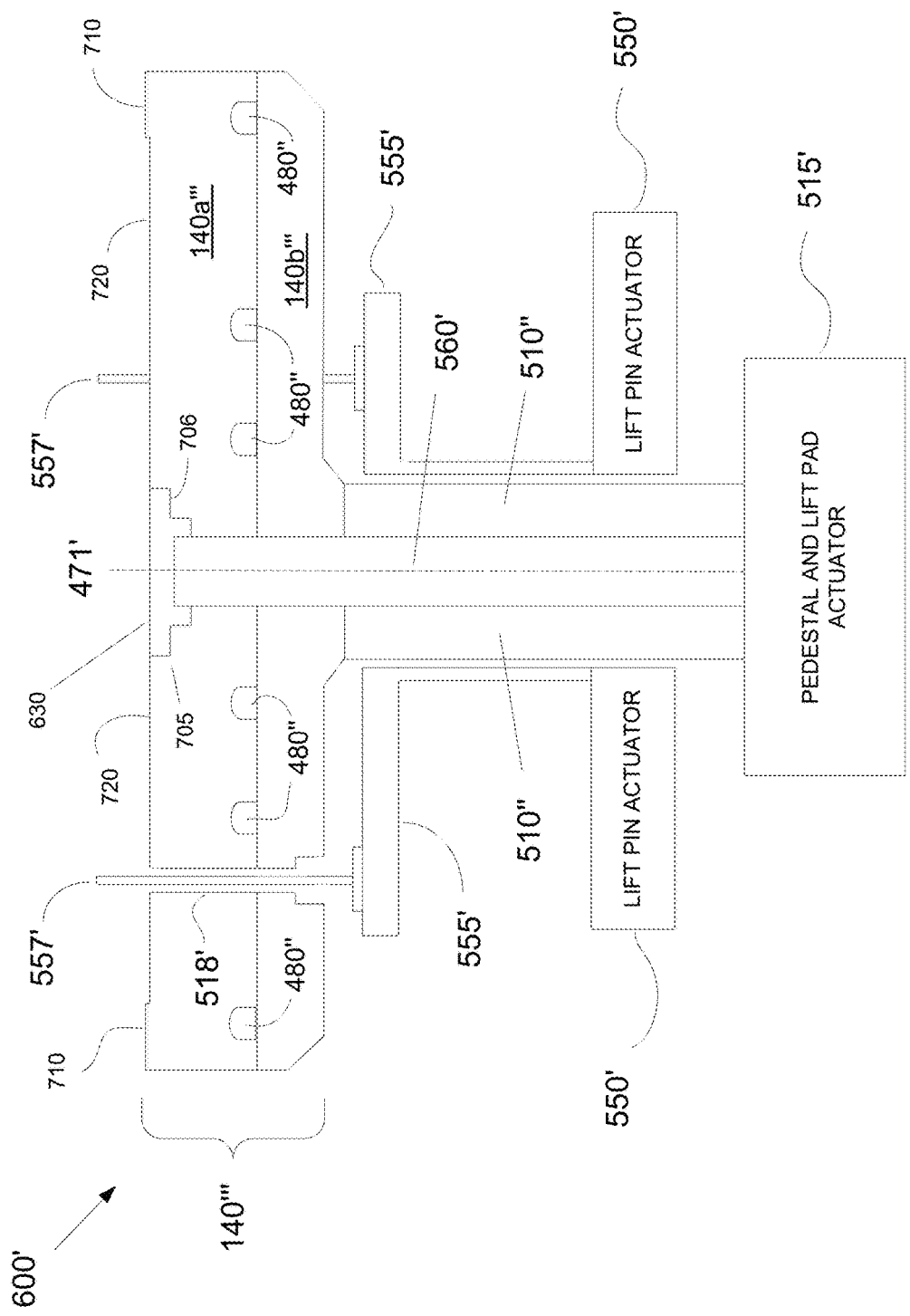
FIG. 7C is a cross-sectional diagram of the substrate processing system of FIG. 6 including a lift pad and pedestal configuration that includes a lift pin assembly, wherein the lift pad is smaller than a wafer, in accordance with one embodiment of the present disclosure.

FIG. 7C is a cross-sectional diagram of the substrate processing system of FIG. 6 showing an assembly 700C including a lift pad and pedestal configuration 600', based on the configurations previously introduced in FIGS. 6, 7A and 7B, wherein the lift pad 630 is smaller than a wafer, in accordance with one embodiment of the present disclosure. The lift pad and pedestal configuration 600' includes a pedestal 140''' and lift pad 630. More specifically, the lift pad and pedestal configuration 600' of FIG. 7C is similar to the lift pad and pedestal configuration 600 of FIG. 7B, and provides the same benefits and advantages (e.g., improved fil uniformity during deposition processes), previously described in relation to FIG. 7B. That is, the non-uniformities introduced by the pedestal signature can be symmetrically distributed throughout the wafer during wafer processing through wafer rotation using a lift pad, and without rotating the pedestal. However, the lift pad and pedestal configuration 600' also includes the lift pin assembly that is configured for delivery of a corresponding wafer (e.g., wafer 590).

The lift pin assembly of the assembly 700C includes a plurality of lift pins 557'. For purposes of illustration, the pedestal 140''' and lift pad 630 are at a level allowing for lift pin 557' extension for purposes of wafer delivery, in accordance with one embodiment of the present disclosure. In particular, the lift pins 557' extend from a plurality of pedestal shafts 518' displaced from the central axis 471' and disposed in the pedestal 140" in such a manner such that an end-effector arm (not shown) carrying a wafer (with or without a carrier ring) is able to maneuver into a position for delivering the wafer to the lift pins 557' or for receiving the wafer from the lift pins 557'. Corresponding pedestal shafts 518' are configured to receive a corresponding lift pin 557'. As shown, one or more pedestal shafts 518' and corresponding lift pins 557' may be configured within the lift pin assembly to lift up and place or remove the wafer during wafer delivery. As shown, each of the lift pins 557' is coupled to a corresponding lift pin support 555' and positioned to move within the pedestal shaft 518' to raise the wafer above the pedestal top surface 720 and/or to lower the wafer to the pedestal top surface 720 during wafer delivery and processing. The lift pin support 555' is configured to move relative to the pedestal top surface 720 in parallel to the central axis 471'. Further, the lift pin supports 555' are coupled to a lift pin actuator 550'. In addition, the lift pin control 122, previously introduced, controls movement of the lift pin actuator 550' to effect movement in the lift pins 557'. The lift pin support 555' may be of any shape (e.g., annular ring washer, arm extending from an annular base, etc.).

Figure 7D:
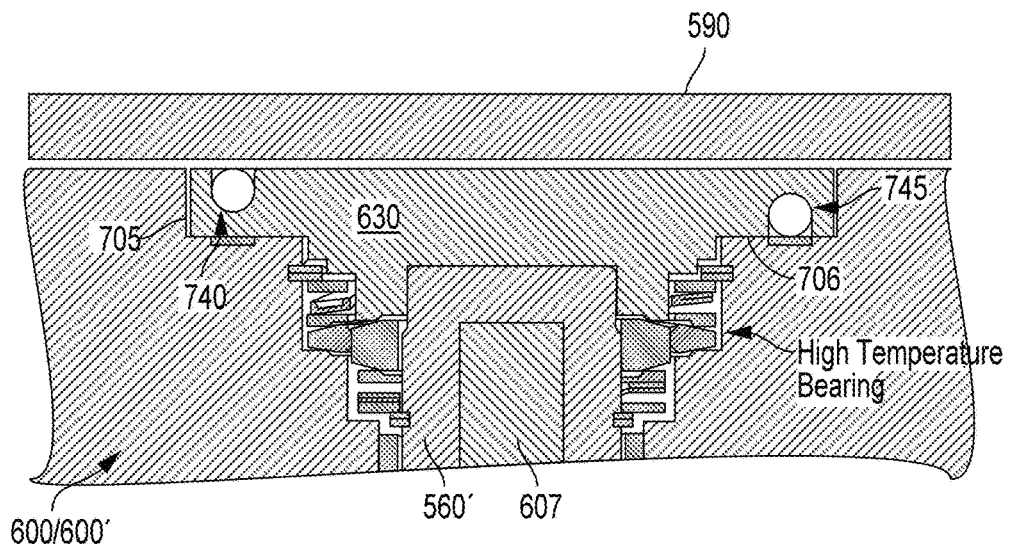
FIG. 7D is a cross-sectional diagram of the lift pad to pedestal interface in the substrate processing system of FIG. 6 that includes a lift pad and pedestal configuration, wherein the lift pad is smaller than a wafer, in accordance with one embodiment of the present disclosure.

FIG. 7D is a cross-sectional diagram of the lift pad to pedestal interface in the substrate processing system of FIG. 6 that includes a lift pad and pedestal configuration 600 or 600' of FIGS. 7A-7C, wherein the lift pad is smaller than a wafer, in accordance with one embodiment of the present disclosure.

High temperature bearing 755 is positioned within the pad shaft 560' and is configured to position the lift pad 630 uniformly within the recess 705 of pedestal 140' or 140". To handle high temperatures, the wear surfaces preferably made of a hard, chemically compatible material, such as sapphire. The bearing centering is insensitive to relative thermal expansion of the bearing components, the shaft, and pedestal materials. In one embodiment, the conical clamping surface of the sapphire bearing rings may be spring loaded using an assembly of load distributing washers, spring washers, and retaining rings of material suitable for high temperature and corrosive operation. The bearing is clamped with min energy at its centered position and remains centered with changes in temperature. A sapphire contact ring prevents indentation of the softer pedestal material.

In particular, the interface between lift pad 630 and the pedestal 140"/140''' is shown, and includes pad gap setting MCAs to control and/or mechanically set the gap, especially during process sequences. For example, FIG. 7D shows sapphire balls 740 and 745 (e.g., MCAs) swaged into the lift pad 630. In particular, the balls 740 and 745 protrude slightly above the corresponding surface on the order operating system several millimeters at process temperature. The sapphire balls act to contact the pedestal 140"/140''' in a minimum contact area to minimize thermal conduction through the contact with a poor thermally conducting material. Further, a sapphire contact ring prevents indenting of the softer pedestal material.

Figure 7E:
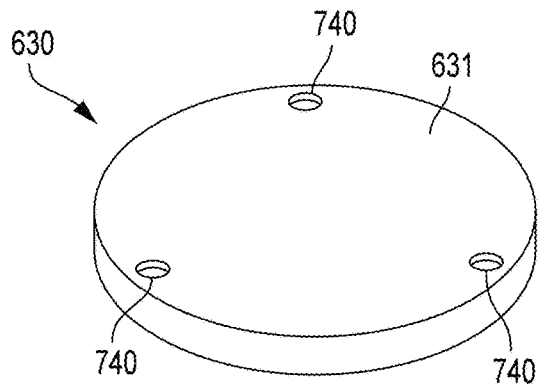
FIG. 7E is a perspective view of the top surface of the lift pad in the substrate processing system of FIG. 6 that includes a lift pad and pedestal configuration, in accordance with one embodiment of the present disclosure.

For example, FIG. 7E is a perspective view of the top surface 631 of the lift pad 630 shown in FIG. 7D that includes MCAs 740, in accordance with one embodiment of the present disclosure. In one embodiment, the wafer referencing MCAs 740 are positioned at 0.002" above the top surface 631, such that the pad top surface 631 is under the wafer support level when the lift pad 630 rests upon the recess bottom surface 706. The wafer referencing MCAs 740 do not contact the wafer 590 when the lift pad 630 is resting on the pedestal 140"/140''' because separate pedestal wafer supports (e.g., MCAs) located on the top surface of the pedestal 720 are higher by approximately 0.002" or more, in one embodiment. The wafer supports disposed on the pedestal top surface 720 of the pedestal 140"/140''' are configured to support the wafer 590 when placed thereon at a wafer support level above the top surface 720.

Figure 7F:
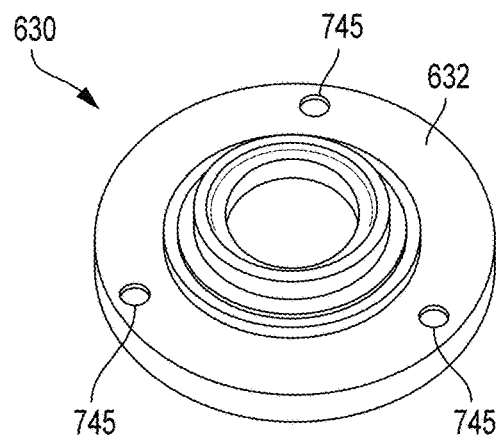
FIG. 7F is a perspective view of the bottom surface of the lift pad in the substrate processing system of FIG. 6 that includes a lift pad and pedestal configuration, in accordance with one embodiment of the present disclosure.

Also, FIG. 7F is a perspective view of the bottom surface 632 of the lift pad 630 shown in FIG. 7D that includes MCAs 745, in accordance with one embodiment of the present disclosure. In one embodiment, the wafer referencing MCAs 745 are 0.004" above the bottom surface 632. This ensures uniform, repeatable gapping between the lift pad 630 and pedestal 140"/140''' to provide uniform, repeatable thermal resistance to the pedestal 140"/140'''. In one embodiment, the MCAs 745 work in conjunction with a plurality of pad supports (not shown) disposed on the recess bottom surface 706, which are configured to support the lift pad 630 at a pad support level above the recess bottom surface 706.

Figure 8:
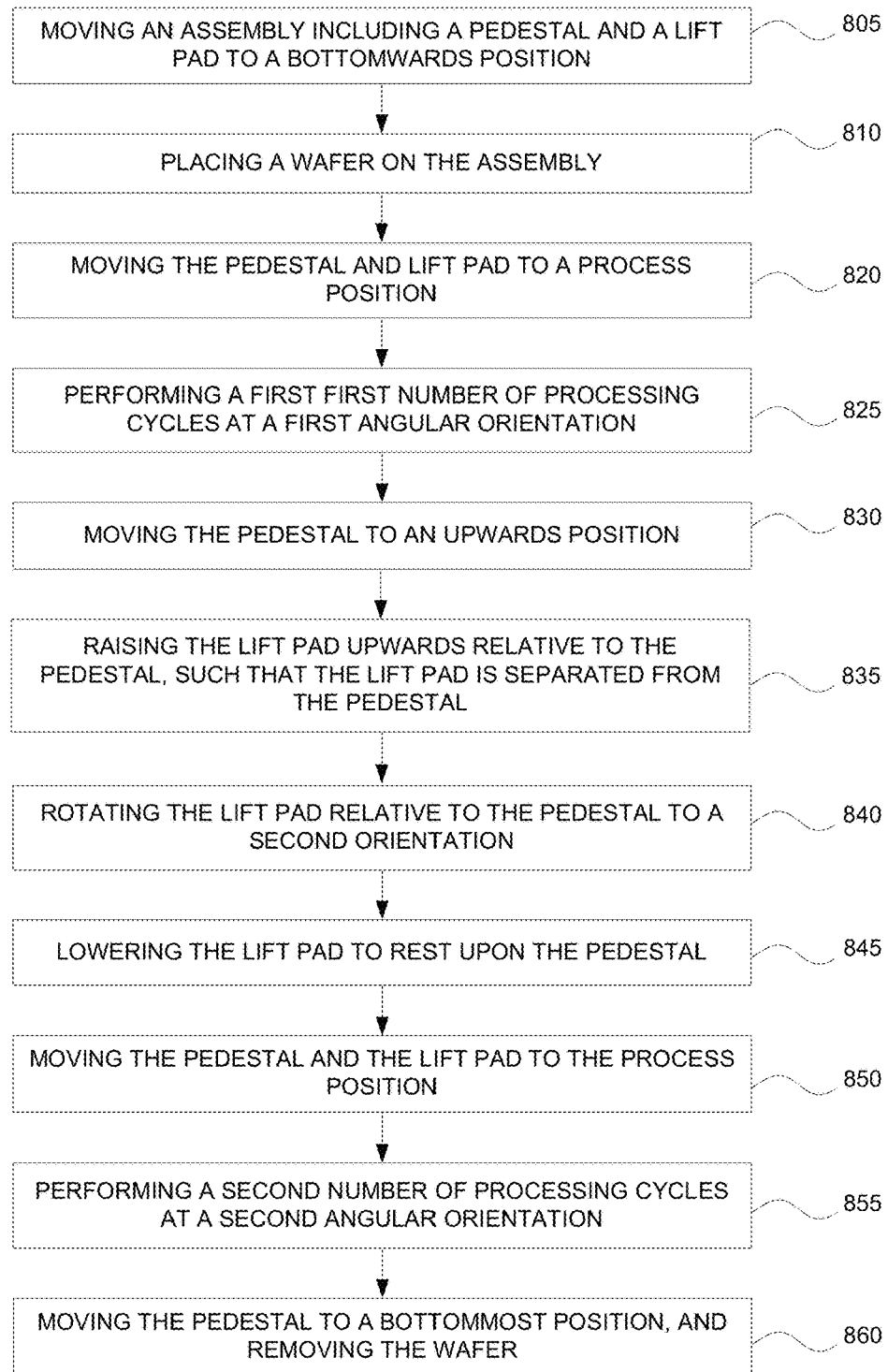
FIG. 8 is a flow diagram illustrating a method for operating a process chamber configured for depositing a film on a wafer, wherein the method provides for rotating the wafer without rotation of the pedestal within the process chamber during processing, which advantageously filters out both chamber and pedestal asymmetries, in accordance with one embodiment of the present disclosure.

FIG. 8 is a flow diagram 800 illustrating a method for operating a process chamber configured for depositing a film on a wafer, wherein the method provides for rotating the wafer without rotation of the pedestal within the process chamber during processing, which advantageously filters out both chamber and pedestal asymmetries, in accordance with one embodiment of the present disclosure. Flow diagram 800 is implemented within the systems and lift pad and pedestal configurations of FIGS. 1-7, in embodiments of the present disclosure. The operations in flow diagram 800 are applicable to the wafer-sized lift pad and pedestal configuration, as shown in FIGS. 4 and 5A5C in embodiments, and to a lift pad and pedestal configuration that includes a lift pad that is sized to be smaller than a wafer, such as that shown in FIGS. 6, and 7A-7F, in other embodiments.

At operation 805, the method includes moving the lift pad and pedestal configuration to a bottomwards position to receive a wafer. In one embodiment, the pedestal is in its bottommost downwards position. In a lift pad and pedestal configuration that includes a lift pin assembly, the lift pins may be extended for wafer delivery. In a lift pad and pedestal configuration that does not include a lift pin assembly, the lift pad (e.g., smaller than a wafer) may be separated from the pedestal top surface by a displacement large enough for entry of an end-effector arm for purposes of wafer delivery. At operation 810, a wafer is placed onto an assembly including the lift pad and pedestal configuration, wherein the lift pad is configured to rest upon the pedestal. For example, this may involve placing the wafer onto the extended lift pins, or placing the wafer on an extended lift pad. Lift pins or the lift pad are lowered such that the wafer rests on the wafer supports of the pedestal top surface, lift pad top surface, or ESC chuck surface.

Pedestal movement is controlled, such that that the pedestal is moved up and down along the central axis of the pedestal. In one embodiment, a coupled mechanism translates movement of the pedestal to the lift pad in the lift pad and pedestal configuration. For example, after the wafer is delivered the lift pad and pedestal configuration is moved to a process position at operation 820. In the process position, the lift pad rests upon the pedestal, as previously described. Further, the lift pad is in a first orientation in relation to the pedestal and/or the chamber. The first orientation may be arbitrary. For example, both the lift pad and the pedestal may be positioned at a 0 degree angular orientation within the chamber.

At operation 825, the method includes processing the wafer for a first number of processing cycles at the first orientation. For example, the deposition of one or more films may implement an atomic layer deposition (ALD) process, which is also known as atomic layer chemical vapor deposition (ALCVD). ALD produces very thin films that are highly conformal, smooth, and possess excellent physical properties. ALD uses volatile gases, solids, or vapors that are sequentially introduced (or pulsed) over a heated substrate. In one ALD cycle, four operations are performed and can be defined as an A-P-B-P sequence. In step A, a first precursor is introduced as a gas, which is absorbed (or adsorbed) into the substrate. In step P right after step A, the reactor chamber is cleared of the gaseous precursor. In step B, a second precursor is introduced as a gas, which reacts with the absorbed precursor to form a monolayer of the desired material. In step P right after step B, the reactor chamber is again cleared of the gaseous second precursor. By regulating this A-P-B-P sequence, the films produced by ALD are deposited a monolayer at a time by repeatedly switching the sequential flow of two or more reactive gases over the substrate. In that manner, the thickness of the film may be regulated depending on the number of cycles performed of the A-P-B-P sequence. The first number of cycles may be defined as value X. To illustrate the present embodiments that disclose a lift pad and pedestal configuration capable of rotating the wafer without rotation of the pedestal within the process chamber during processing, which advantageously filters out both chamber and pedestal asymmetries, X number of cycles may be 50 cycles.

At operation 830, the method includes raising the pedestal to an upwards position. In one embodiment, the pedestal is raised to its topmost upwards position. By moving the pedestal to the upwards position, the lift pad is also raised upwards relative to the pedestal (e.g., top surface of pedestal), such that the wafer disposed on the lift pad is separated from the pedestal 820. In one embodiment, a coupled mechanism raises the lift pad when the pedestal nears the top of its travel. That is, the surface contact of the lift pad 830 to pedestal 820 is broken, which allows the lift pad to rotate freely. In particular, the lift pad is separated from the pedestal by a process rotation displacement (e.g., on the order of 1 mm). In this manner, a wafer supported by or disposed on the lift pad is also separated from the pedestal.

At operation 840, the method includes rotating the lift pad 830 relative to the pedestal 820 (e.g., top surface of pedestal), when the lift pad 830 is separated from the pedestal 820. In particular, the lift pad 830 is rotated from the first orientation to a second orientation relative to the pedestal 820. For example, the second orientation may be 180 degrees from the first orientation (e.g., first orientation at 0 degrees).

At operation 845, the method includes lowering the lift pad to rest upon the pedestal. Also, at operation 850, the method includes moving the pedestal, and correspondingly the lift pad, back to the process position. In one embodiment, the operations performed at 845 and 850 occur simultaneously through the action of the coupled mechanism, such that by lowering the pedestal back to the process position, the lift pad is also lowered until the lift pad rests upon the pedestal.

At operation 855, the method includes processing the wafer for a second number of processing cycles (e.g., each cycle includes an A-P-B-P sequence), wherein the lift pad is in the second orientation relative to the pedestal. The second number of cycles may be defined as value Y. To illustrate the present embodiments that disclose a lift pad and pedestal configuration capable of rotating the wafer without rotation of the pedestal within the process chamber during processing, which advantageously filters out both chamber and pedestal asymmetries, Y number of cycles may be 50 cycles.

In that manner, the thickness of the film may be regulated depending on the total number of cycles (e.g., X+Y) performed of the A-P-B-P sequence. Because the wafer is also rotated with respect to the pedestal for the second number of cycles, both chamber and pedestal asymmetries are filtered out, which provides for improved film uniformity during wafer processing.

In the example provided above, the first number of cycles is X, and the second number of cycles is Y, wherein both X and Y include 50 cycles for a total number of 100 cycles performing the A-P-B-P sequence. That is, the first number of processing cycles (X) may be one-half the total number of cycles performed at a first orientation, and the second number of processing cycles (Y) may also be one-half the total number of cycles performed at the second orientation. As such, 50 cycles are performed at the first angular orientation (e.g., 0 degrees), and another 50 cycles are performed at the second angular orientation (e.g., 180 degrees).

While embodiments of the present disclosure are described with reference to a first and second orientation, other embodiments are well suited to performing wafer processing using one or more orientations (e.g., 1, 2, 3, etc.). The orientations may be separated by equal angles in one embodiment, or may be separated by unequal angles in another embodiment. Further, at each orientation, one or more cycles of wafer processing (e.g., ALD, PECVD, etc.) are performed. The number of cycles performed at each orientation may be distributed equally in one embodiment, or may be distributed unequally in another embodiment. That is, other embodiments are well suited to two or more sets of cycles at two or more relative angular orientations (e.g., between the lift pad and pedestal), wherein each set may include equal numbers of processing cycles (e.g., each cycle includes an A-P-B-P sequence), or different numbers of processing cycles.

At 860, the method includes moving the lift pad and pedestal configuration to a bottomwards position for wafer removal from the assembly including the lift pad and pedestal configuration. In one embodiment, the pedestal is in its bottommost downwards position. As previously described, in a lift pad and pedestal configuration that includes a lift pin assembly, the lift pins may be extended for wafer delivery. In a lift pad and pedestal configuration that does not include a lift pin assembly, the lift pad (e.g., smaller than a wafer) may be separated from the pedestal top surface by a displacement large enough for entry of an end-effector arm for purposes of wafer delivery. As such, the wafer may be removed from the extended lift pins, or extended lift pad, using the end-effector arm.

Figure 9A:
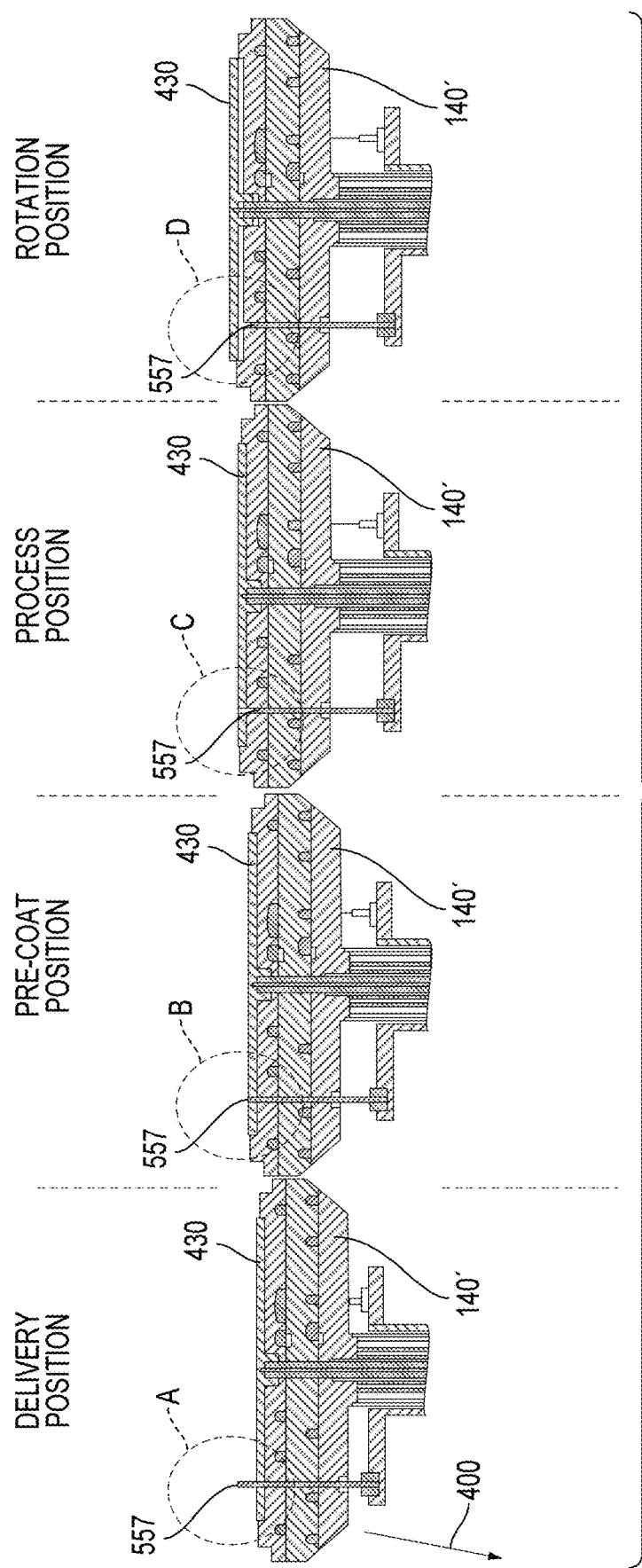
FIGS. 9A and 9B are diagrams illustrating the motion sequence of a lift pad and pedestal configuration, wherein the lift pad is approximately sized to match a wafer, and includes the rotation of the wafer without rotation of the pedestal within a process chamber during processing, which advantageously filters out both chamber and pedestal asymmetries, in accordance with one embodiment of the present disclosure.
Figure 9B:
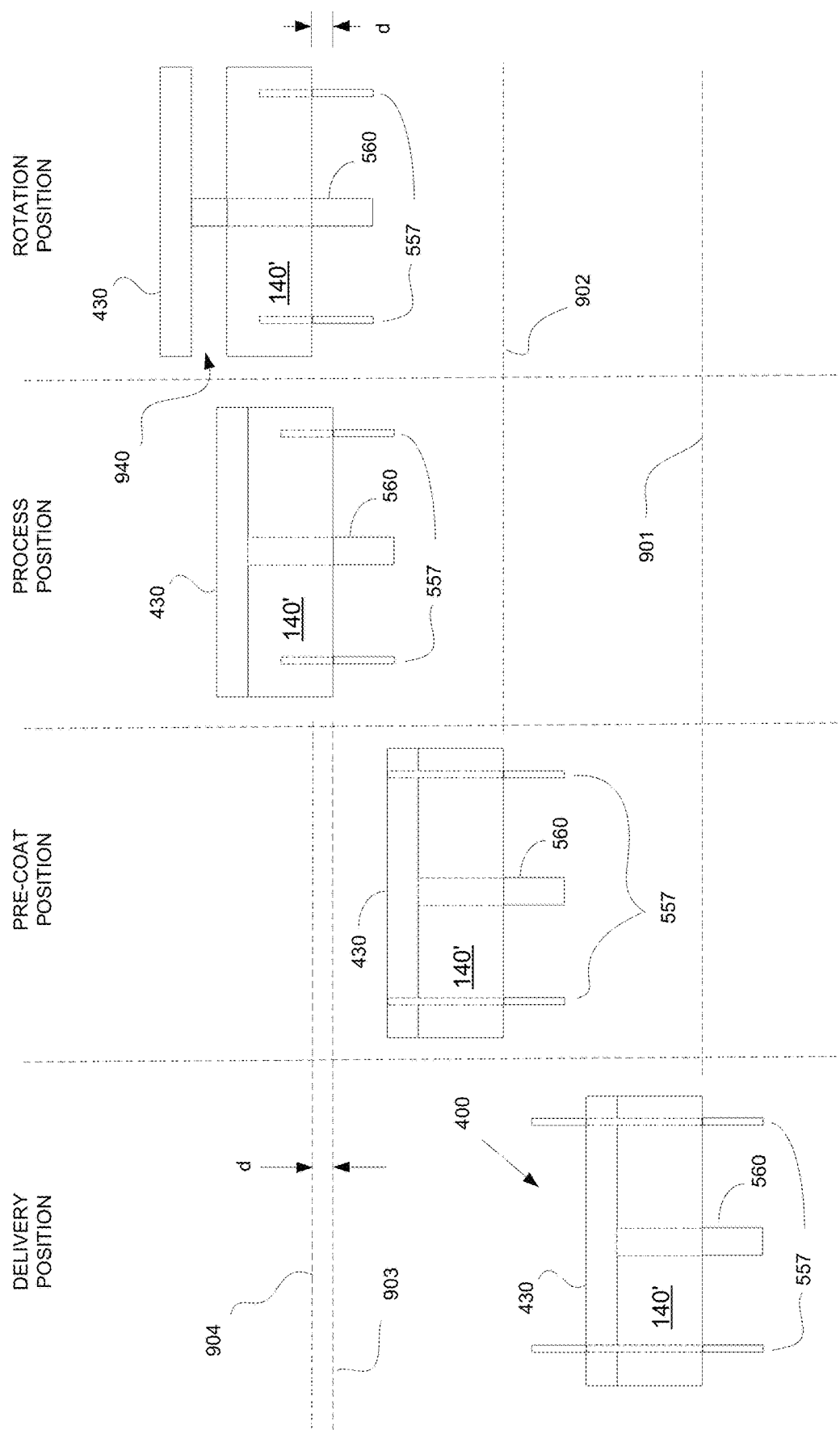

FIGS. 9A and 9B are diagrams illustrating the motion sequence of a lift pad and pedestal configuration, wherein the lift pad is approximately sized to match a wafer, and includes the rotation of the wafer without rotation of the pedestal within a process chamber during processing, which advantageously filters out both chamber and pedestal asymmetries, in accordance with one embodiment of the present disclosure.

In particular, FIG. 9A shows the wafer sized lift pad and pedestal configuration 400, first introduced in FIGS. 4 and 5A-5B. The lift pad and pedestal configuration 400 includes a pedestal 140', lift pad 430, and a lift pin assembly including lift pins 557. In the delivery position, the lift pad and pedestal configuration 400 is configured such that the pedestal 140' is at a bottomwards position with the lift pad resting on the pedestal. As shown in the dotted circle labeled "A," the lift pins 557 are extended from the top surface of the lift pad 430 for purposes of wafer delivery. FIG. 9A also shows the lift pad and pedestal configuration 400 in the pre-coat position, wherein pre-coat and undercoat layers of the film are deposited in the process chamber before wafers are processed. As shown in the dotted circle labeled "B," the lift pad 430 rests upon the pedestal 140'. In addition, the lift pins 557 are positioned such that the tops of the lift pins 557 just fill the holes corresponding to pad shafts in the lift pad 430, which is an appropriate position during chamber pre-coat, when pre-coat deposition occurs, and no wafer is on the lift pad and pedestal configuration 400. FIG. 9A also shows the lift pad and pedestal configuration 400 in the process position, wherein one or more films may be deposited (e.g., PECVD and ALD processes) during wafer processing in single-station and multi-station systems. For example, wafer processing may implement an atomic layer deposition (ALD) process, which is also known as atomic layer chemical vapor deposition (ALCVD). ALD produces very thin films that are highly conformal, smooth, and possess excellent physical properties. As previously introduced, four operations are performed in one ALD cycle (e.g., the A-P-B-P sequence). As shown in the dotted circle labeled "C," the lift pad 430 rests upon the pedestal 140', and the lift pins 557' have retreated to a position within the body of the pedestal 140'. FIG. 9A also shows the lift pad and pedestal configuration 400 in the rotation position, wherein the pedestal is at an upwards position (e.g., topmost upwards position). As shown in the dotted circle labeled "D," the lift pad 430 is separated from the pedestal 140' by a process rotation displacement, such that the lift pad may be rotated to a second angular orientation in relation to the pedestal 140'.

FIG. 9B provides more details to FIG. 9A, and illustrate the motion sequence of the lift pad and pedestal configuration 400, first introduced in FIGS. 4 and 5A-5B, wherein the lift pad is approximately sized to match a wafer, and includes the rotation of the wafer without rotation of the pedestal within a process chamber during processing, which advantageously filters out both chamber and pedestal asymmetries, in accordance with one embodiment of the present disclosure.

In the delivery position, the lift pad and pedestal configuration 400 is configured such that the pedestal 140' is at a bottomwards position with the lift pad 430 resting on the pedestal 140'. In particular, the lift pad and pedestal configuration 400 is at a delivery position ready to receive and/or remove a wafer, such that the bottom of pedestal 140' is at a level within the corresponding chamber indicated by line 901. In particular, in one embodiment the pedestal 140' is at its bottommost level, and is lower than the pre-coat position wherein the bottom of pedestal 140' is at a level indicated by line 902, as well as the level indicated by line 903 associated with a process position, and the level indicated by line 904 associated with a rotation position. As shown, the lift pad 430 rests upon pedestal 140', as previously described. In addition, the lift pins 557 extend beyond the top surface of the lift pad 430, in a position to receive a wafer that is delivered by an arm of an end-effector, for example.

FIG. 9B shows the lift pad and pedestal configuration 400 at a pre-coat level, wherein the bottom of the pedestal 140' is at a level within a corresponding chamber indicated by line 902. It is important to note that the pre-coat position may be defined at any position within the chamber, and is not limited to the level indicated by line 902. For example, the pre-coat position may be same as the process position, wherein the lift pad and pedestal configuration is positioned for wafer processing (e.g., ALD, PECVD, etc.) As shown, the lift pad 430 rests upon the pedestal 140', as previously described. In addition, the lift pins 557 are positioned such that the tops of the lift pins just fill the holes in the lift pad 430, which is an appropriate position during chamber pre-coat, when pre-coat deposition occurs, and no wafer is on the lift pad and pedestal configuration.

In particular, pre-coat and undercoat layers of the film are deposited in the process chamber before wafers are processed. This pre-coat and/or undercoat film may also coat the carrier rings, when included in the lift pad and pedestal configuration, which come into contact with the wafer. It is believed that applying a pre-coat to the chamber and lift pad and pedestal configuration (e.g., contact support structures, such as MCAs), and optional carrier ring with a pre-coat film similar to the film that will be formed over the wafer during processing improves film formation over the wafer. As such, a pre-coat film is formed before the wafer is introduced over the lift pad and pedestal configuration. In addition, the pre-coat, as well as any further undercoatings, of the wafer processing environment serve, in combination, for improved wafer film uniformity. For example, a typical undercoat thickness may be approximately 3 microns, and a pre-coat thickness is approximately 0.5 microns.

FIG. 9B also shows the lift pad and pedestal configuration 400 in the process position, wherein one or more films may be deposited during wafer processing (e.g., PECVD and ALD processes) in single-station and multi-station systems. In particular, pedestal 140' is at a level within the corresponding chamber indicated by line 903. As shown, the pedestal 140' is near its topmost position or level in the chamber. It is important to note that the process position may be defined at any position and/or level within the chamber, depending on the chamber and/or processes implemented, and is not limited to the level indicated by line 903. As shown, the lift pad 430 rests upon the pedestal 140', as previously described. In addition, the lift pins 557 are positioned such that the tops of the lift pins are within the body of the pedestal 140', such that the tops may also be positioned anywhere within the pedestal 140' or lift pad 430. In addition, the lift pad 430 is in a first angular orientation in relation to the pedestal 140'.

FIG. 9B also shows the lift pad and pedestal configuration 400 in the rotation position, wherein the pedestal is at an upwards position. In one embodiment, the bottom of pedestal 140' is at a topmost level within the corresponding chamber indicated by line 904. The lift pad 430 is separated from the pedestal 140' by a process rotation displacement 940 (e.g., on the order of 1 mm). In one embodiment, a coupled mechanism raises the lift pad 430 when the pedestal 140' nears the top of its travel, such that the lift pad is separated from the pedestal top surface by the rotation displacement 940. In particular, as the pedestal 140' reaches the top of its travel, over a certain distance "d" traveled by the pedestal 140', the lift pad 430 moves by a greater distance that may be a factor of "d." For example, as pedestal 140' reaches the top of its travel, the lift pad 430 separates from the pedestal 140' by rotation displacement 940 that is double the distance "d." Thereafter, the lift pad 430 may be rotated from a first angular orientation to a second angular orientation, with respect to the pedestal 140', for example. Thereafter, the lift pad and pedestal configuration 400 may be returned to the process position for additional processing cycles, or to the delivery position for wafer delivery.

FIG. 9C is a diagram illustrating the orientation of a lift pad 430 with respect to a pedestal 140' in a lift pad and pedestal configuration 400, wherein the lift pad is approximately sized to a wafer, during a first process sequence, a rotation sequence, and a second process sequence, in accordance with one embodiment of the present disclosure. In particular, FIG. 9C illustrates the relative orientations (e.g., with respect to each other and/or with respect to a coordinate system 950 within a chamber) of the lift pad 430 and the pedestal 140' while the lift pad and pedestal configuration 400 is in a process position for a first number of processing cycles, while the configuration 400 is in a rotation position, and while the configuration 400 is in a process position for a second number of processing cycles.

As shown, during the first number of processing cycles, the lift pad and pedestal configuration 400 is in the process position. In particular, both the lift pad 430 and the pedestal 140' have an angular orientation of 0 degrees with respect to coordinate system 950 in the chamber. Also, the lift pad 430 has a first angular orientation of 0 degrees with respect to the pedestal 140' (i.e., the pedestal 140' provides the coordinate system).

In addition, FIG. 9C illustrates the rotation of the lift pad 430 with respect to the pedestal 140', when the lift pad and pedestal configuration 400 are in the rotation position. In particular, the pedestal 140' remains static with an angular orientation of 0 degrees (e.g., with reference to the coordinate system 950), while the lift pad 430 is rotating from an angular orientation of 0 degrees to 180 degrees. That is, the pedestal 140' does not rotate. As shown, the lift pad 430 is midway through its orientation at an angular orientation of 71 degrees.

Further, during the second number of processing cycles, the lift pad and pedestal configuration 400 is again in the process position. However, because of the rotation of the lift pad, the pedestal 140' still has an angular orientation of 0 degrees with respect to coordinate system 950 in the chamber, and the lift pad has an angular orientation of 180 degrees. Put another way, when processing the first number of cycles, the lift pad 430 has an angular orientation of 0 degrees with reference to the pedestal 140', and when processing the second number of cycles, the lift pad 430 after rotation has an angular orientation of 180 degrees, for example, with reference to pedestal 140'.

Figure 10A:
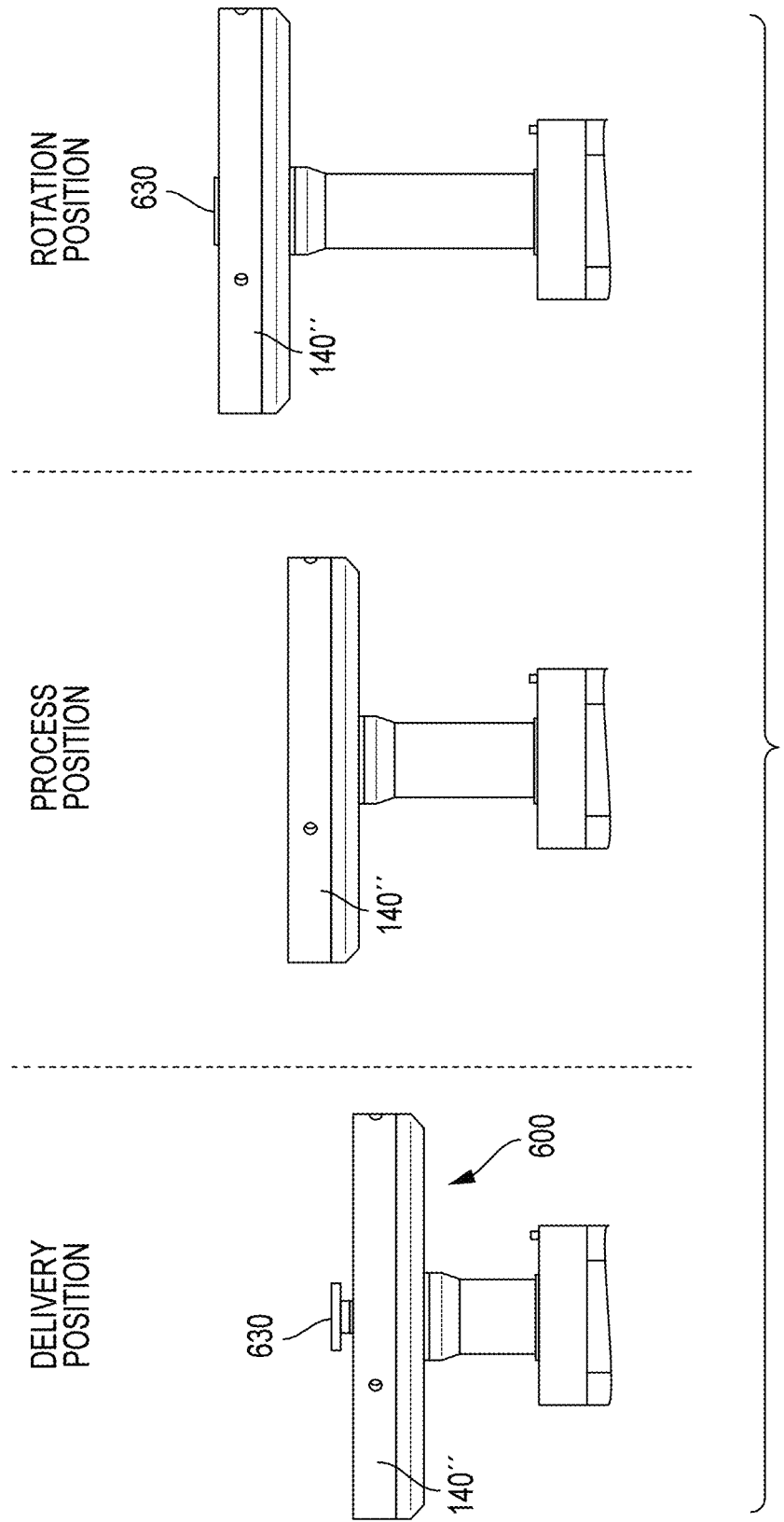
FIGS. 10A and 10B are diagrams illustrating the motion sequence of a lift pad and pedestal configuration, wherein the lift pad is smaller than a wafer, wherein the lift pad is configured to allow for delivery of the wafer (e.g., via an end-effector arm), and includes the rotation of the wafer without rotation of the pedestal within a process chamber during processing, which advantageously filters out both chamber and pedestal asymmetries, in accordance with one embodiment of the present disclosure.
Figure 10B:
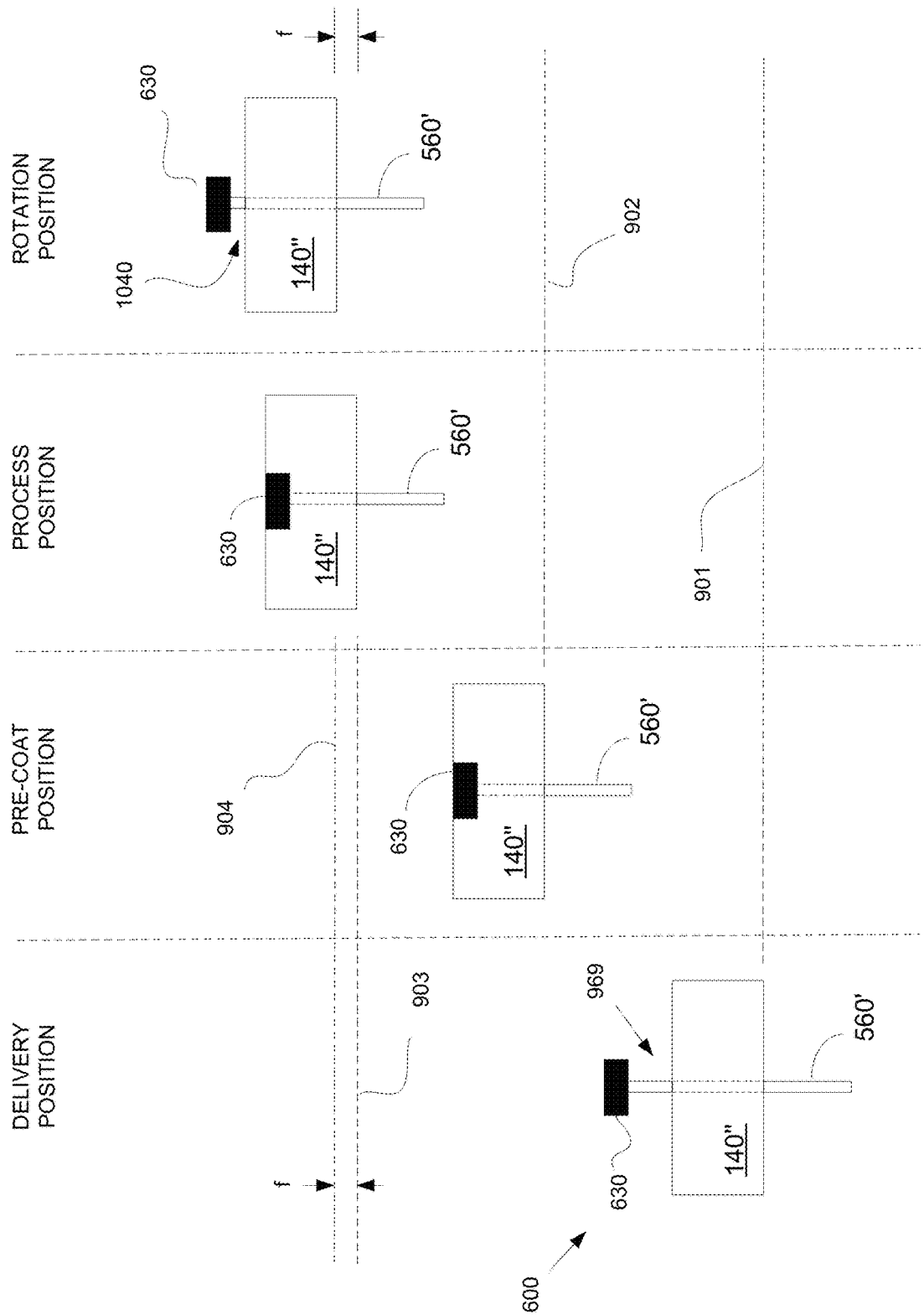
Figure 10C:
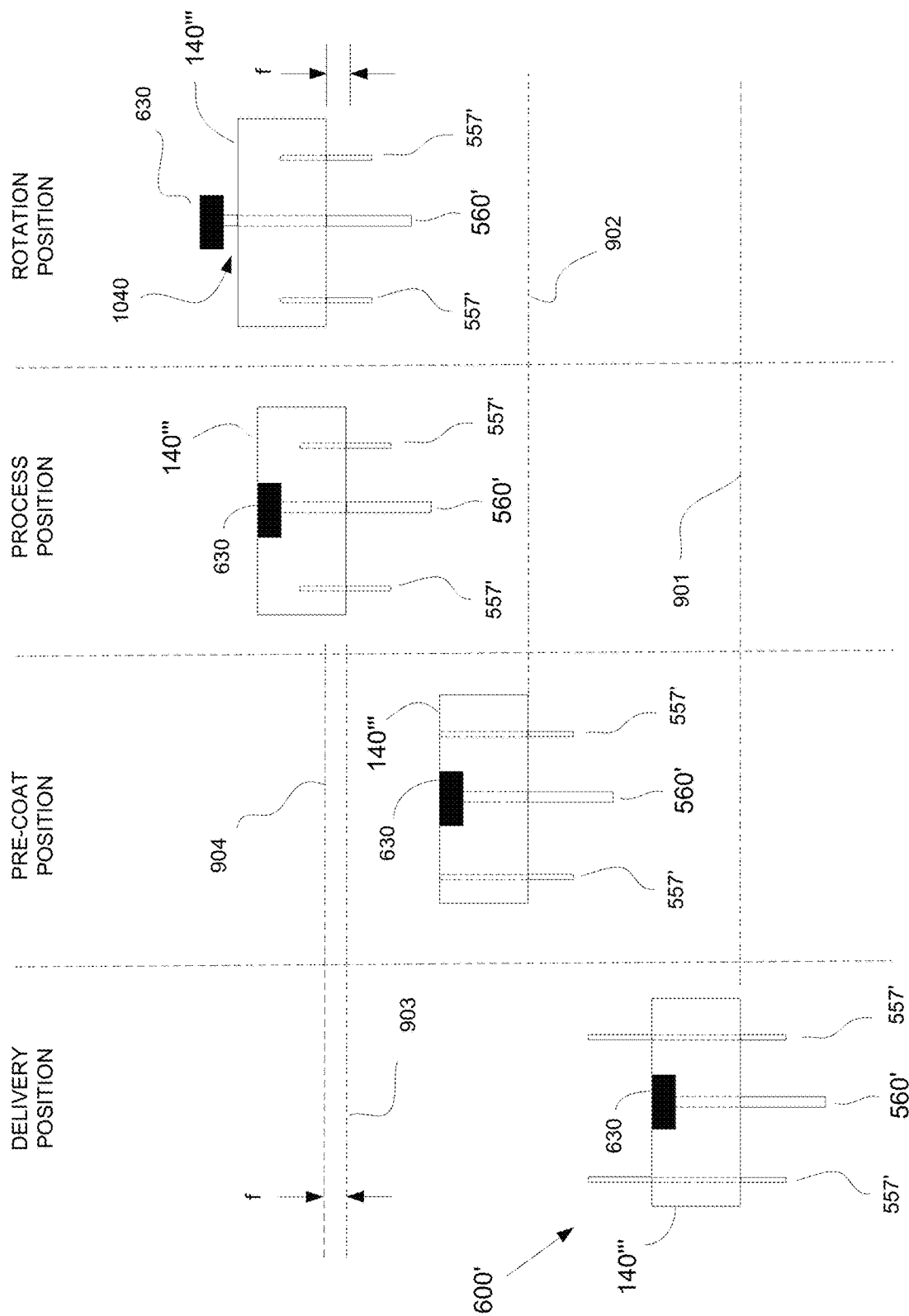
FIG. 10C is a diagram illustrating the motion sequence of a lift pad and pedestal configuration and including a lift pin assembly, wherein the lift pad is smaller than a wafer, and includes the rotation of the wafer without rotation of the pedestal within a process chamber during processing, which advantageously filters out both chamber and pedestal asymmetries, in accordance with one embodiment of the present disclosure.

FIGS. 10A-10C are diagrams illustrating the motion sequence of a lift pad and pedestal configuration, wherein the lift pad is smaller than a wafer, and includes the rotation of the wafer without rotation of the pedestal within a process chamber during processing, which advantageously filters out both chamber and pedestal asymmetries, in accordance with one embodiment of the present disclosure. More particularly, FIG. 10B shows a lift pad and pedestal configuration 600, first introduced in FIGS. 6 and 7A-7B. FIG. 10C shows a lift pad and pedestal configuration 600', first introduced in FIG. 7C, and additionally includes a lift pin assembly.

In particular, FIG. 10A shows the lift pad and pedestal configuration 600, that includes a pedestal 140" and lift pad 630. The lift pad and pedestal configuration 600 is configured such that the lift pad 630 provides the lifting action, and eliminates the need for a lift pin assembly. Specifically, in the delivery position, the lift pad and pedestal configuration 600 is configured such that the pedestal 140" is at a bottomwards position with the lift pad 630 separated from the pedestal 140" by a displacement large enough for entry of an end-effector arm. FIG. 10A also shows the lift pad and pedestal configuration 600 in the process position, wherein one or more films may be deposited (e.g., PECVD and ALD processes) during wafer processing in single-station and multi-station systems. FIG. 10A also shows the lift pad and pedestal configuration 600 in the rotation position, wherein the pedestal 140" is at an upwards position (e.g., topmost upwards position), and the lift pad 630 is separated from the pedestal 140" by a process rotation displacement (e.g., 1 mm).

FIG. 10B provides more details to FIG. 10A, and illustrate the motion sequence of the lift pad and pedestal configuration 600, wherein the lift pad is smaller than a wafer, and includes the rotation of the wafer without rotation of the pedestal within a process chamber during processing, which advantageously filters out both chamber and pedestal asymmetries, in accordance with one embodiment of the present disclosure.

In the delivery position of the lift pad and pedestal configuration, the bottom of pedestal 140" is at a level within the corresponding chamber indicated by line 901. In particular, the pedestal 140" is at its bottommost level, in one embodiment. In one embodiment, the delivery position is lower than the pre-coat position indicated by line 902, as well as the process position indicated by line 903, and the rotation position indicated by line 904. As shown, the lift pad 630 is separated from the lift pad 140" by a displacement 969 sufficient to allow an arm of an end-effector to deliver (place onto the lift pad 630, or remove wafer from the lift pad 630), as is shown in FIG. 10B. In one embodiment, a coupled mechanism raises the lift pad 630 when the pedestal 140" nears the bottom of its travel, such that the lift pad 630 is separated from the pedestal top surface by the displacement 969.

FIG. 10B also shows the lift pad and pedestal configuration 600 in the pre-coat position, wherein pre-coat and undercoat layers of the film are deposited in the process chamber before wafers are processed. In the pre-coat position, the bottom of the pedestal 140" is at a level within a corresponding chamber indicated by line 902, for example. The pre-coat position may be defined at any position within the chamber, and is not limited to the level indicated by line 902. As shown, the lift pad 630 rests upon the pedestal 140", as previously described.

In the process position of the lift pad and pedestal configuration 600, the bottom of pedestal 140" is at a level within the corresponding chamber indicated by line 903. In one embodiment, the pedestal 140" is near its topmost position or level in the chamber, though the process position may be at any level within the chamber depending on the chamber and/or processes implemented, as previously described. As shown, the lift pad 630 rests upon the pedestal 140". In addition, the lift pad 630 is in a first angular orientation in relation to the pedestal 140".

In the rotation position of the lift pad and pedestal configuration 600, the bottom of pedestal 140 is at a topmost level within the corresponding chamber indicated by line 904, in one embodiment. The lift pad 630 is separated from the pedestal 140" by a process rotation displacement 1040 (e.g., on the order of 1 mm). In one embodiment, a coupled mechanism raises the lift pad 630 via the pad shaft 560 when the pedestal 140" nears the top of its travel, such that the lift pad 630 is separated from the pedestal top surface by the rotation displacement 1040. In one embodiment, a coupled mechanism raises the lift pad 630 when the pedestal 1140" nears the top of its travel, such that the lift pad 630 is separated from the pedestal top surface by the rotation displacement 1040. For example, as the pedestal 140" reaches the top of its travel, over a certain distance "f" traveled by pedestal 140", the lift pad 630 moves by a greater distance that may be a factor of "f" (e.g., two times "f"). Thereafter, the lift pad 630 may be rotated from a first angular orientation to a second angular orientation (e.g., with respect to pedestal 140"), and then either returned to the process position for additional processing cycles, or returned to the delivery position for wafer delivery.

FIG. 10C provides more details to FIG. 10A, and illustrate the motion sequence of the lift pad and pedestal configuration 600' including a lift pin assembly, wherein the lift pad 630 is smaller than a wafer, and includes the rotation of the wafer without rotation of the pedestal 140''' within a process chamber during processing, which advantageously filters out both chamber and pedestal asymmetries, in accordance with one embodiment of the present disclosure. As previously described, lift pad and pedestal configuration 600' includes a lift pad 630, pedestal 140''' and lift pin assembly.

In the delivery position of the lift pad and pedestal configuration 600', the bottom of pedestal 140''' is at a level within the corresponding chamber indicated by line 901. In particular, the pedestal 140''' is at its bottommost level, in one embodiment. In one embodiment, the delivery position is lower than the pre-coat position indicated by line 902, as well as the process position indicated by line 903, and the rotation position indicated by line 904. As shown, the lift pad 630 rests upon pedestal 140''', as previously described. In addition, the lift pins 557' extend beyond the top surface of the pedestal 140''' and lift pad 630, in a position to receive a wafer that is delivered by an arm of an end-effector, or for removal of a wafer by the end-effector, for example.

FIG. 10C also shows the lift pad and pedestal configuration 600' in the pre-coat position, wherein pre-coat and undercoat layers of the film are deposited in the process chamber before wafers are processed. In the pre-coat position, the bottom of the pedestal 140''' is at a level within a corresponding chamber indicated by line 902, for example. The pre-coat position may be defined at any position within the chamber, and is not limited to the level indicated by line 902. As shown, the lift pad 630 rests upon the pedestal 140''', as previously described. In addition, the lift pins 857 are positioned such that the tops of the lift pins just fill the holes in the lift pad 830, which is an appropriate position during chamber pre-coat, when pre-coat deposition occurs, and no wafer is on the lift pad and pedestal configuration.

In the process position of the lift pad and pedestal configuration 600', the bottom of pedestal 140''' is at a level within the corresponding chamber indicated by line 903. As shown, the pedestal 140''' is near its topmost position or level in the chamber, though the process position may be at any level within the chamber, as previously described. As shown, the lift pad 630 rests upon the pedestal 140''', as previously described. In addition, the lift pins 557' are positioned such that the tops of the lift pins are within the pedestal 140''', though the tops may also be positioned anywhere within the pedestal 140'''.

In the rotation position of the lift pad and pedestal configuration 600', the bottom of pedestal 140''' is at a topmost level within the corresponding chamber indicated by line 904, in one embodiment. The lift pad 630 is separated from the pedestal 140''' by a process rotation displacement 1040 (e.g., on the order of 1 mm). In one embodiment, a coupled mechanism raises the lift pad 630 via the pad shaft 560' when the pedestal 140''' nears the top of its travel, such that the lift pad 630 is separated from the pedestal top surface by the rotation displacement 1040. In one embodiment, a coupled mechanism raises the lift pad 630 when the pedestal 140''' nears the top of its travel, such that the lift pad 630 is separated from the pedestal top surface by the rotation displacement 1040. For example, as the pedestal 140''' reaches the top of its travel, over a certain distance "f" traveled by pedestal 140''', the lift pad 630 moves by a greater distance that may be a factor of "f" (e.g., two times "f"). Thereafter, the lift pad 630 may be rotated from a first angular orientation to a second angular orientation (e.g., with respect to pedestal 140'''), and then either returned to the process position for additional processing cycles, or returned to the delivery position for wafer delivery.

Figure 10D:
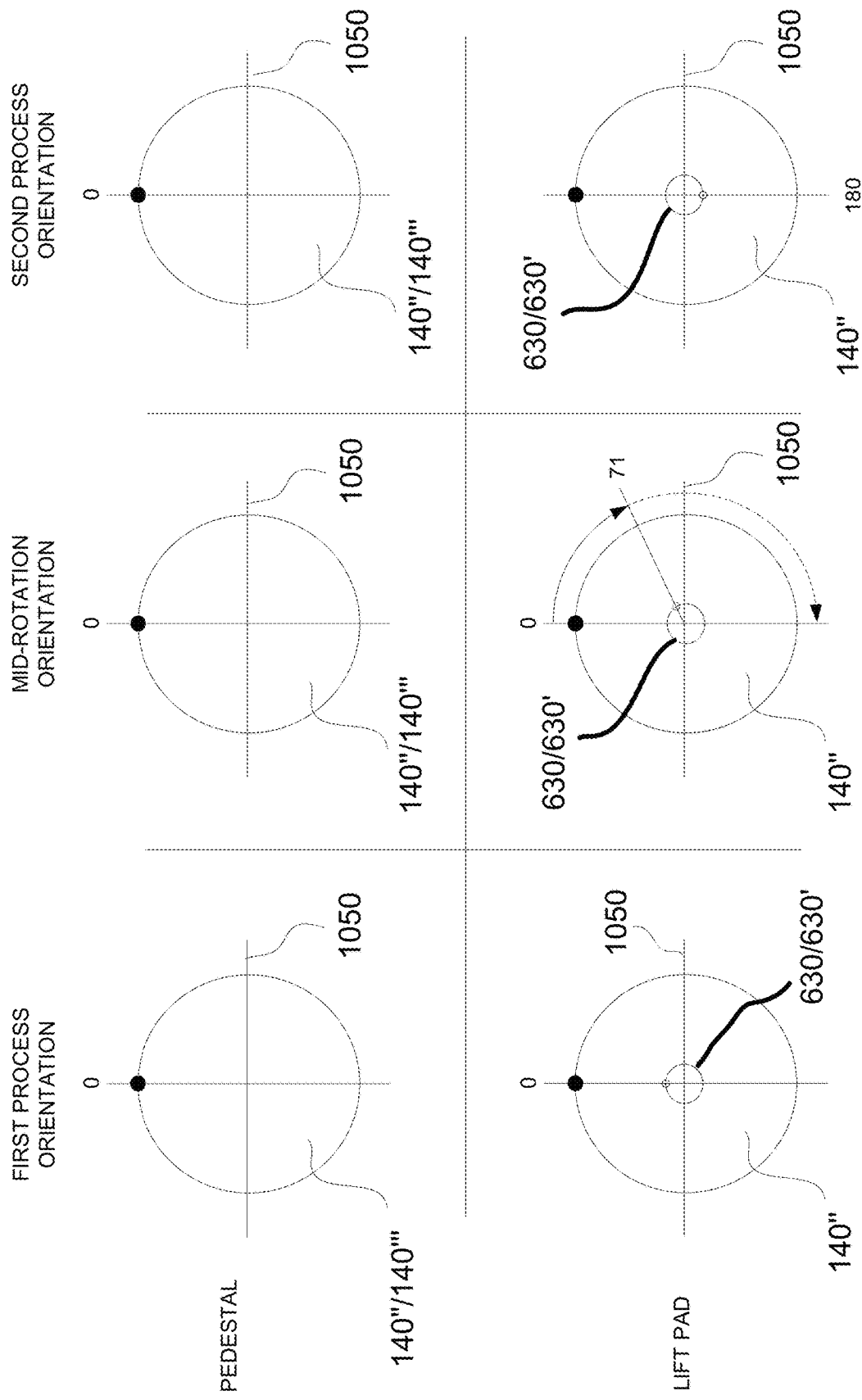
FIG. 10D is a diagram illustrating the orientation of a lift pad with respect to a pedestal in a lift pad and pedestal configuration, wherein the lift pad is smaller than a wafer, during a first process sequence, a rotation sequence, and a second process sequence, in accordance with one embodiment of the present disclosure.

FIG. 10D is a diagram illustrating the orientation of a lift pad 630 with respect to a pedestal 140" in a lift pad and pedestal configuration 600, or with respect to a pedestal 140''' in a lift pad and pedestal configuration 600', wherein the lift pad 630 is smaller than a wafer, during a first process sequence, a rotation sequence, and a second process sequence, in accordance with one embodiment of the present disclosure. In particular, FIG. 10D illustrates the relative orientations (e.g., with respect to each other and/or with respect to a coordinate system 1050 within a chamber) of the lift pad 630 and the pedestal 140"/pedestal 140''' while the lift pad and pedestal configuration 600/600' is in a process position for a first number of processing cycles, while in a rotation position, or a process position for a second number of processing cycles.

As shown, during the first number of processing cycles, the lift pad and pedestal configuration 600/600' is in the process position. In particular, both the lift pad 630 and the pedestal 140"/140'" have an angular orientation of 0 degrees with respect to coordinate system 1050 in the chamber. Also, the lift pad 630 has a first angular orientation of 0 degrees with respect to the pedestal 140"/140'" (i.e., the pedestal 140"/140'" provides the coordinate system).

In addition, FIG. 10D illustrates the rotation of the lift pad 630 with respect to the pedestal 140"/140'", when the lift pad and pedestal configuration 600/600' are in the rotation position. In particular, the pedestal 140"/140'" remains static with an angular orientation of 0 degrees (e.g., with reference to the coordinate system 1050), while the lift pad 630 is rotating from an angular orientation of 0 degrees to 180 degrees. That is, the pedestals 140" and 140'" do not rotate. As shown, the lift pad 630 is midway through its orientation at an angular orientation of 71 degrees.

Further, during the second number of processing cycles, the lift pad and pedestal configuration 600/600' is again in the process position. However, because of the rotation of the lift pad, the pedestal 140"/140'" still has an angular orientation of 0 degrees with respect to coordinate system 1050 in the chamber, and the lift pad has an angular orientation of 180 degrees. Put another way, when processing the first number of cycles, the lift pad 630 has an angular orientation of 0 degrees with reference to the pedestal 140"/140'", and when processing the second number of cycles, the lift pad 630 after rotation has an angular orientation of 180 degrees, for example, with reference to pedestal 140"/140'".

Lift Pad Raising Mechanism

The lift pad raising mechanisms disclosed in FIGS. 11-17 apply generally to the lift pad and pedestal configurations previously introduced in FIGS. 1-10, in embodiments of the present disclosure. That is, the various embodiments of the lift pad raising mechanisms disclosed can be implemented for lift pad separation from a pedestal in a lift pad and pedestal configuration that includes a lift pad with a diameter that is sized approximately to the diameter of a wafer and/or a lift pad with a diameter that is smaller than the diameter of a wafer.

Figure 11A:
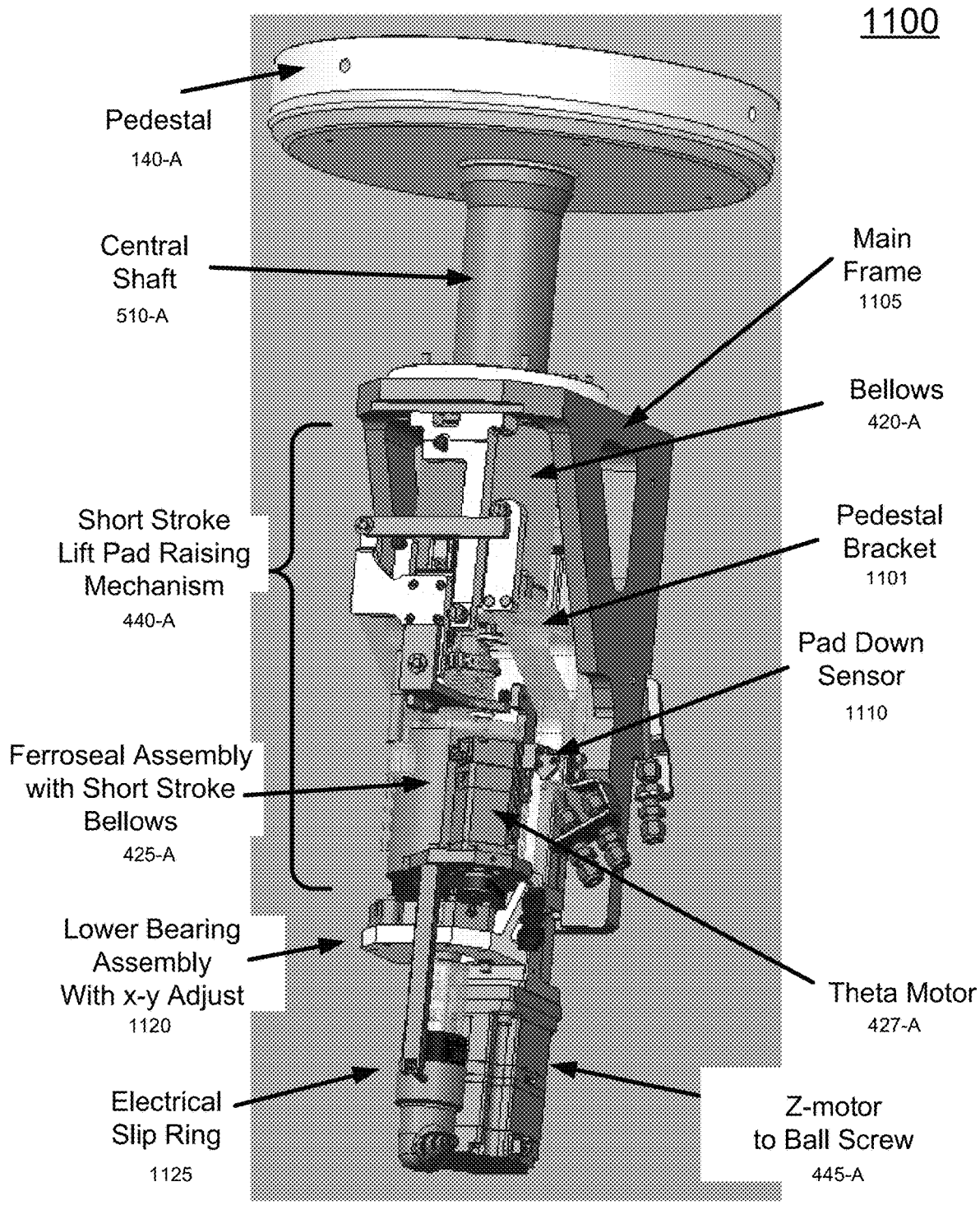
FIG. 11A is a perspective view of a substrate processing system including a lift pad and pedestal configuration, and illustrating a short stroke lift pad raising mechanism, wherein the lift pad may be substantially similar in size to a wafer or is smaller than a wafer, in accordance with one embodiment of the present disclosure.

FIG. 11A is a perspective view of a substrate processing system including a lift pad and pedestal configuration 1100, and illustrates a short stroke pad raising mechanism 440-A configured to separate a lift pad (not shown) from a pedestal 140-A, in accordance with one embodiment of the present disclosure. The lift pad and pedestal configuration 1100 is located within a main frame 1105, wherein the main frame 1105 is placed into a processing chamber (e.g., fixed within the processing chamber). Movement of the pedestal 140-A is provided with respect to the main frame, and movement of the lift pad is provided with respect to both the main frame 1105 (moves with the pedestal 140-A) and pedestal 140-A (separates from the pedestal 140-A). Lift pad separation from the pedestal 1140-A may be enabled for purposes of rotating the lift pad (and wafer disposed thereon) with respect to the pedestal 140-A. Lift pad separation may also be enabled for purposes of allowing access by an end-effector for wafer delivery (e.g., placement or removal of wafer from lift pad).

The lift pad and pedestal configuration 1100 including the short stroke pad raising mechanism 440-A is configurable for supporting a lift pad that is substantially similar in size to a wafer (e.g., substantially similar diameter sizes for the lift pad and wafer), such as the lift pad and pedestal configurations shown in FIGS. 4, 5A-5C, and 9A-9C, in embodiments. In addition, the lift pad and pedestal configuration 1100 including the short stroke pad raising mechanism 440-A is configurable for supporting a lift pad that is smaller than a wafer (e.g., diameter of the lift pad is smaller than the diameter of a wafer), such as the lift pad and pedestal configurations shown in FIGS. 6, 7A-F, and 10A-1010D, in accordance with embodiments of the present disclosure. In some embodiments, the lift pad and pedestal configuration 1100 allows for integration with a carrier ring assembly (not shown). In still other embodiments, the lift pad and pedestal configuration 1100 may be implemented within single-station and/or multi-station processing tools.

Pedestal 140-A of the lift pad and pedestal configuration 1100 may be controlled by pedestal control 450 of FIGS. 4 and 6, such that movement of pedestal 140-A is implemented through pedestal and lift pad actuator 515 of FIG. 5B and/or pedestal and lift pad actuator 515' of FIGS. 7B-7C. In particular, the central shaft 510-A is interconnected to pedestal 140-A and to the pedestal bracket 1101, such that movement of the pedestal bracket with respect to the main frame 1105 translates to movement of the pedestal 140-A. For example, the pedestal control 450 controls movement of the pedestal bracket in order to induce movement in the pedestal 140-A (e.g., up and down a central axis 471-A shown in FIG. 14C) via the central shaft 510-A during pre-processing, processing, and post-processing sequences. In particular, Z-motor 445-A is configured to drive a ball screw (not shown)(e.g., ball screw 443 of FIG. 4), which is interconnected to a slide/carrier (not shown) via a ball screw nut, such that rotation of the ball screw translates to motion (e.g., in a z-direction) of the carrier in parallel to the central axis 471-A. The Z-motor 445-A and ball screw (and other corollary components) remain fixed in relation to the main frame 1105, such that movement of the carrier is with respect to the main frame 1105. In addition, the pedestal bracket 1101 is interconnected to the carrier, such that movement of the carrier translates to movement of the pedestal bracket 1101. Bellows 420-A facilitates movement of the pedestal 140-A.

The lift pad of the lift pad and pedestal configuration 1100 may be controlled by lift pad control 455 of FIGS. 4 and 6, such that movement of the lift pad is implemented through pedestal and lift pad actuator 515 of FIG. 5B and/or the pedestal and lift pad actuator 515' of FIGS. 7B-7C. In particular, lift pad control 455 controls movement of the lift pad shaft 560-A to induce movement in the lift pad. In particular, a pad shaft 560-A extends from the lift pad along the central axis 471-A, as shown in FIG. 13C. For example, the pad shaft 560-A is interconnected to the ferroseal assembly 425-A, which is interconnected to the pedestal bracket through the short stroke lift pad raising mechanism 440-A. The raising mechanism 440-A was first introduced in FIG. 4, and further shown in FIG. 7A, as the short stroke coupling mechanism 440 that is configured to provide movement of the lift pad in relation to the pedestal 140-A. The ferroseal assembly 425-A is movably attached to the pedestal bracket 1101 through the short stroke pad lift mechanism 440-A. As such, movement of the pedestal bracket 1101 translates into movement of the pedestal 140-A and lift pad in combination, as previously described. In particular, movement of the pedestal bracket 1101 without engaging the short stroke lift pad raising mechanism 440-A provides for movement of the pedestal 140-A and lift pad, such that no separation occurs between the lift pad and pedestal 140-A. When the lift pad raising mechanism 440-A is engaged, an additional movement is made by the lift pad with respect to the pedestal 140-A to induce separation. Ferroseal assembly 425-A includes a short stroke bellows configured to facilitate movement of the lift pad via a pad shaft. The ferroseal assembly 425-A is configured to provide a vacuum seal about the pad shaft, while the pad shaft 560-A is rotating and while the pad shaft 560-A is not rotating.

Further, the ferroseal assembly 425-A facilitates rotation of the lift pad shaft 560-A contained therein in a vacuum environment. For example, the ferroseal assembly 425-A includes a rotation/theta motor 427-A in a belt-pulley arrangement configured for rotation of the lift pad shaft 560-A, and correspondingly rotation of the lift pad with respect to the pedestal 140-A. The electrical slip ring 1125 is configured to provide for transmission of power and/or electrical signals through the lift pad shaft 560-A which is configured for rotation.

In addition, the lift pad and pedestal configuration 1100 includes an upper bearing assembly 755-A (first introduced in FIG. 7D as high temperature bearing 755, and discussed more fully in relation to FIGS. 16-17), and a lower bearing assembly 1120. The upper bearing assembly 755-A and lower bearing assembly 1120 are configured to center the lift pad shaft 560-A within the central shaft 510-A.

Figure 11B:
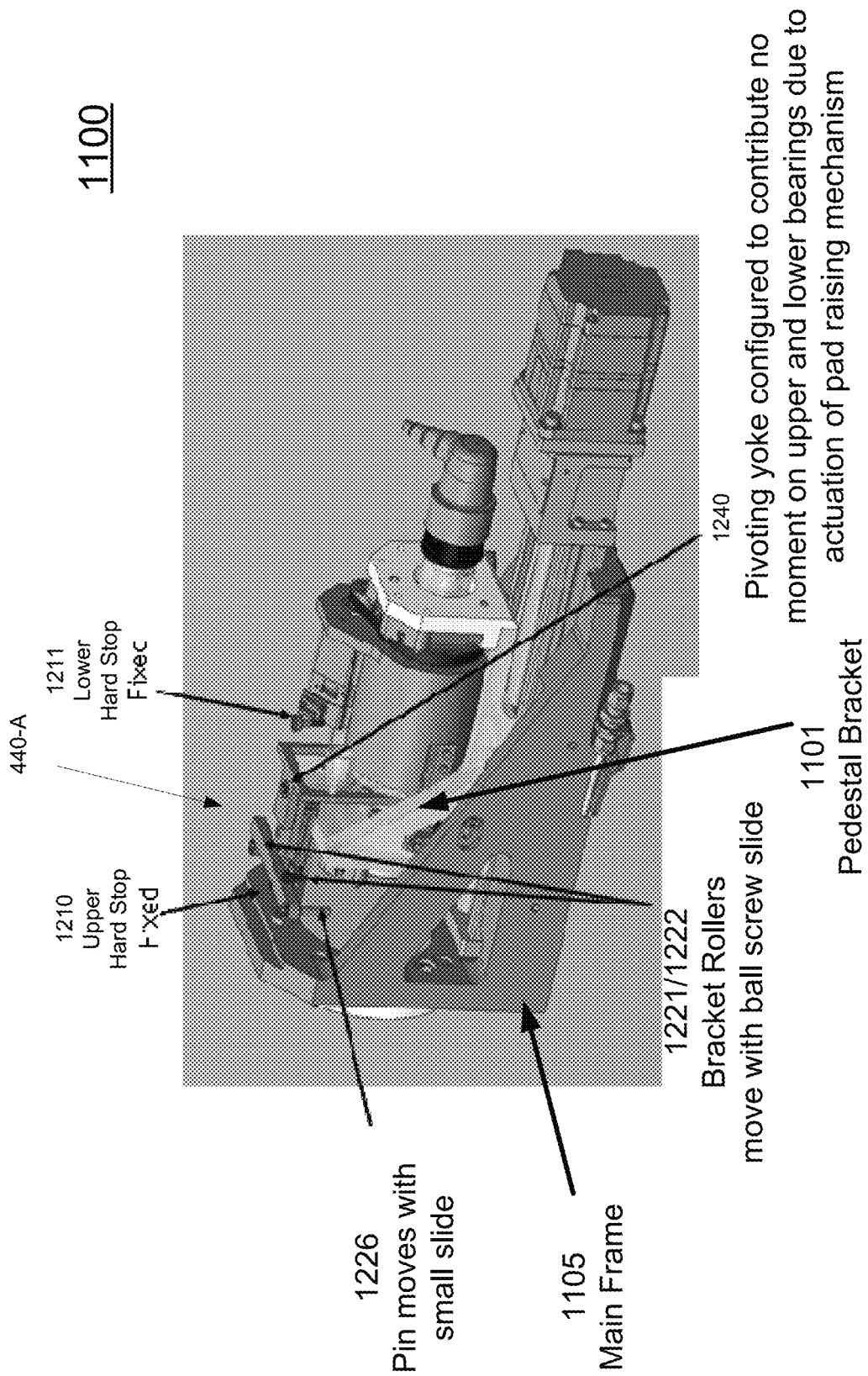
FIG. 11B is a perspective view of the substrate processing system of FIG. 11A including a lift pad and pedestal configuration, and illustrating components of the short stroke lift pad raising mechanism, in accordance with one embodiment of the present disclosure.

FIG. 11B is a perspective view of the substrate processing system of FIG. 11A including a lift pad and pedestal configuration 1100, and further illustrates components of the short stroke pad raising mechanism 440-A, in accordance with one embodiment of the present disclosure. In particular, the pad raising mechanism 440-A includes upper hard stop 1210 and lower hard stop 1211, both of which are fixed in relation to the main frame 1105. Bracket rollers 1221 and 1222 are fixed in relation to the pedestal bracket, such that movement of the slide/carriage (not shown) in the Z-direction, which is interconnected to the ball screw (not shown), is translated to corresponding movement of the bracket rollers 1221 and 1222 in the Z-direction. The movement of the short stroke pad raising mechanism 440-A is more fully described in relation to FIGS. 11C, and 12-13.

The short stroke pad raising mechanism 440-A when not engaged is in a neutral position, and is configured to provide simultaneous movement of the pedestal 140-A and lift pad, such that no separation occurs between the lift pad and pedestal 140-A. In the neutral position, the upper hard stop 1210 and lower hard stop 1211 are not engaged (e.g., with lever 1225), and lever 1225 is loosely constrained between bracket rollers 1221 and 1222.

On the other hand, when the lift pad raising mechanism 440-A is engaged, an additional movement is made by the lift pad with respect to the pedestal 140-A to induce separation between the lift pad and the pedestal 140-A. In particular, lever 1225 engages with the upper hard stop 1210 to induce movement of the lift pad in relation to the pedestal 140-A, thereby providing for rotation of the lift pad with respect to the pedestal 140-A. Also, lever, 1225 engages with the lower hard stop 1211 to induce movement of the lift pad in relation to pedestal 140-A, to allow entry of an end-effector for purposes of wafer delivery. In addition, the pivoting yoke 1240 is configured to offset and/or cancel the moment placed on the upper and lower bearings of the pad shaft 560-A due to actuation of the lift pad raising mechanism 440-A. More particularly, the lift pad raising mechanism 440-A is configured for repeated separation of the lift pad with respect to the pedestal 140-A in a manner to maximize the life of respective components. For example, without any moment offset or cancellation, the bearing assemblies (e.g., high temperature bearing 755-B) on the pad shaft 560-A would fail prematurely. As such, the various yoke assemblies implemented within the lift pad raising mechanism 440-A are configured to offset and/or cancel a moment placed on the bearing of the pad shaft 560-A due to the raising of the lift pad in order to minimize wear.

Figure 12A:
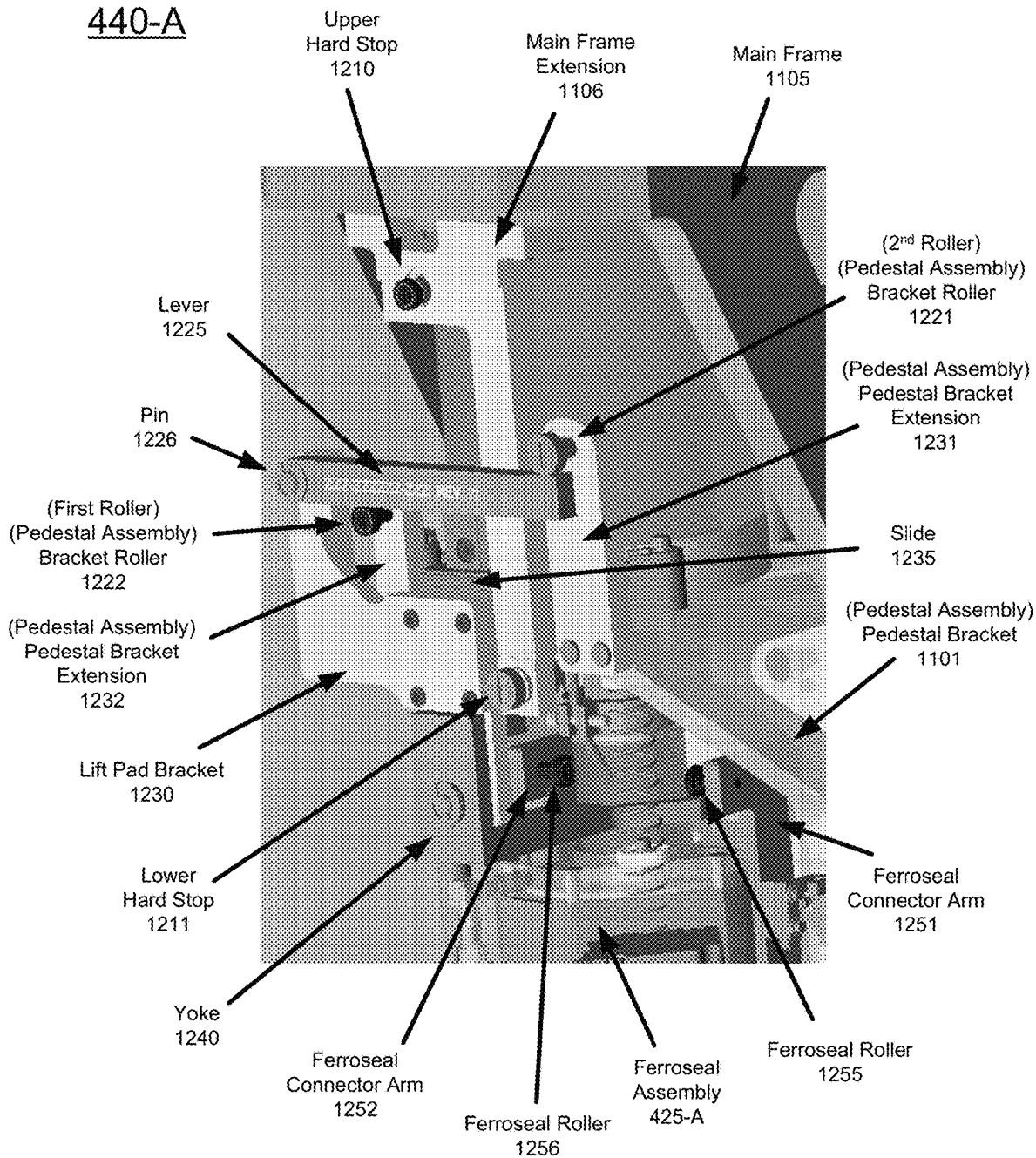
FIG. 12A is a perspective view of a lift pad raising mechanism of a substrate processing system including a lift pad and pedestal configuration of FIGS. 11A-11B, in accordance with one embodiment of the present disclosure.

FIG. 12A is a perspective view of a short stroke lift pad raising mechanism 440A of a substrate processing system including a lift pad and pedestal configuration 1100 of FIGS. 11A-11B, in accordance with one embodiment of the present disclosure. The lift pad and pedestal configuration 1100 including the short stroke pad raising mechanism 440-A is configurable for supporting a lift pad that is substantially similar in size (e.g., diameter) to a wafer, or for a lift pad that is smaller in size (e.g., diameter) to a wafer.

The lift pad raising mechanism 440A shown in FIG. 12A is configured for raising the lift pad for rotation with respect to the pedestal 140-A through engagement with the upper hard stop 1210, and for raising the lift pad for entry of an end-effector with respect to the pedestal 140-A through engagement with the lower hard stop 1211, in one embodiment. In other embodiments, the lift pad and pedestal configuration 1100 may be modified to provide either one of the lift pad raising motions provided by the short stroke lift pad raising mechanism 440A. For example, the lift pad raising mechanism 440A may be modified to include only the upper hard stop 1210 providing for raising the lift pad for rotation with respect to the pedestal 140-A through. In that case, a lift pin assembly may be configured within lift pad and pedestal configuration 1100 to allow for end-effector entry.

As shown in FIG. 12A, the lift pad and pedestal configuration 1100 is located within a main frame 1105, wherein the main frame 1105 is placed into a processing chamber (e.g., fixed within the processing chamber). The upper hard stop 1210 and lower hard stop 1211 are fixed in relation to the main frame 1105. For example, upper hard stop 1210 may be affixed directly to main frame 1105, or through one or more intervening components. In particular, main frame extension 1106 is attached to main frame 1105, and both upper hard stop 1210 and lower hard stop 1211 are attached to main frame extension 1106. In that manner, upper hard stop 1210 and lower hard stop 1211 does not move in relation to the main frame 1105.

The lift pad and pedestal configuration 1100 includes a pedestal bracket 1101 is moveably interconnected to the main frame 1105 through a slide/carriage and ball screw/Z-motor 445-A arrangement, as previously described. For example, the pedestal bracket 1101 is attached to the central shaft 510-A of the pedestal 140-A (e.g., through bellows 420-A), such that any movement in the pedestal bracket 1101 induced by the actuation of the ball screw/Z-motor 445-A arrangement is translated to movement in the pedestal 140-A. In addition, slide 1235 is fixed in relation to pedestal bracket 1101. In that manner, slide 1235 moves with the pedestal bracket 1101 in the same linear z-direction.

Pedestal bracket extensions 1231/1232 are fixed in relation to the pedestal bracket 1101. For example, pedestal bracket extensions 1231/1232 may be directly attached to pedestal bracket 1101. In addition, bracket roller 1221 is attached to pedestal bracket extension 1231. Also, bracket roller 1222 is attached to pedestal bracket extension 1232. In that manner, bracket rollers 1221/1222 move with the pedestal bracket 1101 in the same linear z-direction.

The lift pad and pedestal configuration 1100 includes a lift pad bracket 1230 that is moveably attached to slide 1235. Because slide 1235 is fixed in relation to pedestal bracket 1101, any movement in the pedestal bracket 1101 is translated into the same movement of slide 1235 in the linear z-direction. In addition, because lift pad bracket 1230 is moveably attached to slide 1235, the lift pad bracket 1230 may have an additional movement with respect to the pedestal bracket 1101 (e.g., to induce separation of the lift pad from the pedestal 140-A). The interface between pedestal bracket 1101, slide 1235, and lift pad bracket 1230 is more fully described in relation to FIG. 13.

The lift pad and pedestal configuration 1100 includes yoke 1240, which is rotatably attached to lift pad bracket 1230. Yoke 1240 interfaces with the ferroseal assembly 425-A through rollers 1255/1256 when the short stroke lift pad raising mechanism 440-A is engaged (e.g., lever 1225 engages with the upper hard stop 1210 or lower hard stop 1211). The ferroseal assembly 425-A, first introduced in FIGS. 4 and 6, includes connector arms 1251/1252 that are located on opposing sides of the ferroseal assembly 425-A. Roller 1255 is attached to an end of connector arm 1251, and roller 1256 is attached to an end of connector arm 1252, such that rollers 1255/1256 are located on opposing sides of the ferroseal assembly 425-A. Yoke 1240 is configured to offset and/or cancel a moment placed on the pad shaft 560-A when the pad raising mechanism 440-A is actuated to separate the lift pad from the pedestal 140-A. The interface between the yoke and ferroseal assembly 425-A is more fully described in relation to FIG. 13.

The lift pad and pedestal configuration 1100 includes lever 1225, which is rotatably attached to lift pad bracket 1230 through pin 1226. As such, any movement in pin 1226 will translate into a similar movement of the ferroseal assembly 425-A with respect to the pedestal 140-A and pedestal bracket 1101. For example, pin 1226 movement is induced through engagement between lever 1225 with either upper hard stop 1210 or lower hard stop 1211. Correspondingly, any movement in pin 1226 translates to similar movement of pad shaft 560-A and attached lift pad with respect to pedestal 140-A. The interface between the pin 1226, lever 1225, lift pad bracket 1230, ferroseal assembly 425-A, pad shaft 560-A will be more fully described in relation to FIGS. 13 and 14A-14-D.

Figure 12B:
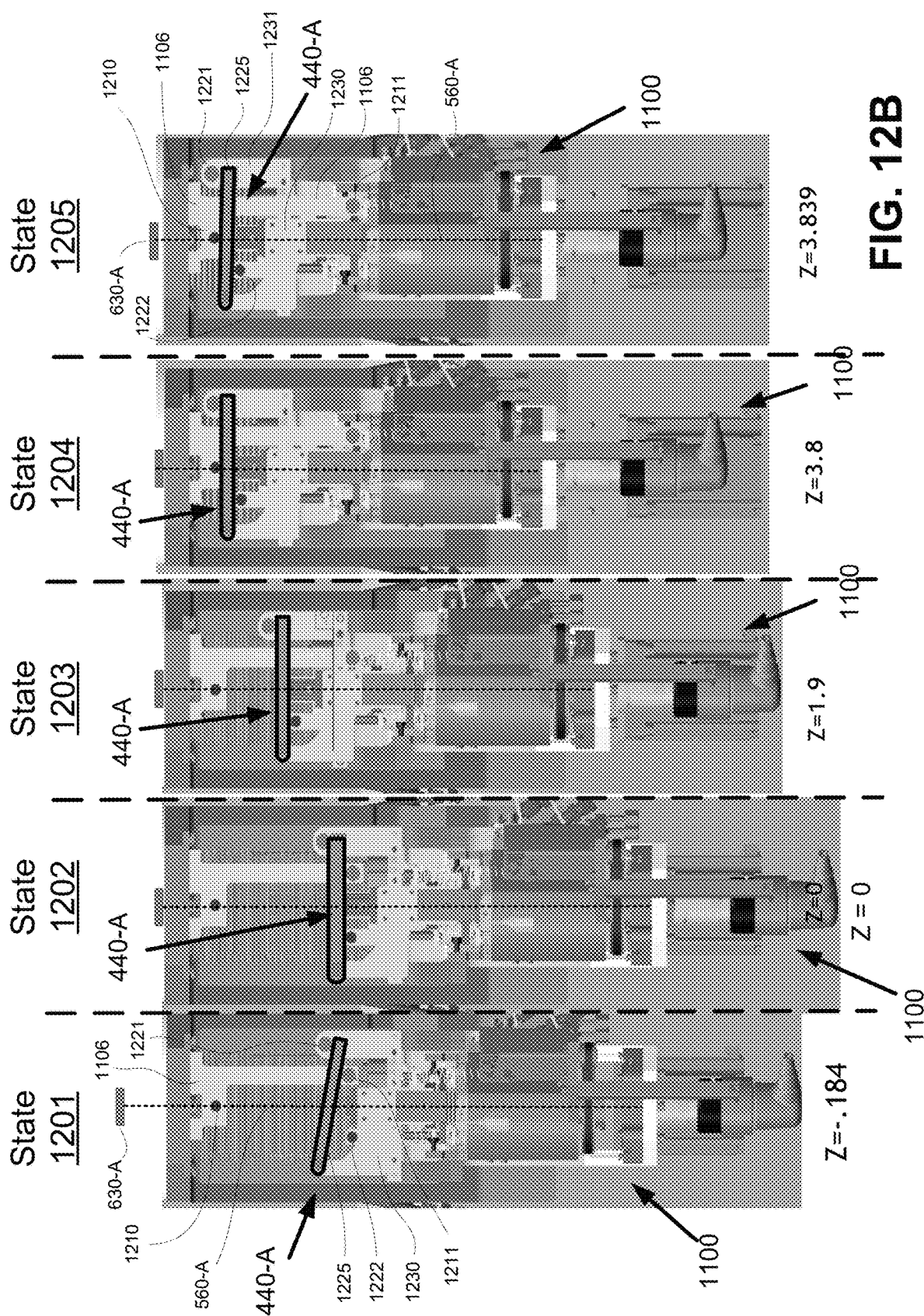
FIG. 12B is a diagram illustrating the motion sequence of a short stroke pad raising mechanism of a lift pad and pedestal configuration of FIGS. 11A-11B, and illustrates the raising of the lift pad through an upwards movement of the pedestal to accommodate rotation of the lift pad, and the raising of the lift pad through a downwards movement of the pedestal to facilitate entry of an end-effector for wafer delivery, in accordance with one embodiment of the present disclosure.

FIG. 12B is a diagram illustrating the motion sequence of the short stroke pad raising mechanism 440-A of the lift pad and pedestal configuration 1100 of FIGS. 11A-11B and 12A, in accordance with one embodiment of the present disclosure. The short stroke pad raising mechanism 440-A may be implemented in a lift pad and pedestal configuration 1100 where the diameter of the lift pad is smaller than the diameter of a wafer, such that the lift pad may be lifted to allow for rotation of the lift pad in relation to the pedestal 140-A, and also provide for lifting of the lift pad to allow for entry of an end-effector for purposes of wafer delivery, in one embodiment. Also, the short stroke pad raising mechanism 440-A may be implemented in a lift pad and pedestal configuration 1100 where the diameter of the lift pad is approximately the same size as the diameter of a wafer, such that the lift pad may be lifted to allow for rotation of the lift pad in relation to the pedestal 140-A, in another embodiment. In that case, wafer deliver may be accomplished through a lift pin assembly.

The lift pad and pedestal configuration 1100 is shown in state 1203, wherein the short stroke lift pad raising mechanism 440-A is in a neutral state. The short stroke pad raising mechanism 440-A when not engaged is in a neutral position, and is configured to provide simultaneous movement of the pedestal 140-A and lift pad, wherein the lift pad rests upon the pedestal 140-A with a pedestal referencing force (e.g., approximately 1 pound during processing, and approximately 15 pounds when chamber is at atmosphere) such that no separation occurs between the lift pad and pedestal 140-A. For example, the pedestal referencing force is applied in part through the weight of the pad shaft 560-A, and ferroseal assembly 425-A, and the springs (e.g., force applied through their spring constants), such that the lift pad is constantly referencing the pedestal 140-A when the pad raising mechanism 440-A is in a neutral state. Springs 1411 are used to compensate for and/or cancel any moment induced by the theta motor 427-A acting on the pad shaft 560-A because the theta motor 427-A is offset from the pad shaft 560-A.

More particularly, when the pad raising mechanism 440-A is in a neutral state, lever 1225 that is rotationally attached to pin 1226 is not engaged with either the upper hard stop 1210 or lower hard stop 1211, both of which are fixed in relation to the main frame 1105. That is, lever 1225 is loosely constrained between bracket rollers 1221 and 1222, both of which are fixed in relation to the pedestal bracket 1101, and also move with the slide/carrier movably attached to the ball screw. As such, pin 1226 moves with the pedestal bracket 1101 when the short stroke pad raising mechanism 440-A is in a neutral position, and any movement in the pedestal bracket 1101 through actuation of the Z-motor 445-A and ball screw translates into simultaneous movement of the pedestal 140-A and lift pad. For example, as the pedestal 140-A moves with the pedestal bracket 1101 that is attached to the slide/carrier in response to the ball screw, the lift pad moves with the pedestal 140-A because the lift pad is resting on the pedestal.

On the other hand, when the lift pad raising mechanism 440-A is engaged, an additional movement is made by the lift pad with respect to the pedestal 140-A to induce separation between the lift pad and the pedestal 140-A. In particular, states 1204 and 1205 of the lift pad and pedestal configuration 1100 show the engagement of the upper hard stop 1210 (e.g., roller), which separates the lift pad from pedestal 140-A to allow for rotation of the lift pad. States 1201 and 1202 of the lift pad and pedestal configuration 1100 show the engagement of the lower hard stop 1211 (e.g., roller), which separates the lift pad from pedestal 140-A to allow for entry of an end-effector arm for purposes of wafer delivery.

In state 1204 of the lift pad and pedestal configuration 1100, the short stroke lift pad raising mechanism 440-A is beginning to engage with the upper hard stop 1210. Specifically, pedestal bracket 1101 is nearing its topmost travel upwards in the z-direction. As shown, the lift pad and pedestal configuration 1100 is near its topmost position when traveling upwards in the z-direction with respect to the main frame 1105. That is, lever 1225 is beginning to engage with the upper hard stop 1210 as the pedestal 140-A and pedestal bracket 1101 are moving upwards (e.g., pedestal 140-A is near its topmost position). As such, the pad raising mechanism 440-A is about to or is beginning to leave the neutral state.

In state 1205, the lift pad and pedestal configuration 1100 is configured to raise the lift pad (e.g., approximately 1 mm) to create separation between the lift pad and pedestal 140-A through an upwards movement of the pedestal to accommodate rotation of the lift pad through actuation of the short stroke pad raising mechanism 440-A. In particular, the short stroke lift pad raising mechanism 440-A is fully engaged with the upper hard stop 1210. That is, the pedestal 140-A and pedestal bracket 1101 continues to move upwards until the pedestal bracket 1101 reaches its topmost position. In that case, lever 1225 is fully engaged with the upper hard stop 1210, and lever 1225 is fully rotated about pin 1226. That is, a downward force is applied to lever 1225 by upper hard stop 1210, and an upward force is applied to lever 1225 by bracket roller 1222 to induce rotation (e.g., clockwise) of lever 1225 about pin 1226. Because the lever is rotationally fixed to pin 1226 and pin is moveably attached to slide 1235 (fixed in relation to pedestal bracket 1101), the rotation of lever 1225 translates to a linear motion (z-direction) in the pin 1226 with respect to the pedestal 140-A and pedestal bracket 1101. Also, because the resulting force (from lever interaction with the upper hard stop 1210 and bracket roller 1222) is relatively close to the pin 1226, the linear motion in pin 1226 is small (e.g., approximately 1 mm). Further, a linear motion in pin 1226 translates into a linear motion of the pad shaft 560-A through interaction with yoke 1240 and ferroseal assembly 425-A to create separation between the lift pad and pedestal 140-A, as will be described more fully in relation to FIGS. 14A-14D.

In state 1201 of the lift pad and pedestal configuration 1100, the short stroke lift pad raising mechanism 440-A is beginning to engage with the lower hard stop 1211. Specifically, pedestal bracket 1101 is nearing its bottommost travel downwards in the z-direction. As shown, the lift pad and pedestal configuration 1100 is near its bottommost position when traveling downwards in the z-direction with respect to the main frame 1105. That is, lever 1225 is beginning to engage with the lower hard stop 1211 as the pedestal 140-A and pedestal bracket 1101 are moving downwards (e.g., pedestal 140-A is near its bottommost position). As such, the pad raising mechanism 440-A is about to or is beginning to leave the neutral state.

In state 1202, the lift pad and pedestal configuration 1100 is configured to raise the lift pad (e.g., approximately 14-18 mm) to create separation between the lift pad and pedestal 140-A through a downwards movement of the pedestal to facilitate entry of an end-effector for wafer delivery through actuation of the short stroke pad raising mechanism 440-A. In particular, the short stroke lift pad raising mechanism 440-A is fully engaged with the lower hard stop 1211. That is, the pedestal 140-A and pedestal bracket 1101 continues to move downwards until the pedestal bracket 1101 reaches its bottommost position. In that case, lever 1225 is fully engaged with the lower hard stop 1211, and lever 1225 is fully rotated about pin 1226. That is, an upward force is applied to lever 1225 by lower hard stop 1211, and a downward force is applied to lever 1225 by bracket roller 1221 to induce rotation (e.g., clockwise) of lever 1225 about pin 1226. Because the lever is rotationally fixed to pin 1226 and pin is moveably attached to slide 1235 (fixed in relation to pedestal bracket 1101), the rotation of lever 1225 translates to a linear motion (z-direction) in the pin 1226 with respect to the pedestal 140-A and pedestal bracket 1101. Because the resulting force (from lever interaction with the lower hard stop 1211 and bracket roller 1221) is relatively far from the pin 1226, the linear motion in pin 1226 is more significant (e.g., approximately 14-18 mm). Further, a linear motion in pin 1226 translates into a linear motion of the pad shaft 560-A through interaction with yoke 1240 and ferroseal assembly 425-A to create separation between the lift pad and pedestal 140-A, as will be described more fully in relation to FIGS. 14A-14D.

Figure 13:
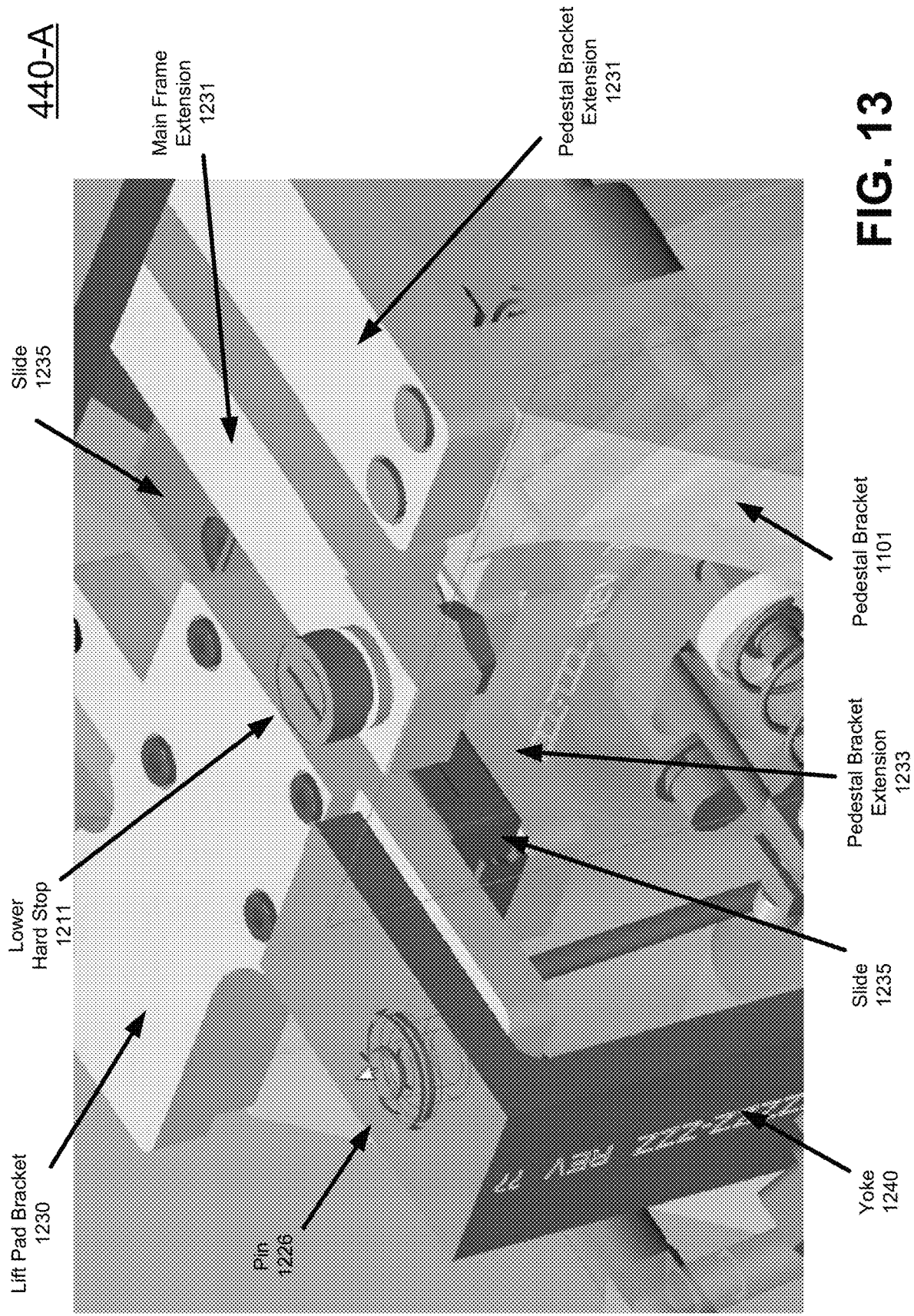
FIG. 13 is a perspective view of a lift pad raising mechanism of FIG. 12A, and more specifically shows the interface between a slide and yoke providing movement of the lift pad with respect to the pedestal, in accordance with one embodiment of the present disclosure.

FIG. 13 is a perspective view of the short stroke lift pad raising mechanism 440-A of FIG. 12A, and more specifically shows the interface between a slide 1235 and yoke 1240 providing movement of the lift pad with respect to the pedestal 140-A, in accordance with one embodiment of the present disclosure. In particular, slide 1235 is fixed in relation to pedestal bracket 1101. For example, slide 1235 may be directly attached to pedestal bracket 1101, or through one or more intervening components, such as through pedestal bracket extension 1233 which may be directly attached to pedestal bracket 1101. As such, any linear movement in the pedestal bracket 1101 (e.g., in the z-direction) translates into similar movement in the slide 1235 (e.g., in the z-direction).

In addition, lift pad bracket 1230 is moveably attached to slide 1235. When the short stroke lift pad raising mechanism 440-A is in its neutral state, the lift pad bracket 1230 moves along with slide 1235, such that no relative movement is experienced between the lift pad bracket 1230 and the pedestal bracket 1101. As such, any linear movement in the pedestal bracket 1101 (e.g., in the z-direction) translates into similar movement in the lift pad bracket 1230 (e.g., in the z-direction). On the other hand, when the pad raising mechanism 440-A is engaged with either the upper hard stop 1210 or lower hard stop 1211, the lift pad bracket moves upwards with respect to the pedestal bracket 1101 through the action of the slide 1235. Also, FIG. 13 illustrates yoke 1240 rotatably attached to lift pad bracket 1230 through pin 1226.

Figure 14A:
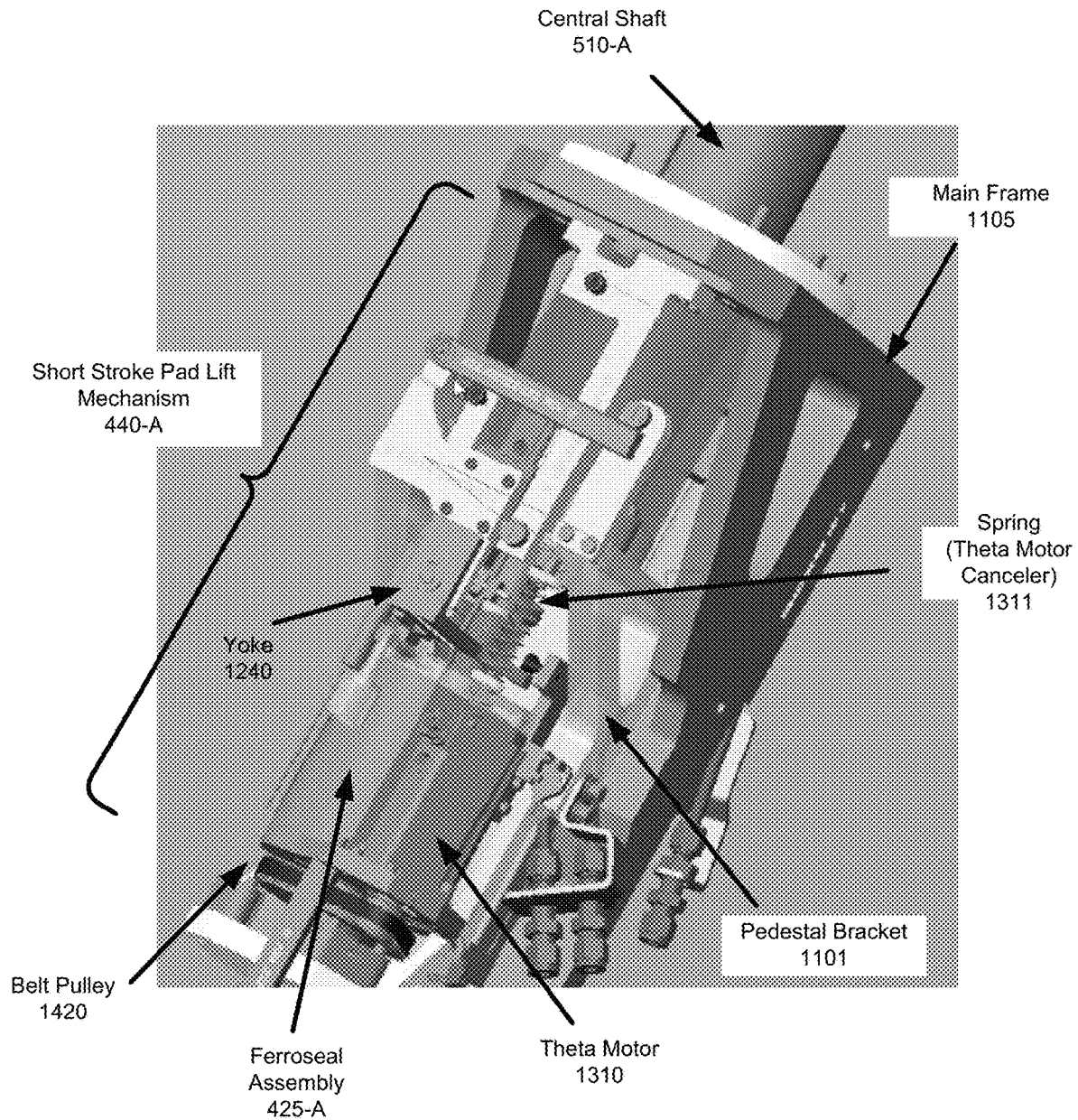
FIG. 14A is a perspective view of a lift pad raising mechanism of FIG. 12A, and more specifically shows the interface between the yoke and ferroseal assembly providing movement of the lift pad with respect to the pedestal, in accordance with one embodiment of the present disclosure.

FIG. 14A is a perspective view of a lift pad raising mechanism 440-A of FIG. 12A, and more specifically shows the interface between the yoke 1240 and ferroseal assembly 425-A providing movement of the lift pad with respect to the pedestal, in accordance with one embodiment of the present disclosure. In particular, yoke 1240 is rotatably attached to lift pad bracket 1240 through pin 1226. Yoke 1240 is configured to interface with the ferroseal assembly 425-A. As such, any linear movement of pin 1226 is translated to lift pad bracket 1240, further translated to yoke 1240, and further translated to ferroseal assembly 425-A. In particular, any linear movement of yoke 1240 is further translated into a similar linear movement in pad shaft 560-A and lift pad through the ferroseal assembly 425-A.

Figure 14B:
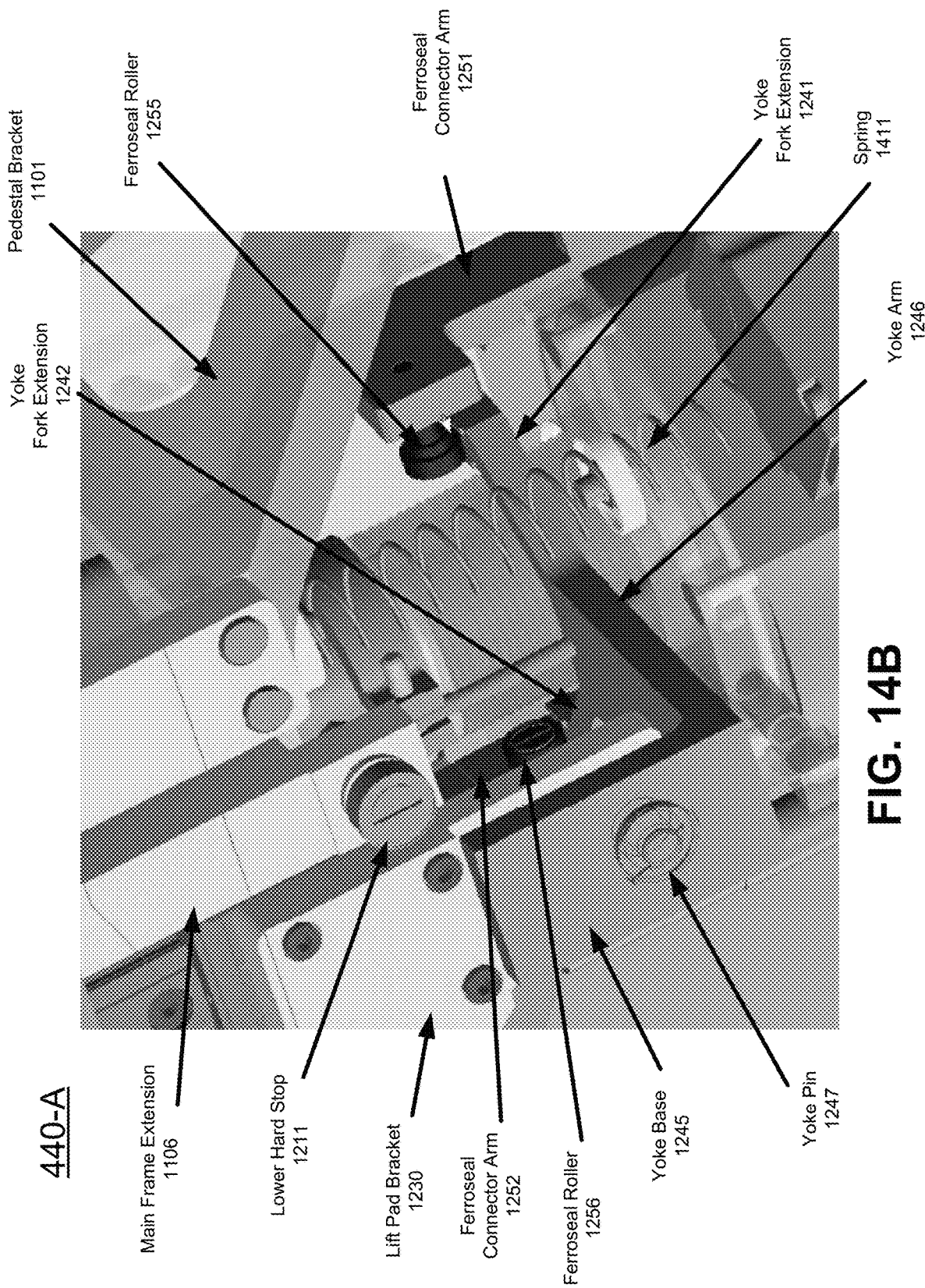
FIG. 14B is a perspective view of the yoke of FIG. 14A interfacing with the ferroseal assembly, in accordance with one embodiment of the present disclosure.

FIG. 14B is a perspective view of the yoke 1240 interfacing with the ferroseal assembly 425-A, in accordance with one embodiment of the present disclosure. Yoke 1240 is rotatably attached to lift pad bracket 1230 through pin 1247. As shown, yoke base 1245 is rotatably attached to lift pad bracket 1230. Yoke arm 1246 extends from yoke base 1245. Further, yoke fork extension 1241 and yoke fork extension 1242 both extend from yoke arm 1246. More particularly, FIG. 14B illustrates the interface between yoke fork extensions 1241/1242 and connector arms 1251/1252 of the ferroseal assembly of the lift pad raising mechanism 440-A of FIG. 13A providing movement of the lift pad with respect to the pedestal 140-A, in accordance with one embodiment of the present disclosure. In particular, upwards movement of the yoke 1240 engages the yoke fork extensions 1241/1242 with the rollers 1255/1256. That is, yoke fork extension 1241 engages with the roller 1255 that is attached to ferroseal connector arm 1251, and yoke fork extension 1242 engages with the roller 1256 that is attached to ferroseal connector arm 1252. Because pin 1226 is fixed in relation to yoke 1240, and yoke 1240 is fixed in relation to the pad shaft 560-A via the ferroseal assembly 425-A when the pad raising mechanism 440-A is engaged (e.g., through engagement of the yoke fork extensions 1241/1242 with rollers 1255/1256), when pin 1226 experiences a linear movement with respect to pedestal 140-A and pedestal bracket 1101 in the z-direction (e.g., when the lever 1225 is engaged with either the upper hard stop 1210 or lower hard stop 1211), this translates into a linear movement in the z-direction of the pad shaft 560-A to create a separation between the lift pad and the pedestal 140-A.

Further, the pivoting yoke 1240 is configured to offset and/or cancel a moment placed on the upper and lower bearings of the pad shaft 560-A due to actuation of the lift pad raising mechanism 440-A. In particular, yoke 1240 pivots about a pin 1247, and is configured to balance forces along the travel, central axis 471-A such that there is no moment or an insignificant moment placed on the upper and lower bearings of the pad shaft 560-A. That is, contact by the yoke 1240 through forked extensions 1241/1242 is made with equal force on rollers 1255/1256, that are fixed in relation to the ferroseal assembly 425-A via respective connector arms 1251/1252, in a manner that offsets and/or cancels a moment placed on the upper and lower bearings of the pad shaft 560-A.

Figure 14C:
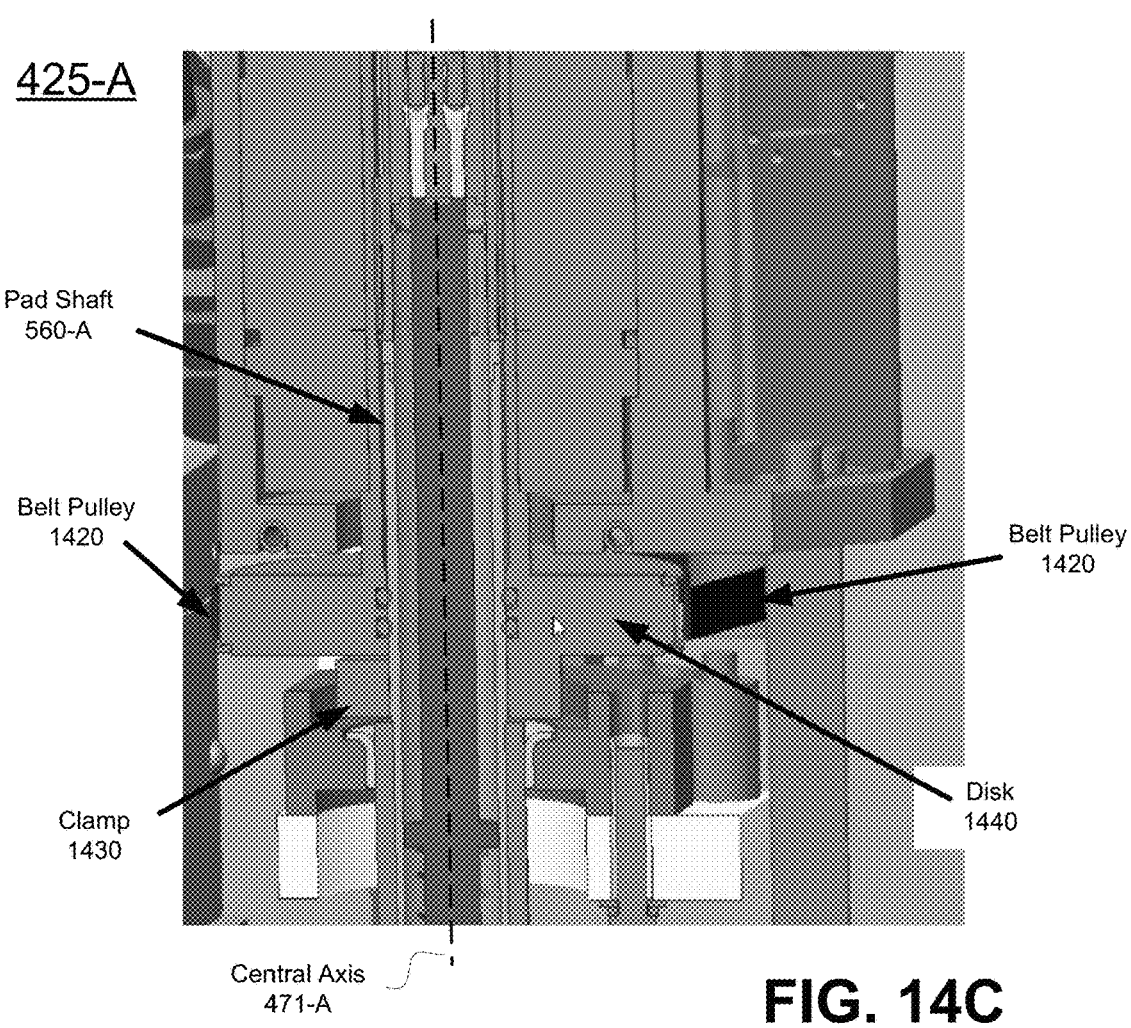
FIG. 14C is a perspective view of the clamping mechanism providing a linkage between the ferroseal assembly and the pad shaft of the lift pad, such that movement of the ferroseal assembly translates into movement of the lift pad, in accordance with one embodiment of the present disclosure.
Figure 14D:
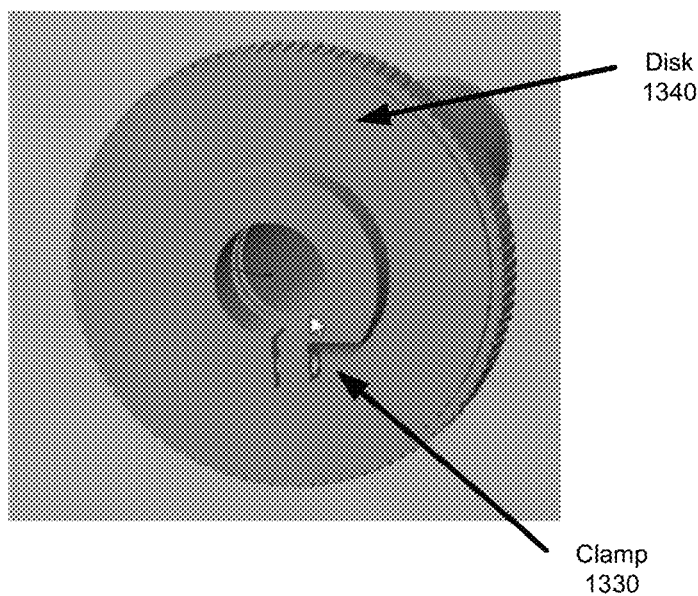
FIG. 14D is a perspective view of the clamp in the clamping mechanism of FIG. 14C, in accordance with one embodiment of the present disclosure.

FIG. 14C is a perspective view of a clamping mechanism providing a linkage between components of the ferroseal assembly 425-A and the pad shaft 560-A extending from the lift pad, in accordance with one embodiment of the present disclosure. As such, any linear movement (e.g., in z-direction) of the ferroseal assembly 425-A translates into a similar linear movement (e.g., in z-direction) of the lift pad. In particular, the bottom of ferroseal assembly 425-A disk 1440 and a clamp 1430 extending from the disk 1420. The clamp 1430 is clamped to the pad shaft 560-A, such that any rotation of disk 1440 is translated to rotation of the pad shaft 560-A. For example, rotation of disk 1440 is accomplished via the belt pulley 1420 movement as provided through theta motor 427-A. FIG. 14D is a perspective view of the clamp 1430 of FIG. 14C, in accordance with one embodiment of the present disclosure, wherein the clamping mechanism provided through clamp 1430 rigidly attaches the disk 1440 and clamp 1430 to pad shaft 560-A.

Figure 15A:
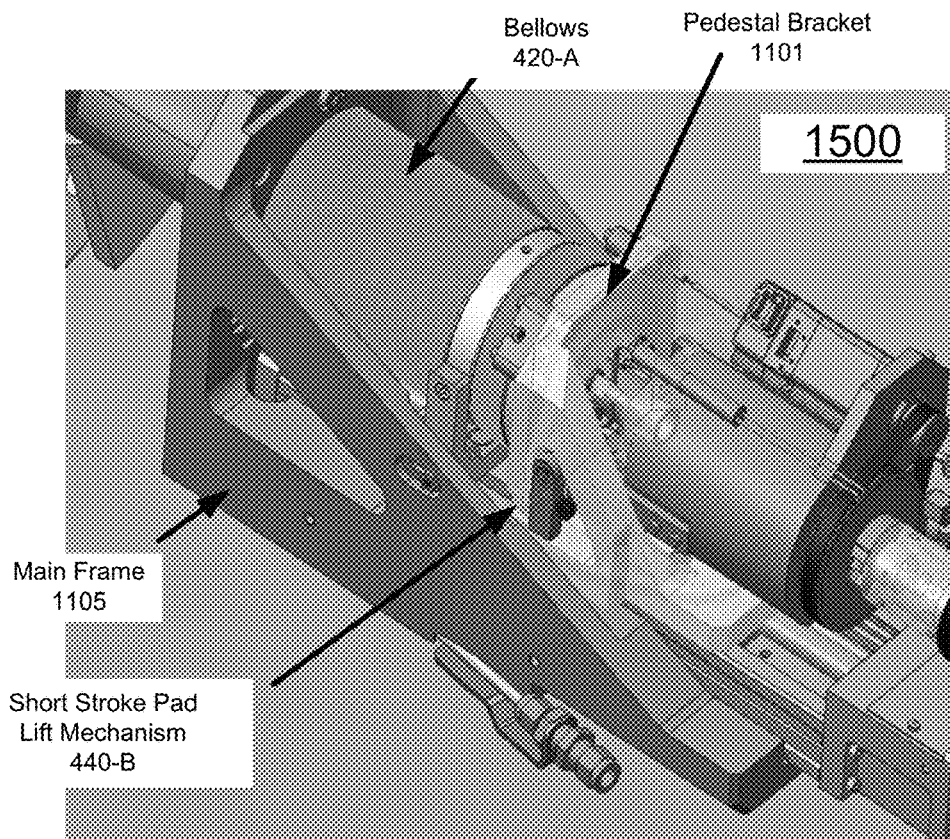
FIG. 15A is a perspective view of a substrate processing system including a lift pad and pedestal configuration wherein a lift pin assembly provides for wafer delivery, and illustrates another short stroke pad raising mechanism that provides for raising of the lift pad with respect to the pedestal through an upwards movement of the pedestal to accommodate rotation of the lift pad, wherein the lift pad may be substantially similar in size to a wafer or is smaller than a wafer, in accordance with one embodiment of the present disclosure.

FIG. 15A is a perspective view of a substrate processing system including a lift pad and pedestal configuration 1500 wherein a lift pin assembly (not shown) provides for wafer delivery, in accordance with one embodiment of the present disclosure. FIG. 15A illustrates another short stroke pad raising mechanism 440-B that provides for raising of the lift pad with respect to the pedestal through an upwards movement of the pedestal to accommodate rotation of the lift pad, wherein the lift pad may be substantially similar in size to a wafer or is smaller than a wafer, in accordance with one embodiment of the present disclosure.

The short stroke pad raising mechanism 440-B is configured to separate a lift pad (not shown) from a pedestal 140-A, in accordance with one embodiment of the present disclosure. The lift pad and pedestal configuration 1500 is located within the main frame 1105, wherein the main frame 1105 is placed into a processing chamber (e.g., fixed within the processing chamber). Movement of the pedestal 140-A is provided with respect to the main frame, and movement of the lift pad is provided with respect to both the main frame 1105 (e.g., lift pad moves with the pedestal bracket 1101) and pedestal 140-A (separates from the pedestal 140-A). Lift pad separation from the pedestal 1140-A may be enabled for purposes of rotating the lift pad (and wafer disposed thereon) with respect to the pedestal 140-A.

Pedestal 140-A of the lift pad and pedestal configuration 1500 may be controlled by pedestal control 450 of FIGS. 4 and 6, such that movement of pedestal 140-A is implemented through pedestal and lift pad actuator 515 of FIG. 5B and/or pedestal and lift pad actuator 515' of FIGS. 7B-7C. The lift pad of the lift pad and pedestal configuration 1500 may be controlled by lift pad control 455 of FIGS. 4 and 6, such that movement of the lift pad is implemented through pedestal and lift pad actuator 515 of FIG. 5B and/or the pedestal and lift pad actuator 515' of FIGS. 7B-7C.

Figure 15B:
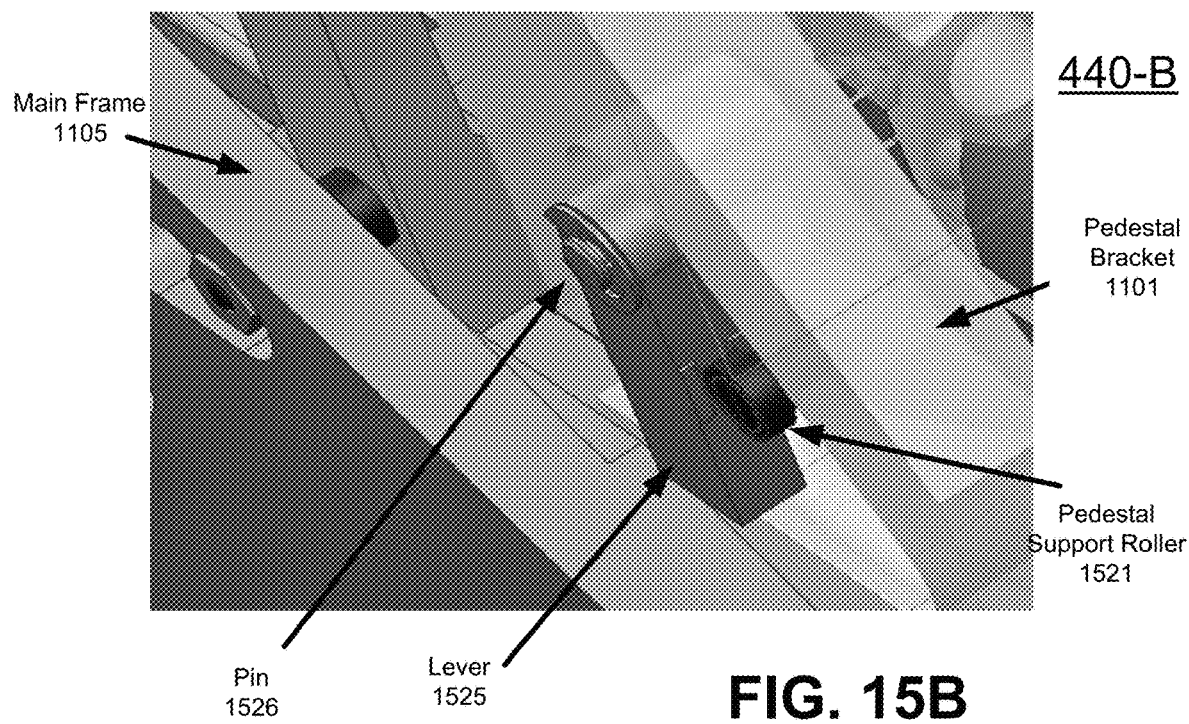
FIG. 15B is a perspective view of the substrate processing system of FIG. 15A including a lift pad and pedestal configuration, and illustrating components of the short stroke pad raising mechanism, in accordance with one embodiment of the present disclosure.

FIG. 15B is a perspective view of the substrate processing system of FIG. 15A including a lift pad and pedestal configuration 1500, and illustrates components of the short stroke pad raising mechanism 440-B, in accordance with one embodiment of the present disclosure. In particular, pad raising mechanism 440-B includes a pedestal support roller 1521 fixed in relation to the pedestal bracket 1101. In addition, lever 1525 is rotatably attached to ferroseal assembly 425-A through pins 1526, such as through connector arms 1251/1252. The pad raising mechanism 440-B includes two levers 1525 on opposing sides of the ferroseal assembly 425-A, and acting together to raise the ferroseal assembly 425-A with respect to pedestal bracket 1101.

Figure 15C:
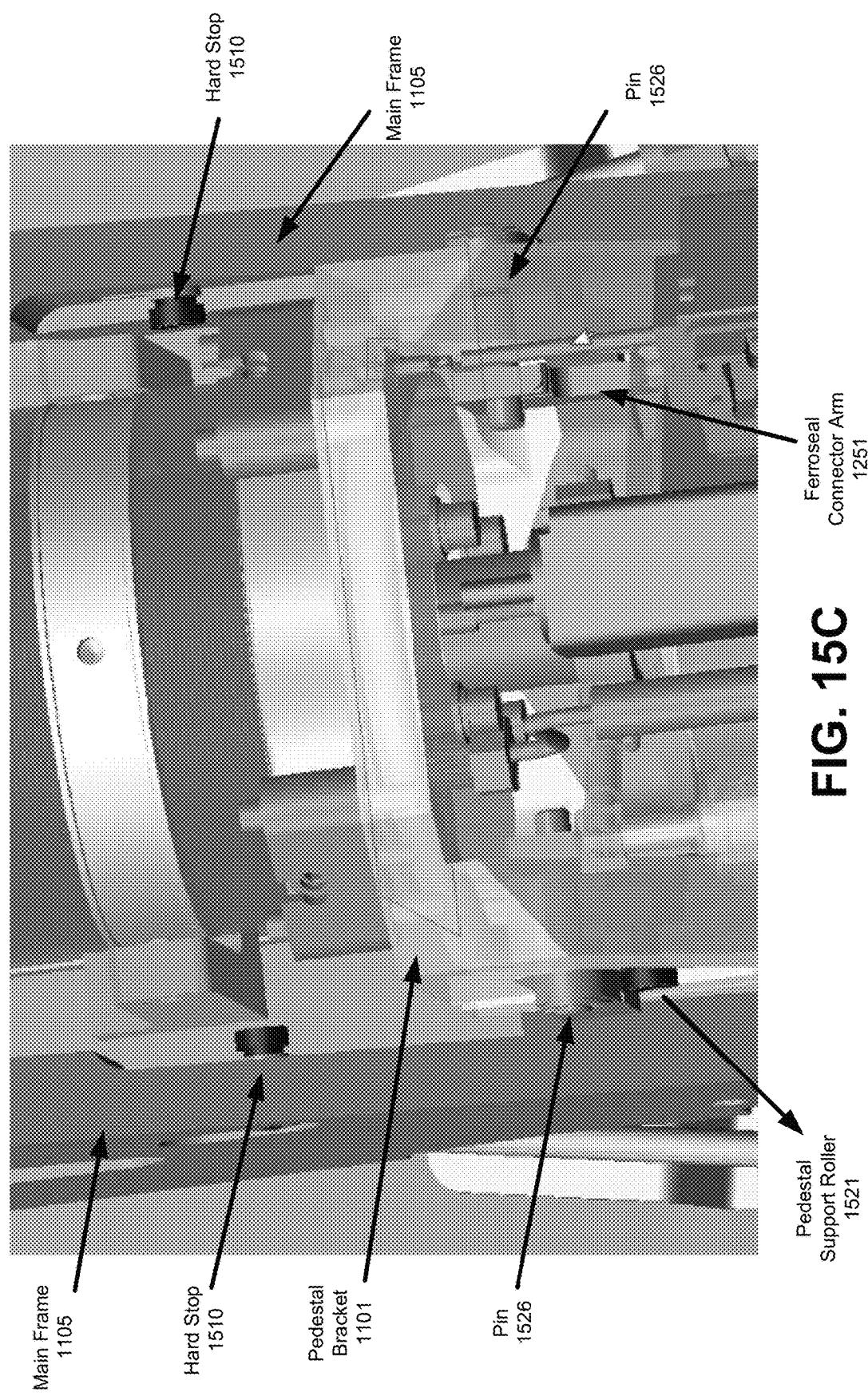
FIG. 15C is a perspective view of a lift pad raising mechanism of FIG. 15A, and more specifically showing the interface between a lever and ferroseal assembly providing movement of the lift pad with respect to the pedestal, in accordance with one embodiment of the present disclosure.

FIG. 15C is a perspective view of the lift pad raising mechanism 440-B of FIG. 15A, and more specifically shows the interface between one of lever 1525 and ferroseal assembly 425-A providing movement of the lift pad with respect to the pedestal 140-A, in accordance with one embodiment of the present disclosure. In particular, pad raising mechanism 440-B includes hard stops 1510 attached to main frame 1105. As pedestal bracket 1101 moves upwards with respect to main frame 1105, lever 1525 also moves with the pedestal bracket 1101 until engaging with a hard stop 1510. When lever 1525 engages with hard stop 1510, lever 1525 rotates about pin 1526, and induces a linear movement in pin 1526 (e.g., in z-direction) with respect to the pedestal bracket 1101. For instance, lever 1525 experiences forces due to hard stop 1510 and pedestal support roller 1521. Because pin 1526 is fixed in relation to the ferroseal assembly 425-A, linear movement in pin 1526 translates into a similar linear movement in the ferroseal assembly 425-A, and correspondingly to the pad shaft 560-A. As such, when the pad raising mechanism 440-B engages with the hard stop 1510 the lift pad is separated from the pedestal 140-A, for purposes of rotation of the lift pad in relation to the pedestal 140-A.

Figure 15D:
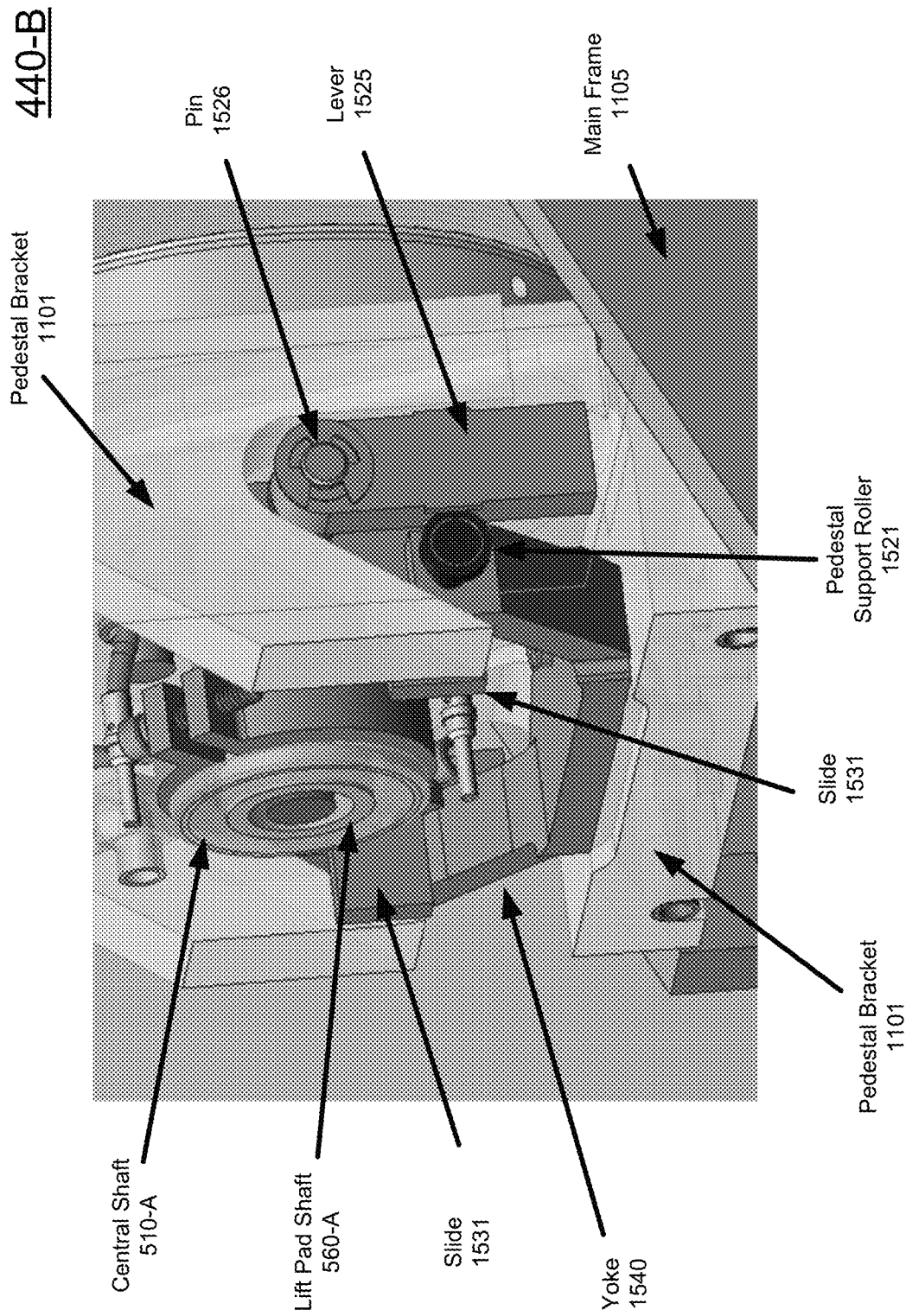
FIG. 15D is a perspective view of a lift pad raising mechanism of FIG. 15A, and more specifically showing the interface between the yoke and pedestal bracket providing movement of the lift pad with respect to the pedestal, in accordance with one embodiment of the present disclosure.

FIG. 15D is a perspective view of a lift pad raising mechanism 440-B of FIG. 15A, and more specifically showing the interface between the yoke 1540 and pedestal bracket 1101 providing movement of the lift pad with respect to the pedestal, in accordance with one embodiment of the present disclosure. As shown, yoke 1540 is rotatably attached to pedestal bracket 1101. Yoke 1540 provides balanced forces on the ferroseal connector arms 1251/1252. That is, yoke 1540 balances the force through its rotation to apply equal forces on either side of the ferroseal assembly 425-A. As such, there is no moment or an insignificant moment placed (e.g., no effective radial force on shaft bearings) on the pad shaft 560-A through any actuation of the pad raising mechanism 440-B.

Figure 16A:
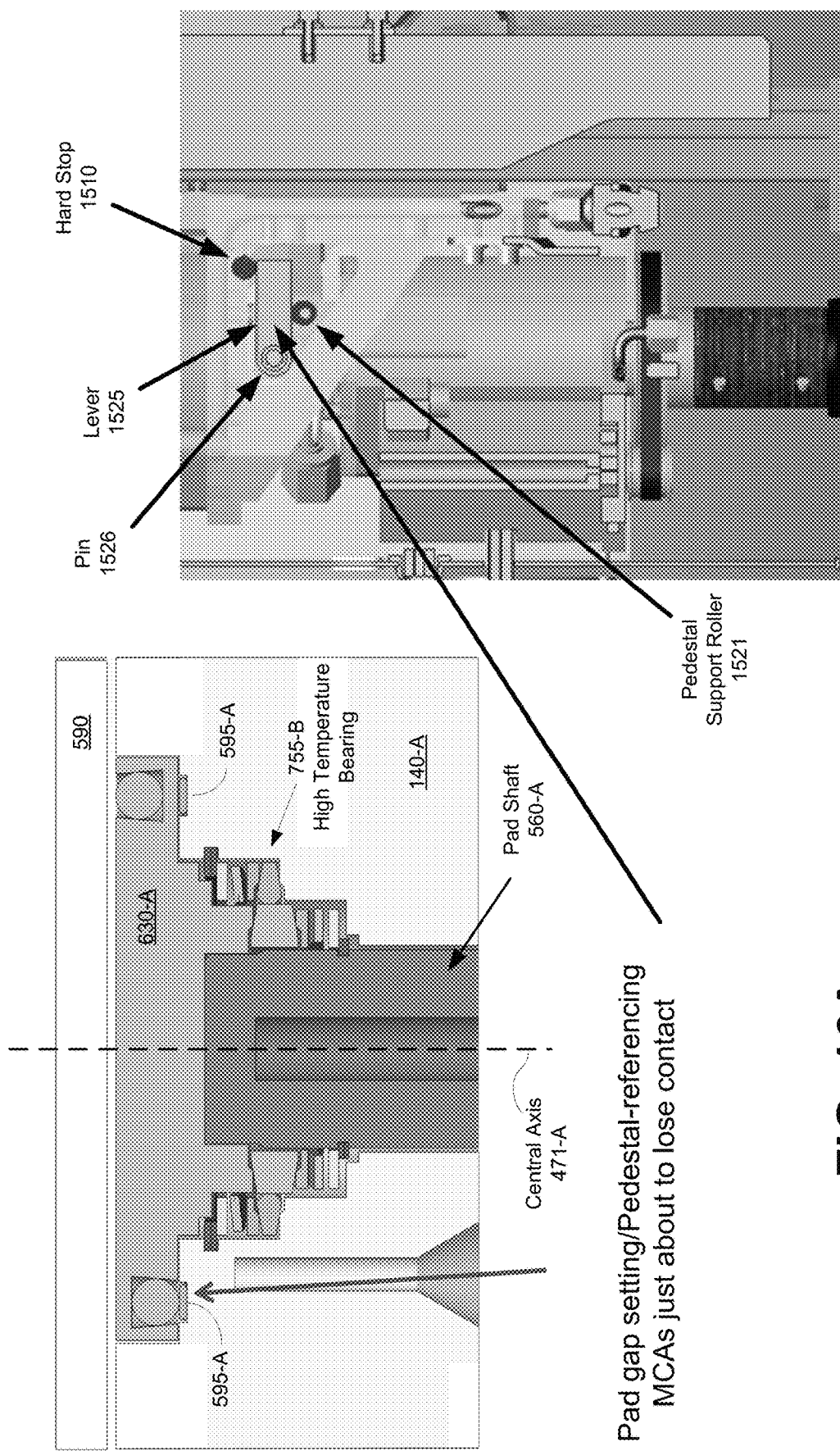
FIG. 16A is a diagram illustrating the movement of the lift pad raising mechanism of FIG. 15A at a point just before separation of the lift pad from the pedestal, in accordance with one embodiment of the present disclosure.

FIG. 16A is a diagram illustrating the movement of the lift pad raising mechanism 440-B of FIG. 15A at a point just before separation of the lift pad from the pedestal, in accordance with one embodiment of the present disclosure. As shown, in the lift pad and pedestal configuration 1500, the short stroke lift pad raising mechanism 440-B is beginning to engage with the hard stop 1510. Specifically, pedestal bracket 1101 is nearing its topmost travel upwards in the z-direction. As shown, the lift pad and pedestal configuration 1500 is near its topmost position when traveling upwards in the z-direction with respect to the main frame 1105. That is, lever 1525 is beginning to engage with the hard stop 1510 as the pedestal 140-A and pedestal bracket 1101 are moving upwards (e.g., pedestal 140-A is near its topmost position). As such, the pad raising mechanism 440-A is about to or is beginning to leave a neutral state. At this point, the lift pad 630-A rests upon the pedestal 140-A. For example, pedestal-referencing MCAs 595-A are still in contact with lift pad 630-A.

Figure 16B:
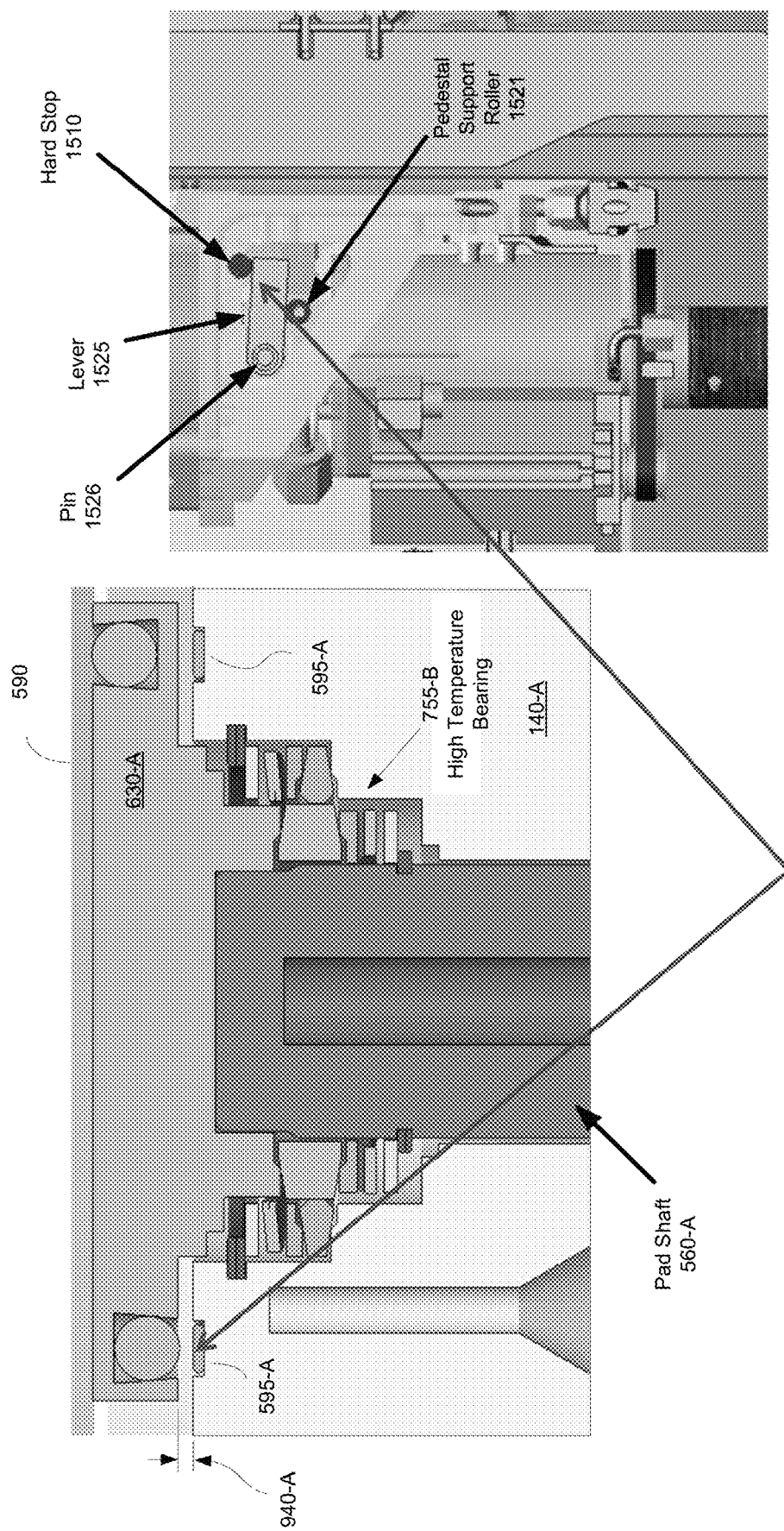
FIG. 16B is a diagram illustrating the movement of the lift pad raising mechanism of FIG. 15A at a point after separation of the lift pad from the pedestal, in accordance with one embodiment of the present disclosure.

FIG. 16B is a diagram illustrating the movement of the lift pad raising mechanism 440-B of FIG. 15A at a point after separation of the lift pad 630-A from the pedestal 140-A, in accordance with one embodiment of the present disclosure. The lift pad and pedestal configuration 1500 is configured to raise the lift pad 630-A (e.g., approximately 1 mm) to create separation between the lift pad 630-A and pedestal 140-A through an upwards movement of the pedestal 140-A to accommodate rotation of the lift pad 630-A through actuation of the short stroke pad raising mechanism 440-B. In particular, the short stroke lift pad raising mechanism 440-B is fully engaged with the hard stop 1510. That is, the pedestal 140-A and pedestal bracket 1101 continues to move upwards until the pedestal bracket 1101 reaches its topmost position. In that case, lever 1525 is fully engaged with hard stop 1510, and lever 1525 is fully rotated about pin 1526. That is, a downward force is applied to lever 1525 by hard stop 1510, and an upward force is applied to lever 1525 by pedestal support roller 1521 to induce rotation (e.g., clockwise) of lever 1525 about pin 1526. Because the lever is rotationally fixed to pin 1526, and pin 1526 is moveably attached to a slide 1531 (fixed in relation to pedestal bracket 1101), the rotation of lever 1525 translates to a linear motion (z-direction) in the pin 1526 with respect to the pedestal 140-A and pedestal bracket 1101. Further, a linear motion in pin 1526 translates into a linear motion of the pad shaft 560-A through ferroseal assembly 425-A to create separation between the lift pad and pedestal 140-A.

Figure 17A:
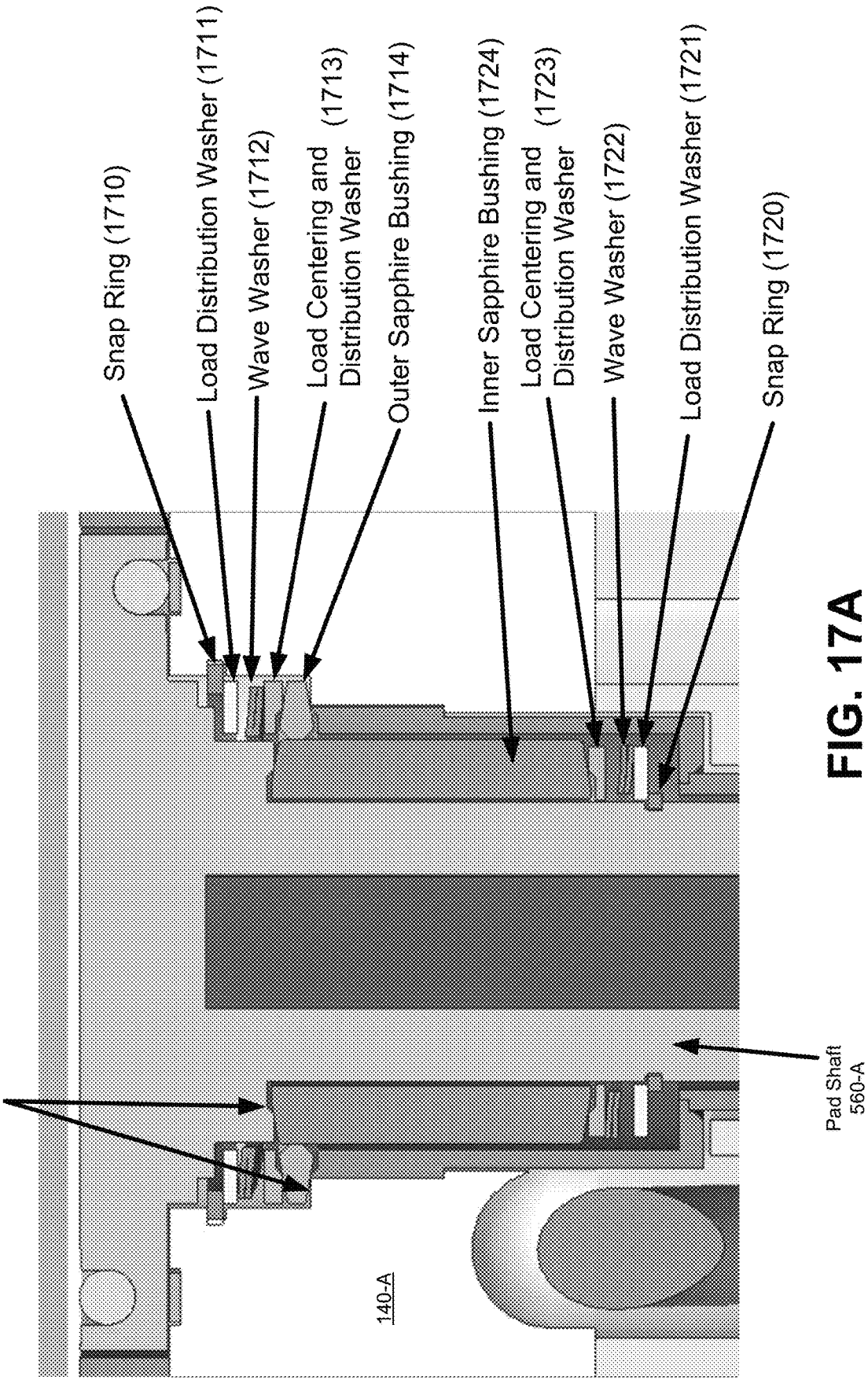
FIG. 17A is a diagram illustrating a high temperature bearing assembly a lift pad and pedestal configuration, in accordance with one embodiment of the present disclosure.

FIG. 17A is a diagram illustrating a high temperature bearing assembly 755-A of the lift pad and pedestal configuration 1100 of FIGS. 11-16, in accordance with one embodiment of the present disclosure. The high temperature bearing assembly 755-A was first introduced in relation to FIG. 7D. Although FIG. 17A is described in relation to a small lift pad 630-A having a diameter that is smaller than a wafer diameter, the high temperature bearing assembly 755-A is implementable with a lift pad having a diameter that is substantially similar in size to a wafer diameter. In embodiments, the high temperature bearing assembly 755-A is configure to operate within a high temperature environment, such as a chamber at or above 300 degrees Celsius.

The high temperature bearing assembly 755-A of FIG. 17A is similar in configuration to the high temperature bearing assembly 755-B of FIGS. 16A-16-B, and the high temperature bearing assembly 755 of FIG. 7D, with the exception of the length of the inner sapphire bushing 1724. In particular, the length of the inner sapphire bushing 1724 in FIG. 17A is configured to accommodate for lift pad separation from the pedestal 140-A for purposes of rotating the lift pad (and wafer disposed thereon) with respect to the pedestal 140-A, and for purposes of allowing access by an end-effector for wafer delivery (e.g., placement or removal of wafer from lift pad). Travel of the lift pad with respect to the pedestal 140-A for rotation is approximately 1 mm, whereas travel of the lift pad for end-effector access is approximately 14-18 mm. As such, the length L of the high temperature bearing assembly 755-A of FIG. 17A is configured to accommodate the longer travel of the lift pad for end-effector access. On the other hand, the high temperature bearing assembly 755-B of FIGS. 16A-16-B is configured to only accommodate for lift pad separation from the pedestal 140-A for purposes of rotating the lift pad (and wafer disposed thereon) with respect to the pedestal 140-A. For example, a lift pin assembly is provided for end-effector access. As such, the length of the high temperature bearing assembly 755-B need not accommodate for the longer travel of the lift pad for end-effector access and is much shorter in length than the high temperature bearing assembly 755-A. The description provided for the high temperature bearing assembly 755-A is applicable to each of the high temperature bearing assemblies introduced throughout this application.

In addition, the configuration of the lift pad raising mechanism 440-A previously described induces no moment or an insignificant moment (e.g., radial force) on the high temperature bearing assembly 755-A (e.g., A-thermal high temperature bearing assembly). Specifically, no moment or an insignificant moment is placed on the high temperature bearing assembly 755-A when the lift pad raising mechanism 440-A is lifting the pad shaft 560-A in order to separate the lift pad 630-A from the pedestal 140-A.

As shown in FIG. 17A, the high temperature bearing assembly 755-A includes an outer stack on the inner wall of the central shaft 510-A of the pedestal 140-A, and an inner stack on an outer diameter of the pad shaft 560-A.

In particular, the inner stack includes a retaining/snap ring 1720, a load distribution washer 1721, a spring wave washer 1722, a load centering and distribution washer 1723 and an inner sapphire bushing 1724. The inner sapphire bushing 1724 has a top edge surface 1791, and a bottom edge surface 1792, wherein both surfaces have a conical, angled, or tapered surface. FIG. 17D shows the inner sapphire bushing 1724 having an annular shape of the high temperature bearing assembly 755-A, in one embodiment. As such, the inner sapphire bushing 1724 has a conical cross section. In addition, the load centering and distribution washer 1723 has a wedged, conical, angled, or tapered surface. The conically shaped surfaces for both the load centering and distribution washer 1723 and the inner sapphire bushing 1724 contribute to the centering of the pad shaft 560-A within the central shaft 510-A.

Also, outer stack includes a retaining/snap ring 1710, a load distribution washer 1711, a spring wave washer 1712, a load centering and distribution washer 1713 and an outer sapphire bushing 1714. The outer sapphire bushing 1714 has a top edge surface 1781, and a bottom edge surface 1782, wherein both surfaces have a conical, angled, or tapered surface. FIG. 17C shows the outer sapphire bushing 1714 having an annular shape of the high temperature bearing assembly 755-A, in accordance with one embodiment of the disclosure. As such, the outer sapphire bushing 1714 has a conical cross section. In addition, the load centering and distribution washer 1713 has a wedged, conical, angled, or tapered surface. The conically shaped surfaces for both the load centering and distribution washer 1713 and the outer sapphire bushing 1714 contribute to the centering of the pad shaft 560-A within the central shaft 510-A. The outer sapphire bushing 1714 is configured to contact (e.g., rub) inner sapphire bushing 1724 when the lift pad 630-A is separating from the pedestal 140-A.

The lift pad and pedestal configuration shown in FIG. 17A includes centering chamfers 1751/1752 configured together to support the high temperature bearing assembly. For instance, centering chamfer 1751 is located on the inner wall of the central shaft 510-A, and may provide retention abilities to place and hold the outer stack of the high temperature bearing assembly 755-A within the central shaft 510-A. Also, centering chamfer 1752 is located on the outer diameter of the pad shaft 560-A, and may provide retention abilities to place and hold the inner stack of the high temperature bearing assembly 755-A within the pad shaft 560-A.

The high temperature bearing assembly 755-A is configured to provide constant centering of the pad shaft 560-A within the central shaft 510-A during operation of the pad shaft 560-A (e.g., rotation, lifting, movement, etc.). In addition, the high temperature bearing assembly 755-A is configured to provide constant centering while exposed to varying temperatures. That is, the high temperature bearing assembly 755-A can accommodate different thermal expansion rates between the pedestal 140-A and pad shaft 560-A, and other components. For instance, the sapphire compositions of the inner sapphire bushing 1724 and outer sapphire bushing 1714 within the high temperature bearing assembly 755-A accommodates for the thermal mismatch between the pad shaft 560-A and pedestal 140-A to provide constant centering of the pad shaft 560-A within the central shaft 510-A of the pedestal 140-A. More particularly, the metal components of the inner and outer stacks provide a pre-load force due to thermal expansion, and cause corresponding conical components (e.g., washers and bushings) to stay centered.

Figure 17B:
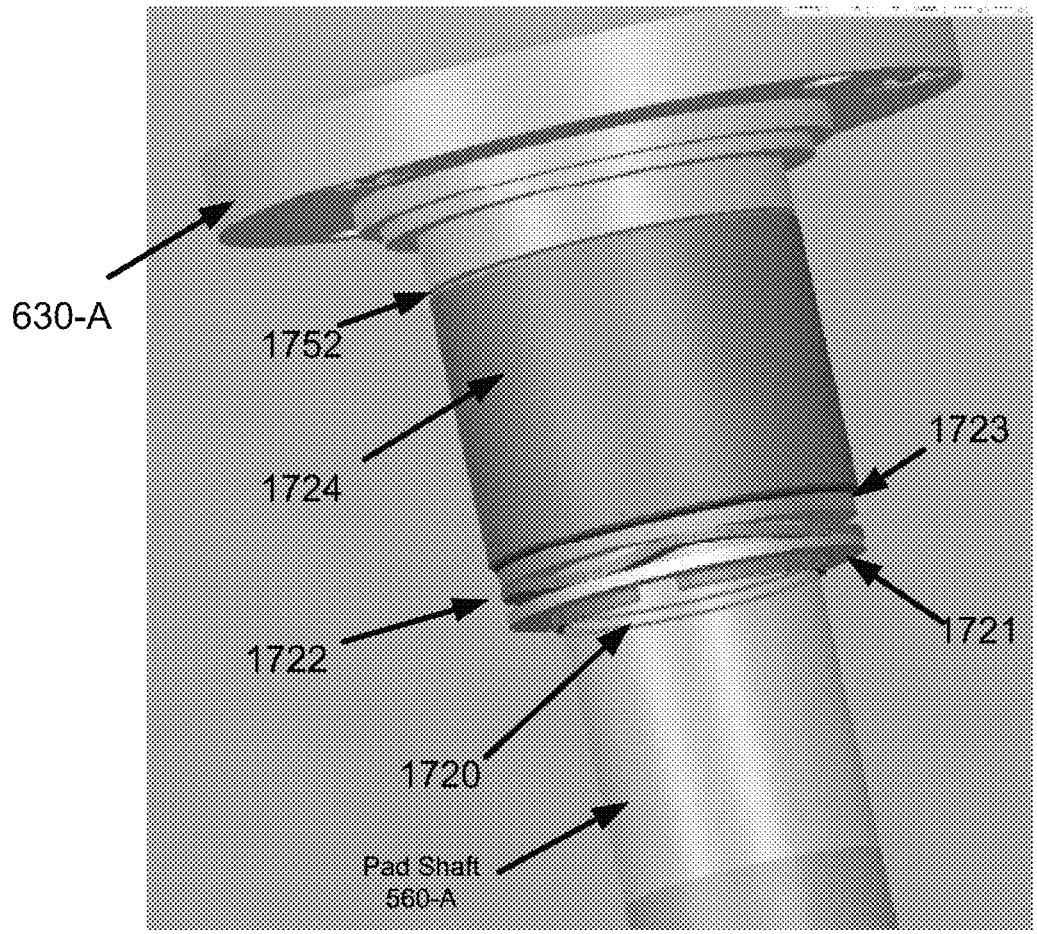
FIG. 17B is a perspective view of the high temperature bearing assembly of FIG. 17A, in accordance with one embodiment of the present disclosure.
Figure 17C:
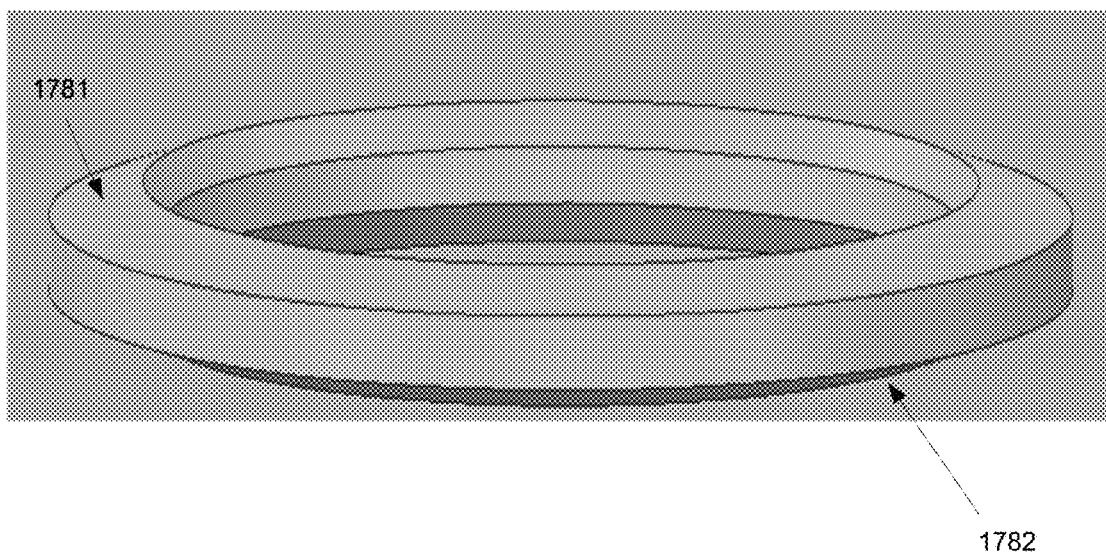
FIG. 17C shows the outer sapphire bushing having an annular shape of the high temperature bearing assembly, in accordance with one embodiment of the disclosure.
Figure 17D:
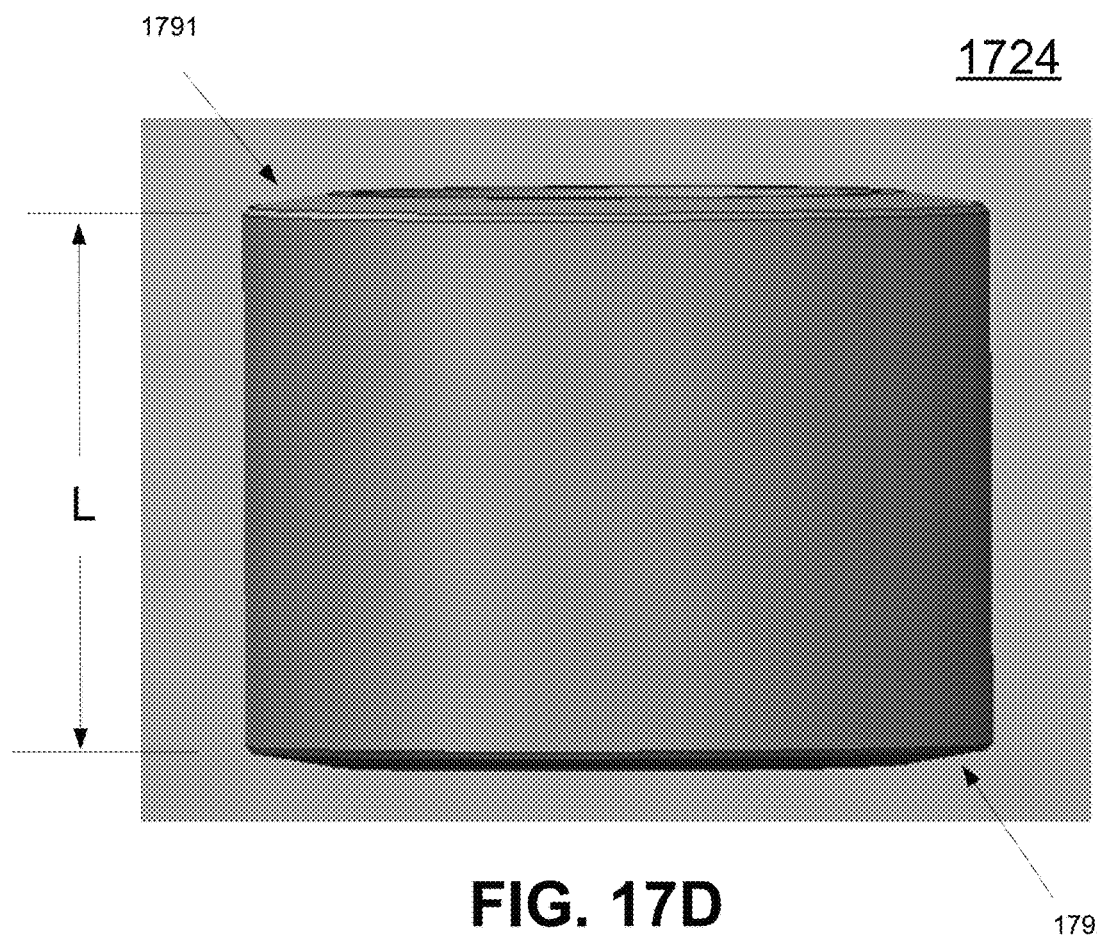
FIG. 17D shows the inner sapphire bushing having an annular shape of the high temperature bearing assembly, in accordance with one embodiment of the present disclosure.

FIG. 17B is a perspective view of the high temperature bearing assembly 75-A of FIG. 17A, in accordance with one embodiment of the present disclosure. In particular, the inner stack of the high temperature bearing assembly 755-A located on the outer diameter of the pad shaft 560-A is shown. The inner stack includes the retaining/snap ring 1720, a load distribution washer 1721, a spring wave washer 1722, a load centering and distribution washer 1723, and an inner sapphire bushing 1724. In addition, chamfer 1752 is shown located above the inner sapphire bushing 1724.

In one embodiment, the wave washer 1722 in the inner stack has three contact points to facilitate the load distribution washer 1721 to distribute forces equally across the snap ring 1720. In addition, the wave washer 1712 in the outer stack has three contact points to facilitate the load distribution washer 1711 to distribute forces equally across the snap ring 1710.

Figure 18:
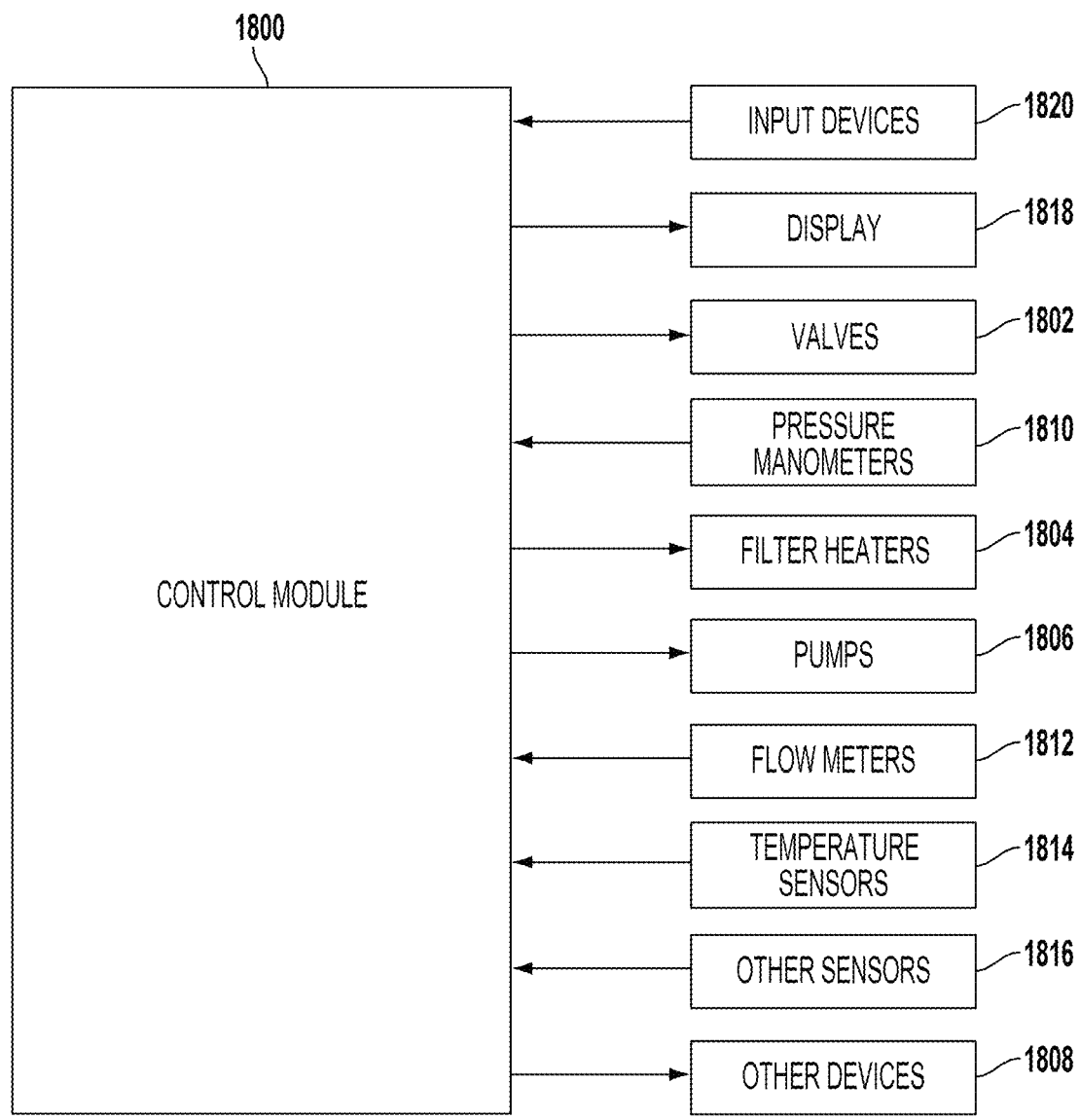
FIG. 18 shows a control module for controlling the systems described above.

FIG. 18 shows a control module 1800 for controlling the systems described above. In one embodiment, the control module 110 of FIG. 1 may include some of the example components of control module 1800. For instance, the control module 1800 may include a processor, memory and one or more interfaces. The control module 1800 may be employed to control devices in the system based in part on sensed values. For example only, the control module 1800 may control one or more of valves 1802, filter heaters 1804, pumps 1806, and other devices 1808 based on the sensed values and other control parameters. The control module 1800 receives the sensed values from, for example only, pressure manometers 1810, flow meters 1812, temperature sensors 1814, and/or other sensors 1816. The control module 1800 may also be employed to control process conditions during precursor delivery and deposition of the film. The control module 1800 will typically include one or more memory devices and one or more processors.

The control module 1800 may control activities of the precursor delivery system and deposition apparatus. The control module 1800 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 1800 may also monitor the pressure differential and automatically switch vapor precursor delivery from one or more paths to one or more other paths. Other computer programs stored on memory devices associated with the control module 1800 may be employed in some embodiments.

Typically there will be a user interface associated with the control module 1800. The user interface may include a display 1818 (e.g., a display screen and/or graphical software displays of the apparatus and/or process conditions), and user input devices 1820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 1810, and thermocouples located in delivery system, the pedestal or chuck (e.g., the temperature sensors 1814/220). Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A lift pad raising mechanism for a process chamber, the lift pad raising mechanism comprising:
   a lift pad for a pedestal that is mounted to a main frame;
   a hard stop connected to the main frame;
   a roller attached to a pedestal assembly;
   a slide moveably attached to the pedestal assembly;
   a lift pad bracket interconnected to the slide and interconnected to a pad shaft, wherein the pad shaft connects to the lift pad along a central axis; and
   a lever rotatably attached to a pin of the lift pad bracket, wherein when the pedestal assembly is moving downwards, the lever rotating about the pin of the lift pad bracket when engaged with the hard stop and the roller and separating the lift pad from the pedestal.

2. The lift pad raising mechanism of claim 1, wherein the lever rests in a neutral position when not engaged with the hard stop.

3. The lift pad raising mechanism of claim 2, wherein there is no relative movement between the lever and the pedestal assembly when the lever is in the neutral position.

4. The lift pad raising mechanism of claim 1, wherein the lift pad is separated from the pedestal when the pedestal moves towards a bottommost downwards position.

5. The lift pad raising mechanism of claim 1, wherein when the lever is rotating about the pin of the lift pad bracket, the lift pad bracket and slide together move upwards in relation to the pedestal assembly, such that the lift pad moves up relative to the pedestal along the central axis.

6. The lift pad raising mechanism of claim 1, wherein the lift pad includes a flat top surface supporting a substrate when placed thereon.

7. The lift pad raising mechanism of claim 1, wherein a diameter of the lift pad is smaller than a diameter of a substrate that is supported by the lift pad.

8. The lift pad raising mechanism of claim 1, wherein the lift pad sits in a recess at a center region of the pedestal.

9. An assembly for use in a process chamber, comprising:
a pedestal assembly including a pedestal movably mounted to a main frame;
a lift pad configured to rest upon a pedestal top surface of the pedestal and move with the pedestal assembly; and
a lift pad raising mechanism configured to separate the lift pad from the pedestal, the lift pad raising mechanism including:
the lift pad for the pedestal that is mounted to the main frame;
a hard stop connected to the main frame;
a roller attached to the pedestal assembly;
a slide moveably attached to the pedestal assembly;
a lift pad bracket interconnected to the slide and interconnected to a pad shaft,
wherein the pad shaft connects to the lift pad along a central axis; and
a lever rotatably attached to a pin of the lift pad bracket,
wherein when the pedestal assembly is moving downwards, the lever rotating about the pin of the lift pad bracket when engaged with the hard stop and the roller and separating the lift pad from the pedestal.

10. The assembly of claim 9, wherein the lever rests in a neutral position when not engaged with the hard stop.

11. The assembly of claim 10, wherein there is no relative movement between the lever and the pedestal assembly when the lever is in the neutral position.

12. The assembly of claim 9, wherein the lift pad is separated from the pedestal when the pedestal moves towards a bottommost downwards position.

13. The assembly of claim 9, wherein when the lever is rotating about the pin of the lift pad bracket, the lift pad bracket and slide together move upwards in relation to the pedestal assembly, such that the lift pad moves up relative to the pedestal along the central axis.

14. The assembly of claim 9, wherein the lift pad includes a flat top surface supporting a substrate when placed thereon.

15. The assembly of claim 9, wherein a diameter of the lift pad is smaller than a diameter of a substrate that is supported by the lift pad.

16. The assembly of claim 9, wherein the lift pad sits in a recess at a center region of the pedestal.

\* \* \* \* \*